US010351732B2

(12) United States Patent
Tsuchiya et al.

(10) Patent No.: US 10,351,732 B2
(45) Date of Patent: Jul. 16, 2019

(54) POLISHING COMPOSITION, METHOD FOR PRODUCING POLISHING COMPOSITION AND POLISHING COMPOSITION PREPARATION KIT

(71) Applicant: FUJIMI INCORPORATED, Kiyosu-shi, Aichi (JP)

(72) Inventors: Kohsuke Tsuchiya, Kiyosu (JP); Hisanori Tansho, Kiyosu (JP); Taiki Ichitsubo, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/777,841

(22) PCT Filed: Mar. 14, 2014

(86) PCT No.: PCT/JP2014/057008
§ 371 (c)(1),
(2) Date: Sep. 17, 2015

(87) PCT Pub. No.: WO2014/148399
PCT Pub. Date: Sep. 25, 2014

(65) Prior Publication Data
US 2016/0272846 A1    Sep. 22, 2016

(30) Foreign Application Priority Data

Mar. 19, 2013  (JP) ................. 2013-057225
Mar. 19, 2013  (JP) ................. 2013-057226
Mar. 19, 2013  (JP) ................. 2013-057227
Mar. 19, 2013  (JP) ................. 2013-057228

(51) Int. Cl.
*C09G 1/02* (2006.01)
*C09G 1/16* (2006.01)
*C09K 13/00* (2006.01)
*H01L 21/02* (2006.01)
*C09K 3/14* (2006.01)
*C08F 216/06* (2006.01)

(52) U.S. Cl.
CPC .............. *C09G 1/02* (2013.01); *C08F 216/06* (2013.01); *C09G 1/16* (2013.01); *C09K 3/1436* (2013.01); *C09K 3/1454* (2013.01); *H01L 21/02024* (2013.01)

(58) Field of Classification Search
CPC ........... C09G 1/02; C09G 1/16; C08F 216/06; C09K 3/1436; C09K 3/1454; H01L 21/02024
See application file for complete search history.

(56) References Cited

U.S. PATENT DOCUMENTS

| 3,874,129 A | 4/1975 | Deckert et al. | |
| 2006/0135045 A1* | 6/2006 | Bian | C09G 1/02 451/36 |
| 2006/0148667 A1 | 7/2006 | Fukasawa et al. | |
| 2008/0053001 A1 | 3/2008 | Noguchi et al. | |
| 2008/0214093 A1 | 9/2008 | Fukasawa et al. | |
| 2011/0028073 A1 | 2/2011 | Fukasawa et al. | |
| 2011/0081780 A1 | 4/2011 | Shida et al. | |
| 2012/0295443 A1* | 11/2012 | Morinaga | C09G 1/02 438/692 |
| 2012/0322346 A1* | 12/2012 | Iwano | B24B 37/044 451/36 |
| 2012/0329371 A1 | 12/2012 | Iwano | |
| 2014/0342561 A1* | 11/2014 | Yokota | B24B 37/044 438/693 |
| 2015/0017806 A1 | 1/2015 | Akutsu et al. | |
| 2015/0111383 A1 | 4/2015 | Miura et al. | |
| 2015/0166839 A1* | 6/2015 | Taniguchi | B24B 37/044 252/79.1 |
| 2016/0272846 A1 | 9/2016 | Tsuchiya et al. | |

FOREIGN PATENT DOCUMENTS

| CN | 1745460 A | 3/2006 |
| CN | 1800284 A | 7/2006 |
| CN | 102666014 A | 9/2012 |
| CN | 104272439 A | 1/2015 |
| EP | 2 840 591 A1 | 2/2015 |
| JP | S53-9910 A | 4/1978 |
| JP | H11-116942 A | 4/1999 |
| JP | H11-140427 A | 5/1999 |
| JP | 2003-321671 A | 11/2003 |
| JP | 2006-186356 A | 7/2006 |
| JP | 2009-147267 A | 7/2009 |
| JP | 2010-274348 A | 12/2010 |
| JP | 4772156 B1 | 9/2011 |
| JP | 2013-222863 A | 10/2013 |
| JP | 5335183 B2 | 11/2013 |
| TW | 200632082 A | 9/2006 |
| TW | 200944583 A | 11/2009 |
| TW | 201105784 A | 2/2011 |
| WO | WO-2004/068570 A1 | 8/2004 |
| WO | WO-2010/143579 A1 | 12/2010 |
| WO | WO-2011/111421 A1 | 9/2011 |
| WO | WO-2013/125446 A1 | 8/2013 |
| WO | WO-2014148399 A1 | 9/2014 |

OTHER PUBLICATIONS

Steigerwald, J. M. et al "Chemical Mechanical Planarization of Microelectronic Materials" pp. 36-47, Wiley-VCH, 2004.*

(Continued)

*Primary Examiner* — Shamim Ahmed
(74) *Attorney, Agent, or Firm* — Foley & Lardner LLP

(57) ABSTRACT

Provided are a polishing composition comprising a water-soluble polymer that has a molecular structure comprising a plurality of repeat unit species having different SP values and a polishing composition exhibiting an etching rate and an abrasive adsorption in prescribed ranges when determined by prescribed methods. Also provided is a method for producing a polishing composition, using an abrasive, a basic compound, a water-soluble polymer having an alkaline-hydrolytic functional group, and water. The method comprises a step of obtaining an agent A comprising at least the basic compound and a step of obtaining an agent B comprising at least the water-soluble polymer H.

12 Claims, No Drawings

(56) References Cited

OTHER PUBLICATIONS

Coleman et al.: "Specific Interactions and the Miscibility of Polymer Blends", Technomic Publishing Co. Inc., 1991, pp. 54-69, 15 pages.

\* cited by examiner

POLISHING COMPOSITION, METHOD FOR PRODUCING POLISHING COMPOSITION AND POLISHING COMPOSITION PREPARATION KIT

TECHNICAL FIELD

The present invention relates to a polishing composition used for polishing a polishing object. In particular, it relates to a polishing composition used primarily for polishing semiconductor substrates such as silicon wafers and the like as well as other substrates.

The present invention relates also to a method for producing a polishing composition used for polishing a polishing object and further relates to a polishing composition preparation kit used in the production method.

The present application claims priority to Japanese Patent Application Publication Nos. 2013-057225, 2013-057226, 2013-057227 and 2013-057228 filed on Mar. 19, 2013, and the entire contents of which are incorporated herein by reference.

BACKGROUND ART

The surface of a silicon wafer used as a component of a semiconductor device, etc., is generally polished to a high quality mirror finish via a lapping step (rough polishing step) and a polishing step (precision polishing step). The polishing step typically comprises a first polishing step and a final polishing step. Patent Documents 1 is cited as a technical literature related to polishing compositions used primarily for polishing semiconductor substrates such as silicon wafers, etc. Patent Document 2 is a technical literature related to a polishing composition used primarily for polishing an insulating film such as a silicon oxide film, etc.

CITATION LIST

Patent Literature

[Patent Document 1] Japanese Patent No. 4772156
[Patent Document 2] WO 2010/143579

SUMMARY OF INVENTION

Technical Problem

Polishing compositions (especially polishing compositions for precision polishing) for polishing semiconductor substrates such as silicon wafers as well as other substrates are expected to have abilities to produce surfaces with low haze and a fewer number of micro particles (light point defect or LPD) after polishing. Many of polishing compositions for such purposes comprise, besides water and an abrasive, a water-soluble polymer for protecting the surface of a polishing object (an article to be polished, or work piece) or increasing the wettability, etc. of the same. Among them, hydroxyethyl cellulose is cited as a widely used, water-soluble polymer.

However, since hydroxyethyl cellulose (HEC) is a polymer derived from a natural compound (cellulose), there are limitations in managing the chemical structure and purity as compared with a polymer obtainable by artificial polymerization of monomers (i.e. a synthetic polymer). For instance, commercially readily available HECs are limited in weight average molecular weight and range of molecular weight distribution (ratio of weight average molecular weight (Mw) to number average molecular weight (Mn), i.e. Mw/Mn). In addition, since they are derived from natural compounds, it is difficult to significantly reduce impurities and local disorder (microscale aggregation, etc.) in their polymer structures, etc., that may cause surface defect. The amounts and extent of such impurities, etc., are likely to vary widely as well. As more strict requirements are expected for surface quality in the future, it will be useful to provide a polishing composition excellent in reducing the number of LPD and haze, with the composition not essentially requiring an HEC.

In view of such circumstances, an objective of the present invention is to provide a polishing composition excellent in reducing the number of LPD and haze. Another related objective is to provide a method for producing a polished article, using such a polishing composition.

A typical polishing composition for polishing semiconductor substrates such as silicon wafers and other substrates comprises an abrasive, water, and a water-soluble polymer, and further comprises a basic compound to adjust the pH to a basic pH. It is preferable to adjust the polishing composition to a basic pH from the standpoint of stabilizing the dispersion of the abrasive and increasing the polishing rate.

Some water-soluble polymers, however, undergo hydrolysis under basic conditions. When a water-soluble polymer in a polishing composition is hydrolyzed, the polishing composition may suffer performance deterioration over time. Thus, in a polishing composition adjusted to a basic pH (or a "basic polishing composition" hereinafter), the use of a water-soluble polymer that is hydrolytic under basic conditions (alkaline-hydrolytic water-soluble polymer) has been avoided to inconveniently limit the choice of compositions.

In a basic polishing composition, it will be useful to improve the performance stability while using an alkaline-hydrolytic water-soluble polymer. Thus, another objective of the present invention is to provide a technique that uses a water-soluble polymer having an alkaline-hydrolytic functional group to produce a basic polishing composition with greater performance stability Solution to Problem The polishing composition according to a first aspect provided by this specification comprises a water-soluble polymer having a molecular structure including a plurality of repeat unit species with different SP (solubility parameter) values. In the water-soluble polymer, the plurality of repeat unit species comprise a repeat unit A having an SP value of 14.5 or higher and a repeat unit B having an SP value of lower than 14.5. The water-soluble polymer has an average SP value of 17.5 or lower determined by multiplying the SP value of each repeat unit species by the total volume fraction of the repeat unit species relative to the combined volume of all the repeat unit species in the molecular structure; and summing the results of the multiplication of all the repeat unit species in the molecular structure. Herein, the total volume of each repeat unit species is determined as the results of the number of moles of the repeat unit multiplied by its molar volume.

A polishing composition comprising such a water-soluble polymer may have a greater ability to reduce the haze and the number of LPD in a polished surface when compared with, for instance, a polishing composition in which the water-soluble polymer is replaced with the same amount of hydroxyethyl cellulose.

When used for polishing a polishing object, the polishing composition disclosed herein typically comprises an abrasive in addition to the water-soluble polymer. According to the polishing composition in such an embodiment, the mechanical work of the abrasive can increase the polishing efficiency.

As the water-soluble polymer, a nonionic polymer can be preferably used. According to the polishing composition comprising a nonionic water-soluble polymer that satisfies the average SP value with the repeat units A and B individually satisfying the aforementioned SP values, it is possible to bring about greater effect to reduce the haze and the number of LPD in the polished surface.

A preferable example of the water-soluble polymer comprises a vinyl alcohol unit as the repeat unit A. Herein, the vinyl alcohol unit refers to the structural moiety corresponding to the structure formed by polymerization of the vinyl group of vinyl alcohol ($CH_2$=CH—OH). In particular, the vinyl alcohol unit is the structural moiety represented by the chemical formula —$CH_2$—CH(OH)— (SP value 18.5). A polishing composition comprising such a water-soluble polymer can bring about greater effect to reduce the haze and the number of LPD in the polished surface.

Another preferable example of the water-soluble polymer comprises a vinyl acetate unit as the repeat unit B. Herein, the vinyl acetate unit refers to the structural moiety corresponding to the structure formed by polymerization of the vinyl group of vinyl acetate ($CH_3$COOCH=$CH_2$). The vinyl acetate unit is the structural moiety represented by the chemical formula —$CH_2$—CH(OCOCH$_3$)— (SP value 11.1). A polishing composition comprising such a water-soluble polymer can bring about greater effect to reduce the haze and the number of LPD in the polished surface.

When the water-soluble polymer comprises a vinyl acetate unit, the molar ratio (ratio of the number of moles) of the vinyl acetate unit to the total number of moles of all the repeat units in the molecular structure of the water-soluble polymer is preferably in a range between 5% and 80%. A polishing composition comprising such a water-soluble polymer can bring about greater effect to reduce the haze and the number of LPD in the polished surface.

The polishing composition disclosed herein can be preferably made in an embodiment further comprising a basic compound. A polishing composition in such an embodiment can increase the polishing efficiency by the effect of the basic compound.

This specification also provides a method for producing a polished article, using a polishing composition disclosed herein. The method comprises supplying a polishing liquid (the term "liquid" herein encompasses a slurry) to a polishing object (work piece). It further comprises polishing a surface of the polishing object with the polishing liquid. According to such a production method, a polished article comprising a high-quality surface (e.g. with fewer LPD and low haze) can be produced.

The art disclosed herein can be preferably applied to polishing a silicon wafer, for instance, a lapped silicon wafer. An example of particularly preferable applications is final polishing of a silicon wafer.

The polishing composition according to a second aspect provided by this specification comprises an abrasive, a water-soluble polymer and water. The polishing composition is characterized by exhibiting an etching rate of 2.0 nm/min or lower based on the following etching rate measurement:

[Etching Rate Measurement]

(1A) An etching rate measuring reagent LE is prepared, comprising 0.18% by mass of the water-soluble polymer and 1.3% by mass of ammonia with the rest being water.

(2A) A silicon substrate (in a 6 cm long by 3 cm wide by 775 μm thick rectangle) is obtained, from which surface natural oxide film is removed, and its mass W0 is measured.

(3A) The silicon substrate is immersed in the reagent LE at room temperature for 12 hours.

(4A) The silicon substrate is removed from the reagent LE and cleaned at room temperature for 10 seconds with a cleaning solution formed of $NH_3$ (29%)/$H_2O_2$ (31%)/ultra-pure water=1/1/8 (volume ratio).

(5A) The cleaned silicon substrate is measured for its mass W1.

(6A) From the difference between the W0 and W1 as well as the specific gravity of the silicon substrate, the etching rate (nm/min) is determined.

In addition, the polishing composition is characterized by having an abrasive adsorption of 20% or lower based on the following abrasive adsorption measurement.

[Abrasive Adsorption Measurement]

(1B) The polishing composition is centrifuged to precipitate the abrasive and the resulting supernatant is subjected to measurement of total organic carbon to determine the total amount of organic carbon, C1, in the supernatant.

(2B) A test solution L0 is obtained, having the same composition as that of the polishing composition but without the abrasive; and the test solution L0 is subjected to measurement of total organic carbon to determine the total amount of organic carbon, C0, in the test solution L0.

(3B) From the C0 and C1, the abrasive adsorption is determined by the following equation:

$$\text{Abrasive adsorption (\%)}=[(C0-C1)/C0]\times 100$$

A polishing composition that satisfies the etching rate and abrasive adsorption can reduce the haze and the number of LPD in the polished surface when compared with a polishing composition that does not satisfy the etching rate and/or the abrasive adsorption. For instance, the haze and the number of LPD in the polished surface can be reduced in comparison to a polishing composition using hydroxyethyl cellulose as the water-soluble polymer (i.e., the polishing composition typically having an abrasive adsorption of greater than 20%).

As the water-soluble polymer, a nonionic polymer can be preferably used. This may bring about greater effect to reduce the haze and the number of LPD in the polished surface.

A preferable example of the water-soluble polymer has a molecular structure comprising a vinyl alcohol unit and a vinyl acetate unit as the repeat units. Herein, the vinyl alcohol unit refers to the structural moiety corresponding to the structure formed by polymerization of the vinyl group of vinyl alcohol ($CH_2$=CH—OH). In particular, the vinyl alcohol unit is the structural moiety represented by the chemical formula —$CH_2$—CH(OH)—. The vinyl acetate unit refers to the structural moiety corresponding to the structure formed by polymerization of the vinyl group in vinyl acetate ($CH_3$COOCH=$CH_2$). The vinyl acetate unit is the structural moiety represented by the chemical formula —$CH_2$—CH(OCOCH$_3$)—. A polishing composition comprising such a water-soluble polymer can bring about greater effect to reduce the haze and the number of LPD in the polished surface.

When the water-soluble polymer comprises a vinyl acetate unit, the molar ratio (ratio of the number of moles) of the vinyl acetate unit to the total number of moles of all the repeat units in the molecular structure of the water-soluble polymer is preferably in a range between 5% and 80%. A polishing composition comprising such a water-soluble polymer can bring about greater effect to reduce the haze and the number of LPD in the polished surface.

The polishing composition disclosed herein can be preferably made in an embodiment further comprising a basic compound in addition to the abrasive, water-soluble polymer and water. A polishing composition in such an embodiment can increase the polishing efficiency by the effect of the basic compound.

This specification also provides a method for producing a polished article, using a polishing composition disclosed herein. The method comprises supplying a polishing liquid (the term "liquid" herein encompasses a slurry) to a polishing object (work piece). It further comprises polishing a surface of the polishing object with the polishing liquid. According to such a production method, a polished article comprising a high-quality surface (e.g. with fewer LPD and low haze) can be produced.

The art disclosed herein can be preferably applied to polishing a silicon wafer, for instance, polishing a lapped silicon wafer. An example of particularly preferable applications is final polishing of a silicon wafer.

The polishing composition production method according to the first aspect provided by this specification is a method for producing a polishing composition, using an abrasive, a basic compound and a water-soluble polymer H having an alkaline-hydrolytic functional group, and water. The method comprising a step of obtaining an agent A that comprises at least the basic compound and a step of obtaining an agent B that comprises at least the water-soluble polymer H. The production method further comprises a step of mixing a first composition comprising at least the agent A and a second composition comprising at least the agent B to prepare a mixture that comprises the abrasive, the basic compound, the water-soluble polymer H and water at a concentration of the basic compound of 0.1 mol/L or lower. According to such a production method, a polishing composition can be produced, having greater performance stability.

The production method can be preferably implemented in an embodiment wherein the abrasive is included at least in the agent A, or in other words, in an embodiment wherein the agent A comprises the basic compound, the abrasive and water. Such an embodiment using an agent A comprising an abrasive and a basic compound is preferable from the standpoint of the dispersion stability of the abrasive. The production method may be implemented in an embodiment wherein the abrasive is included at least in the agent B, or in other words, in an embodiment wherein the agent B comprises the water-soluble polymer H, the abrasive and water. Both of the agent A and the agent B may comprise the abrasive.

In a preferable embodiment of the production method disclosed herein, the agent A is an abrasive dispersion C comprising the abrasive, the basic compound and water. The abrasive dispersion C is diluted to prepare the first composition; and then, the first composition is mixed with the second composition to prepare the mixture. According to such an embodiment, a polishing composition with good dispersion of the abrasive and excellent performance stability can be produced.

This specification also provides another method for producing a polishing composition, using an abrasive, a basic compound, a water-soluble polymer H having an alkaline-hydrolytic functional group, and water. The method comprises a step of obtaining an agent A comprising at least the basic compound and a step of obtaining an agent B comprising at least the water-soluble polymer H. The production method further comprises a step of mixing a first composition comprising at least the agent A and a second composition comprising at least the agent B to prepare a mixture that comprises the abrasive, the basic compound, the water-soluble polymer H and water at a concentration of the abrasive of lower than 3% by mass. According to such a production method, a polishing composition can be produced with greater performance stability.

The production method can be preferably implemented in an embodiment wherein the abrasive is included at least in the agent A, or in other words, in an embodiment wherein the agent A comprises the basic compound, the abrasive and water. Such an embodiment using an agent A comprising an abrasive and a basic compound is preferable from the standpoint of the dispersion stability of the abrasive. The production method may be implemented in an embodiment wherein the abrasive is included at least in the agent B, or in other words, in an embodiment wherein the agent B comprises the water-soluble polymer H, the abrasive and water. Each of the agent A and the agent B may comprise the abrasive.

In a preferable embodiment of the production method disclosed herein, the agent A is an abrasive dispersion C comprising the abrasive, the basic compound and water. The abrasive dispersion C is diluted to prepare the first composition; and then, the first composition is mixed with the second composition to prepare the mixture. According to such an embodiment, a polishing composition with good dispersion of the abrasive and excellent performance stability can be produced.

From the standpoint of the dispersibility of the abrasive and the performance stability of the polishing composition, the abrasive dispersion C can be diluted in such a manner that water is added to the abrasive dispersion C to form the first composition at a concentration of the abrasive below 3% by mass. Prior to the dilution, the abrasive dispersion C preferably has an abrasive concentration of, for instance, 3% by mass or higher. This may lead to reduction of costs related to the storage and transport of the abrasive dispersion C.

This specification also provides another method for producing a polishing composition, using an abrasive, a basic compound, a water-soluble polymer H having an alkaline-hydrolytic functional group, and water. This production method is characterized by allowing the abrasive and the water-soluble polymer H to be co-present in water containing less than 3% by mass of the abrasive simultaneously with or before allowing the co-presence of the basic compound and the water-soluble polymer H. According to such a method, a polishing composition can be produced with greater performance stability.

The art disclosed herein can be preferably applied to production of, for instance, a polishing composition that uses a water-soluble polymer H having an acyloxy group (e.g. acetoxy group) as the alkaline-hydrolytic functional group. It is particularly meaningful to produce a polishing composition comprising such a water-soluble polymer H by applying the method disclosed herein because its properties, and consequently its polishing abilities, are likely to be altered by hydrolysis of the acyloxy group.

The art disclosed herein can be preferably applied to production of a polishing composition that uses a water-soluble polymer H comprising a vinyl acetate unit and a vinyl alcohol unit as repeat units in the molecular structure. Herein, the vinyl alcohol unit refers to the structural moiety corresponding to the structure formed by polymerization of the vinyl group in vinyl alcohol ($CH_2=CH-OH$). In particular, the vinyl alcohol unit is the structural moiety represented by the chemical formula —$CH_2$—$CH(OH)$—. The vinyl acetate unit refers to the structural moiety corresponding to the structure formed by polymerization of the vinyl group in vinyl acetate ($CH_3COOCH=CH_2$). The vinyl acetate unit is the structural moiety represented by the chemical formula —$CH_2$—$CH(OCOCH_3)$—, and is a repeat unit having an acetoxy group as the alkaline-hydrolytic functional group. It is particularly meaningful to produce a polishing composition comprising such a water-soluble polymer H by applying the method disclosed herein because its properties (polishing abilities) are likely altered by hydrolysis of the acyloxy group.

As the water-soluble polymer H, a nonionic polymer can be preferably used. A polishing composition produced with such a water-soluble polymer H may be of higher performance (e.g. capable of producing greater effect to reduce the haze value and/or the number of LPD in the polished surface).

This specification also provides a polishing composition preparation kit preferably used in a polishing composition production method disclosed herein. The kit comprises the agent A and the agent B that are stored separately. With the use of a kit in such a form, the polishing composition production method disclosed herein can be easily implemented.

In such a polishing composition preparation kit, the agent A comprises at least the basic compound and the agent B comprises at least the water-soluble polymer H. The abrasive may be included in either the agent A or agent B, or in each of the agent A and agent B. The polishing composition preparation kit may be in such a form that the abrasive is stored as an agent C other than as the agent A or the agent B.

Alternatively, the polishing composition preparation kit may be free of the abrasive. The polishing composition preparation kit in such a form can be preferably applied to the polishing composition production method disclosed herein, for instance, by combining the kit with an abrasive obtained separately from the kit.

This specification also provides a method for producing a polished article, using a polishing composition produced by a method disclosed herein. The method comprises supplying a polishing liquid (the term "liquid" herein encompasses a slurry) comprising the polishing composition to a polishing object. It further comprises polishing a surface of the polishing object with the polishing liquid. According to such a production method, a polished article comprising a high-quality surface (e.g. with fewer LPD and low haze) can be produced.

The art disclosed herein can be preferably applied to production of a polishing composition used for polishing a silicon wafer, for instance, for polishing a lapped silicon wafer. An example of a particularly preferable application (product) is a polishing composition for use in final polishing of a silicon wafer.

The polishing composition production method according to the second aspect provided by this specification is a method for producing a polishing composition, using an abrasive, a basic compound and a water-soluble polymer H having an alkaline-hydrolytic functional group, and water; the method comprising a step of obtaining an agent A that comprises at least the basic compound and a step of obtaining an agent B that comprises at least the water-soluble polymer H. The production method further comprises a step of mixing at least the agent A and the agent B to prepare a polishing composition stock solution having a concentration of the basic compound of higher than 0.02 mol/L and a step of diluting the polishing composition stock solution to a concentration of the basic composition of 0.02 mol/L or lower within 24 hours after the agent A and the agent B are mixed. According to such a method, a polishing composition can be produced with improved performance stability.

The production method can be preferably implemented in an embodiment wherein the abrasive is included at least in the agent A, or in other words, in an embodiment wherein the agent A comprises the basic compound, the abrasive and water. Such an embodiment using an agent A comprising an abrasive and a basic compound is preferable from the standpoint of the dispersion stability of the abrasive. The production method may be implemented in an embodiment wherein the abrasive is included at least in the agent B, or in other words, in an embodiment wherein the agent B comprises the water-soluble polymer H, the abrasive and water. Each of the agent A and the agent B may comprise the abrasive.

This specification also provides another method for producing a polishing composition, using an abrasive, a basic compound, a water-soluble polymer H having an alkaline-hydrolytic functional group, and water. The method comprises a step of obtaining an agent A comprising at least the basic compound and a step of obtaining an agent B comprising at least the water-soluble polymer H. The production method further comprises a step of mixing at least the agent A and the agent B to prepare a polishing composition stock solution having a 1% by mass or higher abrasive content and a step of diluting the polishing composition stock solution to an abrasive content of less than 1% by mass within 24 hours after the agent A and the agent B are mixed. According to such a method, a polishing composition can be produced with improved performance stability.

The production method can be preferably implemented in an embodiment wherein the abrasive is included at least in the agent A, or in other words, in an embodiment wherein the agent A comprises the basic compound, the abrasive and water. Such an embodiment using an agent A comprising an abrasive and a basic compound is preferable from the standpoint of the dispersion stability of the abrasive. The production method may be implemented in an embodiment wherein the abrasive is included at least in the agent B, or in other words, in an embodiment wherein the agent B comprises the water-soluble polymer H, the abrasive and water. Each of the agent A and the agent B may comprise the abrasive.

A production method disclosed herein can be preferably implemented in an embodiment wherein the stock solution is diluted by a factor of 10 or greater by volume in the step of diluting the polishing composition stock solution. According to such an embodiment, at least either the agent A or the agent B used in preparing the stock solution can have a relatively high concentration. This is advantageous from the standpoint of the convenience and costs of production, distribution, storage, etc., of the materials used for preparation of the stock solution.

The art disclosed herein may be preferably applied to production of, for instance, a polishing composition using a water-soluble polymer having an acyloxy group (e.g. acetoxy group) as the alkaline-hydrolytic functional group. It is particularly meaningful to produce a polishing composition comprising such a water-soluble polymer H by applying the method disclosed herein because its properties, and consequently its polishing abilities, are likely to be altered by hydrolysis of the acyloxy group.

The art disclosed herein can be preferably applied to production of a polishing composition that uses a water-soluble polymer H comprising vinyl acetate units at a molar ratio of 5% or higher relative to all the repeat units in the molecular structure. The vinyl acetate unit refers to the structural moiety corresponding to the structure formed by polymerization of the vinyl group in vinyl acetate ($CH_3COOCH=CH_2$). The vinyl acetate unit is the structural moiety represented by the chemical formula —$CH_2$—CH ($OCOCH_3$)—, and is a repeat unit having an acetoxy group as the alkaline-hydrolytic functional group. It is particularly meaningful to produce a polishing composition comprising such a water-soluble polymer H by applying the method disclosed herein because its properties, and consequently its polishing abilities, are likely to be altered by hydrolysis of the acyloxy group.

The art disclosed herein can be preferably applied to production of a polishing composition that uses a water-soluble polymer H having a molecular structure that comprises a vinyl acetate unit and a vinyl alcohol unit as repeat units. Herein, the vinyl alcohol unit refers to the structural moiety corresponding to the structure formed by polymerization of the vinyl group of vinyl alcohol ($CH_2=CH$—OH). In particular, the vinyl alcohol unit is the structural moiety represented by the chemical formula —$CH_2$—CH (OH)—. The vinyl acetate unit is as described earlier. It is particularly meaningful to produce a polishing composition comprising such a water-soluble polymer H by applying the method disclosed herein because its properties, and consequently its polishing abilities, are likely to be altered by hydrolysis of the acyloxy group.

As the water-soluble polymer H, a nonionic polymer can be preferably used. A polishing composition produced with such a water-soluble polymer H may be of higher performance (e.g. capable of producing greater effect to reduce the haze value and/or the number of LPD in the polished surface).

This specification also provides a polishing composition preparation kit preferably used in a polishing composition production method disclosed herein. The kit comprises the agent A and the agent B that are stored separately. With the use of a kit in such a form, the polishing composition production method disclosed herein can be easily implemented.

In such a polishing composition preparation kit, the agent A comprises at least the basic compound and the agent B comprises at least the water-soluble polymer H. The abrasive may be included in either the agent A or agent B, or in each of the agent A and agent B. The polishing composition preparation kit may be in such a form that the abrasive is stored as an agent C other than as the agent A or the agent B.

Alternatively, the polishing composition preparation kit may be free of the abrasive. The polishing composition preparation kit in such a form can be preferably applied to the polishing composition production method disclosed herein, for instance, by combining the kit with an abrasive obtained separately from the kit.

This specification also provides a method for producing a polished article, using a polishing composition produced by a method disclosed herein. The method comprises supplying a polishing liquid (the term "liquid" herein encompasses a slurry) comprising the polishing composition to a polishing object. It further comprises polishing a surface of the polishing object with the polishing liquid. According to such a production method, a polished article comprising a high-quality surface (e.g. with fewer LPD and low haze) can be produced.

The art disclosed herein can be preferably applied to production of a polishing composition used for polishing a silicon wafer, for instance, for polishing a lapped silicon wafer. An example of a particularly preferable application (product) is a polishing composition for use in final polishing of a silicon wafer.

DESCRIPTION OF EMBODIMENTS

Preferred embodiments of the present invention are described below. Matters necessary to implement this invention other than those specifically referred to in this specification may be understood as design matters to a person of ordinary skill in the art based on the conventional art in the pertinent field. The present invention can be implemented based on the contents disclosed in this specification and common technical knowledge in the subject field. In the present specification, the terms "weight," "% by weight" and "parts by weight" are used synonymously to "mass," "% by mass" and "parts by mass," respectively.

<<1. Polishing Composition According to First Aspect>>

The polishing composition according to the first aspect disclosed herein is characterized by comprising a water-soluble polymer that satisfies the following conditions:

the water-soluble polymer has a molecular structure comprising a plurality of repeat unit species with different SP values;

the plurality of repeat unit species comprises a repeat unit A having an SP value of 14.5 or higher and a repeat unit B having an SP value of lower than 14.5; and the average SP value of all the repeat unit species in the molecular structure is 17.5 or lower determined by multiplying the SP value of each repeat unit species by the total volume fraction of the repeat unit species relative to the volume of all the repeat unit species combined in the molecular structure; and summing the results of the multiplication of all the repeat unit species in the molecular structure.

The polishing composition according to the first aspect is described in detail below.

<1-1. Water-Soluble Polymer>

The polishing composition according to the first aspect disclosed herein is characterized by comprising a water-soluble polymer that comprises a repeat unit A having an SP value of 14.5 or higher and a repeat unit B having an SP value of lower than 14.5 while having an average SP value of 17.5 or lower.

Herein, SP values refer to solubility parameter values. In this specification, the SP value of a repeat unit constituting the water-soluble polymer refers to the value determined from the total molar heat of vaporization ($\Sigma\Delta H$) and total molar volumes ($\Sigma V$) of atomic groups according to "Specific Interactions and the Miscibility of Polymer Blend" by Michael M. Coleman et al. (1991) Technomic Publishing Co. Inc., by an equation (1) below:

$$\text{SP value}(\delta(\text{cal/cm}^3)^{1/2})=(\Sigma\Delta H/\Sigma V)^{1/2} \quad (1)$$

In the present specification, the average SP value of a water-soluble polymer refers to the value determined by multiplying the SP value of each repeat unit species by the total volume fraction (volume ratio) of the repeat unit species relative to the volume of all the repeat unit species combined in the molecular structure; and summing the results of the multiplication of all the repeat unit species in the molecular structure.

The lower limit of average SP value of the water-soluble polymer is not particularly limited. From the standpoint of the water solubility, etc., the average SP value of the water-soluble polymer is preferably 10.0 or greater, more preferably 11.0 or greater, or yet more preferably 12.0 or greater (e.g. 12.5 or greater). In a preferable embodiment, the average SP value of the water-soluble polymer can be 13.5 or greater, or 14.0 or greater. From the standpoint of obtaining suitable adsorption to the polishing object (e.g. a silicon wafer) and bringing about haze reduction and LPD count reduction in a well-balanced manner, the average SP value of the water-soluble polymer is preferably 17.4 or less, more preferably 17.2 or less, or yet more preferably 17.0 or less.

The water-soluble polymer may comprise one species of repeat unit A having an SP value of 14.5 or higher, or two or more such species in combination. Specific examples of the repeat unit A include those shown in Table 1 below.

TABLE 1

| Repeat unit | Structure | SP value |
|---|---|---|
| Acrylamide | —$CH_2$—$CH(CONH_2)$— | 14.5 |
| Vinyl alcohol | —$CH_2$—$CH(OH)$— | 18.5 |
| Acrylic acid | —$CH_2$—$CH(COOH)$— | 20.2 |

From the standpoint of the easy adjustment of the water-soluble polymer's average SP value, the average SP value of the repeat unit A (when two or more species of repeat unit A are included, their average SP value; the same applies hereinafter), is preferably 15 or higher, more preferably 16 or higher, or yet more preferably 17 or higher (e.g. 18 or higher).

The water-soluble polymer may comprise one species of repeat unit B having an SP value of lower than 14.5, or two or more such species in combination. Specific examples of the repeat unit B include those shown in Table 2 below.

TABLE 2

| Repeat unit | Structure | SP value |
|---|---|---|
| Propylene oxide | —$CH_2$—$CH(CH_3)$—O— | 9.0 |
| Ethylene oxide | —$CH_2$—$CH_2$—O— | 9.4 |
| N-isopropylacrylamide | —$CH_2$—CH—<br>    \|<br>    $CONH(CH(CH_3)_2)$ | 9.9 |
| Acryloylmorpholine | —$CH_2$—CH—<br>    \|<br>    C=O<br>    \|<br>    N(morpholine ring) | 10.9 |
| N-vinylpyrrolidone | —$CH_2$—CH—<br>    \|<br>    N(pyrrolidone ring) | 11.0 |
| Vinyl acetate | —$CH_2$—$CH(OCOCH_3)$— | 11.1 |
| Vinyl hexanoate | —$CH_2$—$CH(OCOC_5H_{11})$— | 9.0 |

From the standpoint of the easy adjustment of the water-soluble polymer's average SP value, the average SP value of the repeat unit B (when two or more species of repeat unit B are included, their average SP value; the same applies hereinafter), is preferably 13.5 or lower, more preferably 13.0 or lower, or yet more preferably 12.5 or lower (e.g. 12.0 or lower). In a preferable embodiment, the SP value of the repeat unit B can be 11.0 or lower, or even 10.0 or lower.

From the standpoint of the ease of adjustment of the water-soluble polymer's average SP value, the difference in the SP value between the repeat unit A and repeat unit B is preferably, but not particularly limited to, 1 or greater, more preferably 3 or greater, or yet more preferably 5 or greater (e.g. 7 or greater). From the standpoint of the copolymerization reactivity, etc., the difference in the SP value between the repeat unit A and repeat unit B is preferably 15 or less, or more preferably 13 or less (e.g. 12 or less).

A preferable example of the water-soluble polymer comprises a hydroxyl group-containing repeat unit as the repeat unit A. Such a water-soluble polymer is preferable since it is likely to show excellent water solubility. A typical example of the hydroxyl group-containing repeat unit A is vinyl alcohol unit.

A preferable example of the water-soluble polymer comprises a vinyl monocarboxylate unit as the repeat unit B. Preferable specific examples of the vinyl monocarboxylate unit include vinyl acetate unit, vinyl hexanoate unit, and the like.

A preferable example of the vinyl monocarboxylate unit-containing water-soluble polymer comprises a vinyl acetate unit as the repeat unit B. In such a water-soluble polymer, the number of moles of vinyl acetate units in the total number of moles of all the repeat units is typically 5% or greater, more preferably 10% or greater, yet more preferably 15% or greater, or particularly preferably 20% or greater. The number of moles of vinyl acetate units in the total number of moles of all the repeat units is not particularly limited. From the standpoint of the water solubility, etc., it is usually suitably 80% or less, preferably 60% or less, more preferably 50% or less, or yet more preferably 40% or less.

Another preferable example of the vinyl monocarboxylate unit-containing water-soluble polymer comprises a vinyl hexanoate unit as the repeat unit B. The number of moles of vinyl hexanoate units in the total number of moles of all the repeat units is typically, but not particularly limited to, 5% or greater, more preferably 10% or greater, or yet more preferably 15% or greater. From the standpoint of the water solubility, etc., the number of moles of vinyl hexanoate units in the total number of moles of all the repeat units is usually, but not particularly limited to, 80% or less, preferably 60% or less, more preferably 50% or less, or yet more preferably 40% or less (e.g. 30% or less).

The art disclosed herein can be preferably implemented in an embodiment using a water-soluble polymer that comprises a vinyl alcohol unit as the repeat unit A and a vinyl acetate unit as the repeat unit B. An example of such a water-soluble polymer has a structure resulting from partial saponification of vinyl acetate homopolymer or copolymer. For instance, a partially-saponified polyvinyl alcohol having a structure resulting from partial saponification of vinyl acetate homopolymer can be preferably used. The partially-saponified polyvinyl alcohol is a water-soluble polymer formed of vinyl alcohol units and vinyl acetate units.

The art disclosed herein can be preferably implemented in an embodiment using a water-soluble polymer that comprises a vinyl alcohol unit as the repeat unit A and a vinyl hexanoate unit as the repeat unit B. An example of such a water-soluble polymer has a structure resulting from partial saponification of vinyl hexanoate homopolymer or copolymer. For instance, a partially-saponified polyvinyl alcohol resulting from partial saponification of a copolymer of vinyl acetate and vinyl hexanoate can be preferably used.

Examples of the partially-saponified polyvinyl alcohol include a water-soluble polymer formed of vinyl alcohol units and vinyl hexanoate units as well as a water-soluble polymer formed of vinyl alcohol units, vinyl acetate units and vinyl hexanoate units.

From the standpoint of the water solubility, etc., as the partially-saponified polyvinyl alcohol, a species having a degree of saponification of 50% by mole or higher (more preferably 60% by mole or higher) and an average SP value of 17.5 or lower can be preferably used. A partially-saponified polyvinyl alcohol having an average SP value of 17.0 or lower is more preferable, and a species having an average SP value of 16.5 or lower (e.g. 16.0 or lower) is even more preferable.

The water-soluble polymer is preferably nonionic. In other words, a water-soluble polymer essentially free of anionic and cationic repeat units is preferable. Herein, being essentially free of anionic and cationic repeat units means that the molar ratio of these repeat units is lower than 0.02% (e.g. lower than 0.001%). According to the polishing composition that comprises a nonionic water-soluble polymer that has repeat units A and B satisfying the aforementioned SP values while satisfying the average SP value, it is possible to obtain greater effect to reduce the haze and the number of LPD in the polished surface. The water-soluble polymer being nonionic is preferable also from the standpoint of reducing aggregates and increasing the washability, etc.

The molecular weight of the water-soluble polymer is not particularly limited. For instance, a water-soluble polymer having a weight average molecular weight (Mw) of $200\times10^4$ or smaller (typically $1\times10^4$ to $200\times10^4$, e.g. $1\times10^4$ to $150\times10^4$) can be used. From the standpoint of preventing formation of aggregates to a greater extent, the use of a water-soluble polymer having a Mw of smaller than $100\times10^4$ (more preferably $80\times10^4$ or smaller, yet more preferably $50\times10^4$ or smaller, typically $40\times10^4$ or smaller, e.g. $30\times10^4$ or smaller) is preferable. From the standpoint of the ease of filtering and washing the polishing composition, etc., a water-soluble polymer having a Mw of $25\times10^4$ or smaller (more preferably $20\times10^4$ or smaller, yet more preferably $15\times10^4$ or smaller, typically $10\times10^4$ or smaller, e.g. $5\times10^4$ or smaller) can be preferably used. On the other hand, in general, with increasing Mw of water-soluble polymer, the haze reduction effect tends to increase. From such a standpoint, it is usually preferable to use a water-soluble polymer having a Mw of $0.1\times10^4$ or larger (typically $0.2\times10^4$ or larger, e.g. $1\times10^4$ or larger).

In the polishing composition according to the first aspect disclosed herein, a water-soluble polymer having a Mw of $3\times10^4$ or smaller can be preferably used. The Mw of the water-soluble polymer can be $2\times10^4$ or smaller, $1\times10^4$ or smaller, or even smaller than $0.5\times10^4$ (e.g. smaller than $0.4\times10^4$). The Mw of the water-soluble polymer is typically $0.1\times10^4$ or larger, or usually preferably $0.2\times10^4$ or larger. The Mw range can be preferably applied to, for instance, a water-soluble polymer comprising a vinyl alcohol unit as the repeat unit A (e.g. a partially-saponified polyvinyl alcohol).

The relationship between the weight average molecular weight (Mw) and number average molecular weight (Mn) of the water-soluble polymer is not particularly limited. From the standpoint of preventing the formation of aggregates, etc., a water-soluble polymer having a molecular weight distribution (Mw/Mn) of 5.0 or less can be preferably used. From the standpoint of the performance stability of the polishing composition, etc., the water-soluble polymer has an Mw/Mn of preferably 4.0 or less, more preferably 3.5 or less, or yet more preferably 3.0 or less (e.g. 2.5 or less).

Theoretically, the Mw/Mn is 1.0 or greater. From the standpoint of the availability of starting materials and the ease of synthesis, in usual, a water-soluble polymer having an Mw/Mn of 1.05 or greater can be preferably used.

As the Mw and Mn of a water-soluble polymer, the values based on aqueous gel permeation chromatography (GPC) (aqueous, based on standard polyethylene oxide) can be used.

<1-2. Water>

The polishing composition disclosed herein typically comprises water in addition to the water-soluble polymer. As the water in the polishing composition disclosed herein, ion-exchanged water (deionized water), pure water, ultrapure water, distilled water and the like can be preferably used. To avoid hindering the effects of other components in the polishing composition whenever possible, in the water used, for instance, the total transition metal ion content is preferably 100 ppb or less. For example, the purity of the water can be increased by operations such as removing impurity ions with ion-exchange resin, removing contaminants with a filter, distillation, and so on.

The polishing composition disclosed herein may further comprise, as necessary, a water-miscible organic solvent (lower alcohol, lower ketone, etc.). In usual, of the solvent in the polishing composition, preferably 90% by volume or more is water, or more preferably 95% by volume or more (typically 99 to 100% by volume) is water.

The polishing composition disclosed herein (typically a slurry composition) can be preferably implemented, for instance, in an embodiment in which the non-volatile content (NV) is 0.01% by mass to 50% by mass and the rest is an aqueous solvent (water or a mixture of water and the organic solvent) or in an embodiment where the rest is an aqueous solvent and a volatile compound (e.g. ammonia). An embodiment wherein the NV is 0.05% by mass to 40% by mass is more preferable. The non-volatile content (NV) refers to the mass proportion of residue remaining in the polishing composition after drying the polishing composition at 105° C. for 24 hours.

<1-3. Abrasive>

The polishing composition disclosed herein typically comprises an abrasive. The material and properties of the abrasive in the polishing composition disclosed herein are not particularly limited and can be suitably selected in accordance with the purpose and application of the polishing composition, etc. Examples of the abrasive include inorganic grains, organic grains and organic/inorganic composite grains. Specific examples of inorganic grains include oxide grains such as silica grains, alumina grains, cerium oxide grains, chromium oxide grains, titanium dioxide grains, zirconium oxide grains, magnesium oxide grains, manganese dioxide grains, zinc oxide grains, red oxide grains, etc.; nitride grains such as silicon nitride grains, boron nitride grains, etc.; carbide grains such as silicon carbide grains, boron carbide grains, etc.; diamond grains; carbonates such as calcium carbonate, barium carbonate, etc.; and the like. Specific examples of organic grains include polymethyl methacrylate (PMMA) grains, poly(meth)acrylic acid grains (herein the (meth)acrylic acid comprehensively means acrylic acid and methacrylic acid), polyacrylonitrile grains, and the like. These abrasives can be used singly as one species or in a combination of two or more species.

As the abrasive, inorganic grains are preferable. In particular, grains of an oxide of a metal or metalloid are preferable. Preferable examples of the abrasive that can be used in the art disclosed herein include silica grains. For instance, the use of silica grains as the abrasive is particularly preferable when applying the art disclosed herein to a polishing composition that can be used for polishing a silicon wafer. This is because when the polished article is a silicon wafer, the use of silica grains formed of oxygen atoms and the same element as the polished article will not leave metal or metalloid residues that are not silicon after the polishing, eliminating risks such as contamination of the silicon wafer surface and degradation of electrical properties of the silicon wafer caused by dispersion of metal or metalloid residues that are not silicon in the polished article. In addition, because silicon and silica are similar in hardness, polishing can be performed on a silicon wafer surface without causing excessive damage. An example of an embodiment of the polishing composition preferable from such a standpoint is a polishing composition comprising the abrasive consisting of silica grains. By nature, silica can be readily obtained in a highly pure state. This is also one of the reasons that silica grains are preferable as the abrasive. Specific examples of silica grains include colloidal silica, fumed silica, precipitated silica and the like. From the standpoint of the less likelihood of scratching the polishing object surface and capability of making a surface with lower haze, colloidal silica and fumed silica are cited as preferable silica grains. Colloidal silica is particularly preferable. For instance, colloidal silica is preferably used as the abrasive in the polishing composition used for polishing (especially, final polishing) of a silicon wafer.

The silica constituting the silica grains has a true specific gravity of preferably 1.5 or higher, more preferably 1.6 or higher, or yet more preferably 1.7 or higher. With increasing true specific gravity of the silica, the polishing rate (amount of surface removed from article surface per unit time) may increase when polishing a polishing object (e.g. silicon wafer). From the standpoint of reducing scratches occurring in the surface (polished surface) of the polishing object, preferable silica grains have a true specific gravity of 2.2 or lower. As the true specific gravity of the silica, the value measured by a liquid displacement method using ethanol as the displacing liquid can be used.

In the art disclosed herein, the abrasive in the polishing composition can be in a form of primary particles or in a form of secondary particles which are aggregates of primary particles. Alternatively, the abrasive may be present both in the primary particle form and secondary particle form. In a preferable embodiment, the abrasive is present at least partially in a secondary particle form in the polishing composition.

The average primary particle diameter $D_{P1}$ is not particularly limited. From the standpoint of the polishing efficiency, etc., it is preferably 5 nm or larger, or more preferably 10 nm or larger. From the standpoint of obtaining greater effects of polishing (e.g. effects such as reduced haze, removal of defects, etc.), the average primary particle diameter $D_{P1}$ is preferably 15 nm or larger, or more preferably 20 nm or larger (e.g. larger than 20 nm). From the standpoint of the likelihood of yielding a highly smooth surface, the abrasive has an average primary particle diameter $D_{P1}$ of preferably 100 nm or smaller, more preferably 50 nm or smaller, or yet more preferably 40 nm or smaller. From the standpoint of the likelihood of obtaining a higher-quality surface (e.g. a surface with reduced defect such as LPD, PID (polishing induced defect), etc.), the art disclosed herein can also be preferably implemented in an embodiment using an abrasive having an average primary particle diameter $D_{P1}$ of 35 nm or smaller (typically smaller than 35 nm, more preferably 32 nm or smaller, e.g. smaller than 30 nm).

In the art disclosed herein, the abrasive's average primary particle diameter $D_{P1}$ can be determined, for instance, from the specific surface area S (m²/g) measured by the BET method, based on the equation for the average primary particle diameter $D_{P1}$ (nm)=2727/S. The abrasive's specific surface area can be measured by using, for instance, a surface area analyzer under trade name "FLOW SORB II 2300" available from Micromeritics.

The average secondary particle diameter $D_{P2}$ of the abrasive is not particularly limited. From the standpoint of the polishing rate, etc., it is preferably 10 nm or larger, or more preferably 20 nm or larger. From the standpoint of obtaining greater effects of polishing, the average secondary particle diameter $D_{P2}$ is preferably 30 nm or larger, more preferably 35 nm or larger, or yet more preferably 40 nm or larger (e.g. larger than 40 nm). From the standpoint of yielding a highly smooth surface, the abrasive has an average secondary particle diameter $D_{P2}$ of suitably 200 nm or smaller, preferably 150 nm or smaller, or more preferably 100 nm or smaller. From the standpoint of the likelihood of obtaining a higher-quality surface (e.g. a surface with reduced defect such as LPD, PID, etc.), the art disclosed herein can also be preferably implemented in an embodiment using an abrasive having an average secondary particle diameter $D_{P2}$ of smaller than 60 nm (more preferably 55 nm or smaller, e.g. smaller than 50 nm).

The abrasive's average secondary particle diameter $D_{P2}$ can be measured for an aqueous dispersion of the abrasive of interest (dispersion having a water-soluble polymer-free composition) as a measurement sample by dynamic light scattering using, for instance, model "UPA-UT151" available from Nikkiso Co., Ltd.

The abrasive's average secondary particle diameter $D_{P2}$ is generally equal to or larger than the abrasive's average primary particle diameter $D_{P1}$ ($D_{P2}/D_{P1} \geq 1$) and is typically larger than $D_{P1}$ ($D_{P2}/D_{P1} > 1$). Although not particularly limited, from the standpoint of the effects of polishing and post-polishing surface smoothness, $D_{P2}/D_{P1}$ of the abrasive is usually suitably in a range of 1.2 to 3, preferably in a range of 1.5 to 2.5, or more preferably in a range of 1.7 to 2.3 (e.g. 1.8 or greater, but 2.2 or less).

The abrasive grain may have a globular shape (external shape) or a non-globular shape. Specific examples of non-globular shapes of the abrasive include a peanut shape (i.e. peanut shell shape), cocoon shape, confeito shape (spiky ball shape), rugby ball shape, and so on. For instance, an abrasive mostly comprising peanut-shaped grains can be preferably used.

Although not particularly limited, the abrasive has an average value of primary particle's major axis to minor axis ratio (average aspect ratio) of theoretically 1.0 or greater, preferably 1.05 or higher, or more preferably 1.1 or higher. With increasing average aspect ratio of the abrasive, a higher polishing rate can be obtained. From the standpoint of scratch reduction and so on, the abrasive's average aspect ratio is preferably 3.0 or lower, more preferably 2.0 or lower, or yet more preferably 1.5 or lower.

The abrasive's shape (external shape) and average aspect ratio can be assessed, for instance by electron microscope observations. In specific procedures for determining the average aspect ratio, for instance, using a scanning electron microscope (SEM), with respect to a prescribed number (e.g. 200) of abrasive grains having observable separate shapes, the smallest circumscribing rectangles are drawn on the respective grain images. With respect to the rectangle drawn on each grain image, the long side length (major axis length) is divided by the short side length (minor axis length) to determine the major axis/minor axis ratio (aspect ratio). The aspect ratios of the prescribed number of grains can be arithmetically averaged to determine the average aspect ratio.

<1-4. Basic Compound>

The polishing compound disclosed herein typically comprises a basic compound. In the present specification, the basic compound refers to a compound that dissolves in water and increase the pH of the resulting aqueous solution. In typical, it refers to a compound capable of increasing the pH of a polishing composition when added to the composition. The basic compound may work to chemically polish the target surface and contribute to increase the polishing rate. The basic compound may also help increase the dispersion stability of the polishing composition (especially a polishing composition comprising an abrasive).

As the basic compound, organic or inorganic nitrogen-containing basic compounds, hydroxides of alkali metals or alkaline earth metals, various carbonates and hydrogen carbonates, etc., can be used. Examples include alkali metal hydroxides; quaternary ammonium hydroxides and salts thereof; ammonia; amines; and the like. Specific examples of alkali metal hydroxides include potassium hydroxide, sodium hydroxide, etc. Specific examples of carbonates and hydrogen carbonates include ammonium hydrogen carbonate, ammonium carbonate, potassium hydrogen carbonate, potassium carbonate, sodium hydrogen carbonate, sodium carbonate, etc. Specific examples of quaternary ammonium hydroxides or salts thereof include such as tetramethylammonium hydroxide, tetraethylammonium hydroxide, tetrabutylammonium hydroxide, etc. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetraamine, anhydrous piperazine, piperazine hexahydrate, 1-(2-aminoethyl)piperazine, N-methylpiperazine, guanidine, azoles such as imidazole, triazole, etc.; and the like. These basic compounds can be used singly as one species or in a combination of two or more species.

Examples of basic compounds preferable from the standpoint of increasing the polishing rate, etc., include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate and sodium carbonate. In particular, preferable examples include ammonia, potassium hydroxide, sodium hydroxide, tetramethylammonium hydroxide and tetraethylammonium hydroxide. As more preferable species, ammonia and tetramethylammonium hydroxide are cited. An especially preferable basic compound is ammonia.

<1-5. Surfactant>

The polishing composition disclosed herein can be preferably made in an embodiment comprising a surfactant (typically a water-soluble organic compound having a molecular weight below $1 \times 10^4$) as necessary. The use of surfactant may increase the dispersion stability of the polishing composition (especially a polishing composition comprising an abrasive). It may facilitate the reduction of haze. For the surfactant, solely one species or a combination of two or more species can be used.

As the surfactant, anionic or nonionic kinds can be preferably used. From the standpoint of the low-foaming properties and easy pH adjustment, nonionic surfactants are more preferable. Examples include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid esters, polyoxyethylene glyceryl ether fatty acid esters, polyoxyethylene sorbitan fatty acid esters, etc.; copolymers (diblock copolymers, triblock copolymers, random-type copolymers, alternating-type copolymers) of a plurality of species of oxyalkylene; and the like.

Specific examples of nonionic surfactant include a block copolymer of EO and PO (diblock copolymer, PEO-PPO-PEO triblock copolymer, PPO-PEO-PPO triblock copolymer, etc.), a random copolymer of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylenesorbitan trioleate, polyoxyethylene sorbitol tetraoleate, polyoxyethylene castor oil, polyoxyethylene hardened castor oil, and the like. Particularly preferable surfactants include a block copolymer of EO and PO (especially a PEO-PPO-PEO triblock copolymer), a random copolymer of EO and PO, and polyoxyethylene alkyl ether (e.g. polyoxyethylene decyl ether).

The surfactant typically has a molecular weight below $1 \times 10^4$. From the standpoint of the ease of filtering the polishing composition and washing the polished article, it is preferably 9500 or smaller. The molecular weight of the surfactant is typically 200 or larger. From the standpoint of haze reduction effect, etc., it is preferably 250 or larger, or more preferably 300 or larger (e.g. 500 or larger). As the molecular weight of the surfactant, the weight average molecular weight (Mw) determined by GPC (aqueous, based on standard polyethylene glycol) or the molecular weight determined from the chemical formula can be used.

More preferable molecular weight ranges of the surfactant may also vary depending on the type of surfactant. For instance, when a block copolymer of EO and PO is used as the surfactant, its Mw is preferably 1000 or larger, more preferably 2000 or larger, or yet more preferably 5000 or larger.

<1-6. Optional Polymers>

In addition to the water-soluble polymer described above (i.e. a water-soluble polymer comprising repeat units A and B satisfying the prescribed SP values while satisfying the prescribed average SP value), the polishing composition disclosed herein may further comprise, as necessary, another water-soluble polymer (or an "optional polymer" hereinafter) having an Mw of $1 \times 10^4$ or larger. The type of such optional polymer is not particularly limited. A suitable species can be selected among water-soluble polymers that are known in the field of polishing compositions, but do not belong to the aforementioned water-soluble polymer.

The optional polymer may have, in its molecule, at least one species of functional group selected among cationic groups, anionic groups and nonionic groups. The optional polymer may have, in its molecule, a hydroxyl group, carboxyl group, acyloxy group, sulfo group, amide structure, quaternary nitrogen structure, heterocyclic structure, vinyl structure, polyoxyalkylene structure, etc. From the standpoint of reducing aggregates or increasing the washability, etc., a nonionic polymer can be preferably used as the optional polymer.

Preferable examples of the optional polymer in the polishing composition disclosed herein include an oxyalkylene unit-containing polymer, nitrogen atom-containing polymer, polyvinyl alcohol having an average SP value of higher than 17.5, and the like.

Examples of the oxyalkylene unit-containing polymer include polyethylene oxide (PEO), a block copolymer of ethylene oxide (EO) and propylene oxide (PO), a random copolymer of EO and PO, etc. The EO/PO block copolymer can be a diblock copolymer, triblock copolymer, etc., comprising a polyethylene oxide (PEO block and a polypropylene oxide (PPO) block Examples of the triblock copolymer include a PEO-PPO-PEO triblock copolymer and PPO-PEO-PPO triblock copolymer. Usually, a PEO-PPO-PEO triblock copolymer is more preferable. In the block or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer comprising nitrogen atoms in the main chain or a polymer having a nitrogen atom in a side chain (pendant group) can be used. Examples of the polymer having a nitrogen atom in the main chain include a homopolymer and a copolymer of an N-acylalkyleneimine-based monomer. Specific examples of the N-acylalkyleneimine-based monomer include N-acetylethyleneimine, N-propionylethyleneimine, etc. Examples of the polymer having a nitrogen atom in a pendant group include a polymer comprising an N-(meth)acryloyl monomeric unit, a polymer comprising an N-vinyl monomeric unit, etc. The term "(meth)acryloyl" herein comprehensively refers to acryloyl and methacryloyl. For example, a homopolymer and a copolymer of N-(meth)acryloylmorpholine, a homopolymer and a copolymer of N-vinylpyrrolidone, etc., can be used.

Unless otherwise indicated, the copolymer in this specification comprehensively means various copolymers such as random copolymer, alternating copolymer, block copolymer, graft copolymer, etc.

When a polyvinyl alcohol is used as an optional polymer, a preferable species as the polyvinyl alcohol has a degree of saponification of 90% by mole or higher, or more preferably 95% by mole or higher (e.g. higher than 98% by mole). The degree of saponification of a polyvinyl alcohol is theoretically 100% by mole or lower.

Other examples of the optional polymer that can be contained in the polishing composition disclosed herein include cellulose derivatives such as hydroxyethyl cellulose, hydroxypropyl cellulose, hydroxyethyl methylcellulose, hydroxypropyl methylcellulose, methylcellulose, ethylcellulose, ethylhydroxyethyl cellulose, carboxymethyl cellulose, etc.; and pullulan.

The molecular weight and the molecular weight distribution (Mw/Mn) of the optional polymer are not particularly limited. For example, the preferable Mw and molecular weight distribution of the aforementioned water-soluble polymer can be also applied to the Mw and molecular weight distribution of the optional polymer.

The optional polymer is used in an amount of suitably 30% by mass or less of the total amount of water-soluble components with Mw of $1\times10^4$ or larger (including the aforementioned water-soluble polymer and optional polymers used as necessary), preferably 15% by mass or less, or more preferably 10% by mass or less (e.g. 5% by mass or less). The polishing composition disclosed herein can be preferably made in an embodiment essentially free of optional polymers (e.g. the optional polymer content in the total amount of water-soluble components is less than 1% by mass or non-detectable).

When the polishing composition disclosed herein comprises a cellulose derivative as an optional polymer, its amount used is preferably as low as or lower than 10% by mass of the total amount of water-soluble components with Mw of $1\times10^4$ or larger in the polishing composition, or more preferably 5% by mass or less (typically 1% by mass or less). By this, inclusion of contamination and aggregation caused by the use of a natural compound-derived cellulose derivative can be reduced to a greater extent. The polishing composition disclosed herein can be preferably made, for instance, in an embodiment essentially free of a cellulose derivative (e.g. the cellulose derivative content in the total amount of the water-soluble components is less than 1% by mass or non-detectable).

The art disclosed herein can be implemented in an embodiment of the polishing composition that comprises a water-soluble polymer Q while satisfying the following conditions: having a Mw of $1\times10^4$ or larger, comprising a hydroxyl group-containing repeat unit h; and having a hydroxyl group content in a range of 4 mmol/g or higher, but 21 mmol/g or lower. The water-soluble polymer Q may be a water-soluble polymer that comprises repeat units A and B satisfying the aforementioned prescribed SP values while satisfying the prescribed average SP value or may be a polymer that belongs to the optional polymer. A polishing composition comprising such a water-soluble polymer Q is preferably supplied to a polishing object with the hydroxyl group content of the water-soluble polymer being maintained in a range from 4 mmol/g up to 21 mmol/g when used for polishing the polishing object. The repeat unit h can be, for instance, a vinyl alcohol unit.

In this specification, the hydroxyl group content refers to the number of moles of hydroxyl groups contained in one gram of the polymer. The hydroxyl group content can be generally obtained by subjecting a sample solution comprising the polymer of interest to neutralization titration as specified in JIS K0070 to determine the hydroxyl value (mgKOH/g) and dividing the hydroxyl value by 56.1.

When the polymer of interest is, for instance, a polymer formed of vinyl carboxylate units and vinyl alcohol units such as a partially-saponified polyvinyl alcohol, potassium hydroxide (KOH) is added to the sample solution containing the polymer of interest and the resulting solution is heated to allow complete saponification; the amount of KOH consumed during this is determined by titration; from the results, the number of moles of vinyl carboxylate units and the number of moles of vinyl alcohol units are determined; and from their numbers of moles, the hydroxyl group content can be determined.

In measuring the hydroxyl group content, when a polymer contained in a polishing composition is measured, the polishing composition can be used as the sample solution.

When the polishing composition comprises an abrasive, the abrasive is precipitated by centrifugation and the resulting supernatant can be used as the sample solution.

<1-7. Other Components>

As far as the effects by the present invention are not significantly hindered, the polishing composition disclosed herein may further comprise as necessary known additives, such as chelating agents, organic acids, organic acid salts, inorganic acids, inorganic acid salts, preservatives, antifungal agents, and so on, usable in polishing compositions (typically, polishing compositions used for final polishing of silicon wafers).

Examples of chelating agents include aminocarboxylic acid-based chelating agents and organophosphonic acid-based chelating agents. Examples of aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenedimaine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of organophosphonic acid-based chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Among them, organophosphonic acid-based chelating agents are preferable, with ethylenediaminetetrakis(methylenephosphonic acid) and diethylenetriaminepenta(methylenephosphonic acid) being more preferable. A particularly preferable chelating agent is ethylenediaminetetrakis(methylenephosphonic acid).

Examples of organic acids include aliphatic acids such as formic acid, acetic acid, propionic acid, etc.; aromatic carboxylic acids such as benzoic acid, phthalic acid, etc.; as well as citric acid, oxalic acid, tartaric acid, malic acid, maleic acid, fumaric acid, succinic acid, organic sulfonic acids, organic phosphoric acids, and the like. Examples of organic acid salts include alkali metal salts (sodium salts, potassium salts, etc.), ammonium salts and the like of organic acids. Examples of inorganic acids include sulfuric acid, nitric acid, hydrochloric acid, carbonic acid, etc. Examples of inorganic acid salts include alkali metal salts (sodium salts, potassium salts, etc.) and ammonium salts of inorganic acids. The organic acids and their salts as well as inorganic acids and their salts can be used singly as one species or in a combination of two or more species.

Examples of preservatives and antifungal agents include isothiazoline-based compounds, paraoxybenzoic acid esters, phynoxyethanol, etc.

<1-8. Applications>

The polishing composition disclosed herein can be suitably applied for polishing objects of various materials and shapes. The polishing object's material can be, for instance, a metal or metalloid such as silicon, aluminum, nickel, tungsten, copper, tantalum, titanium, stainless steel, etc., or an alloy of these; a glassy material such as quartz glass, aluminosilicate glass, glassy carbon, etc.; a ceramic material such as alumina, silica, sapphire, silicon nitride, tantalum nitride, titanium carbide, etc.; a material for compound semiconductor substrates such as silicon carbide, gallium nitride, gallium arsenide, etc.; a resin material such as polyimide resin, etc.; or the like. The polishing object may be formed of several materials among them. In particular, it is suitable for polishing a polishing object having a surface formed of silicon. The art disclosed herein can be particularly preferably applied to a polishing composition comprising silica grains (typically consisting of silica grains) as the abrasive and intended for polishing silicon.

The shape of the polishing object is not particularly limited. The polishing composition disclosed herein can be preferably applied for polishing a polishing object having a flat surface such as a plate, polyhedron, etc.

The polishing composition disclosed herein can be preferably used for final polishing of a polishing object. Accordingly, this specification provides a polished article production method (e.g. silicon wafer production method) comprising a final polishing step using the polishing composition. The final polishing refers to the last polishing step (i.e. a step after which no further polishing is performed) in a production process of a polishing object of interest. The polishing composition disclosed herein may be used in an earlier polishing step than final polishing (referring to a step between the rough polishing step and final polishing step, typically including at least a first polishing step and possibly second, third . . . polishing steps), for instance, in a polishing step performed just before final polishing.

The polishing composition disclosed herein can be preferably used for polishing a surface formed of silicon and particularly preferably used for polishing a silicon wafer. For instance, it is preferable as a polishing composition used in final polishing of a silicon wafer or in an earlier polishing step than this. For instance, it is effectively applied for polishing (typically final polishing or polishing just before this) of a silicon wafer prepared into a surface state having a surface roughness of 0.01 nm to 100 nm in an earlier step. It is particularly preferably applied to final polishing.

<1-9. Polishing Liquid>

The polishing composition disclosed herein is supplied to a polishing object, typically in a form of a polishing liquid comprising the polishing composition, and used for polishing the polishing object. The polishing liquid may be prepared, for instance, by diluting (typically with water) a polishing composition disclosed herein. Alternatively, the polishing composition can be used straight as a polishing liquid. In other words, the concept of polishing composition in the art disclosed herein encompasses both a polishing liquid (working slurry) supplied to a polishing object and used for polishing the polishing object and a concentrate (stock solution of polishing liquid) which is diluted for use as a polishing liquid. Other examples of the polishing liquid comprising the polishing composition disclosed herein include a polishing liquid obtained by adjusting the pH of the composition.

The water-soluble polymer content in the polishing liquid is not particularly limited. For instance, it can be $1 \times 10^{-4}\%$ by mass or higher. From the standpoint of haze reduction, etc., the polymer content is preferably $5 \times 10^{-4}\%$ by mass or higher, or more preferably $1 \times 10^{-3}\%$ by mass or higher, for instance, $2 \times 10^{-3}\%$ by mass or higher. From the standpoint of the polishing rate, etc., the polymer content is preferably 0.2% by mass or lower, or more preferably 0.1% by mass or lower (e.g. 0.05% by mass or lower).

When the polishing composition comprises an abrasive, the abrasive content in the polishing liquid is not particularly limited. It is typically 0.01% by mass or higher, preferably 0.05% by mass or higher, or more preferably 0.1% by mass or higher, for instance, 0.15% by mass or higher. With increasing abrasive content, a higher polishing rate can be obtained. From the standpoint of obtaining a surface with lower haze, usually, the abrasive content is suitably 10% by mass or lower, preferably 7% by mass or lower, more preferably 5% by mass or lower, or yet more preferably 2% by mass or lower, for instance, 1% by mass or lower.

When a basic compound is contained, the basic compound content in the polishing liquid is not particularly limited. From the standpoint of increasing the polishing rate, etc., usually, the basic compound content is preferably 0.001% by mass or more of the polishing liquid, or more preferably 0.003% by mass or more. From the standpoint of haze reduction, etc., the basic compound content is preferably below 0.4% by mass, or more preferably below 0.25% by mass.

The pH of the polishing liquid is not particularly limited. For instance, the pH is preferably 8.0 or more, or more preferably 9.0 or more, but preferably 12.0 or less, or more preferably 11.0 or less. It is preferable that the basic compound is contained to yield such a pH of the polishing liquid. The pH can be preferably applied to a polishing liquid (e.g. polishing liquid for final polishing) used for polishing a silicon wafer.

When the polishing composition disclosed herein comprises a surfactant, the surfactant content in the polishing liquid is not particularly limited. For instance, it can be $1 \times 10^{-4}$% by mass or higher. From the standpoint of haze reduction, etc., a preferable surfactant content is $5 \times 10^{-4}$% by mass or higher, or more preferably $1 \times 10^{-3}$% by mass or higher, for instance, $2 \times 10^{-3}$% by mass or higher. From the standpoint of the washability, polishing rate, etc., the surfactant content is preferably 0.2% by mass or lower, or more preferably 0.1% by mass or lower (e.g. 0.05% by mass or lower).

When the polishing composition disclosed herein comprises a surfactant, the mass ratio of water-soluble polymer content w1 to surfactant content w2 is not particularly limited. For instance, the mass ratio w1/w2 can be 0.01 or more, or preferably 0.05 or more, or more preferably 0.1 or more, but 100 or less, or preferably 50 or less, or more preferably 30 or less.

When the polishing composition disclosed herein is used in a polishing liquid form comprising an abrasive, the surfactant content relative to 100 parts by mass of the abrasive is suitably, for instance, 20 parts by mass or less, preferably 15 parts by mass or less, or more preferably 10 parts by mass or less (e.g. 6 parts by mass or less). From the standpoint of obtaining greater effect of the surfactant use, the surfactant content relative to 100 parts by mass of the abrasive is suitably 0.001 part by mass or greater, preferably 0.005 part by mass or greater, or more preferably 0.01 part by mass or greater (e.g. 0.1 part by mass or greater).

Alternatively, from the standpoint of simplifying the composition, etc., the polishing composition disclosed herein can be preferably made in an embodiment essentially free of a surfactant.

<1-10. Concentrate>

The polishing composition disclosed herein may be in a concentrated form (i.e. in a form of a concentrate of the polishing liquid) before supplied to a polishing object. The polishing composition in a concentrated form as this is advantageous from the standpoint of the convenience and cost reduction for production, distribution, storage, etc. The concentration can be, for instance, about 2-fold or more, or usually suitably about 5-fold or more, but 100-fold or less, or usually suitably about 50-fold or less. The concentration of the polishing composition according to a preferable embodiment is, 10-fold or more, for instance, 15-fold or more, but 40-fold or less, for instance, 25-fold or less.

The polishing composition in a concentrated form as this can be used in an embodiment where it is diluted whenever desired to prepare a polishing liquid and the polishing liquid is supplied to a polishing object. The dilution can be carried out typically by adding an aforementioned aqueous solvent to the concentrate and mixing. When the aqueous solvent is a solvent mixture, the dilution can be performed by adding just some of the components of the aqueous solvent or by adding a solvent mixture comprising the components at a mass ratio different from that of the aqueous solvent. With respect to a multiple-part type polishing composition as described later, some of the parts may be diluted first and then mixed with other parts to prepare a polishing liquid, the multiple parts may be mixed first followed by dilution of the mixture to prepare a polishing liquid.

The concentrate can have an NV of, for instance, 50% by mass or lower. From the standpoint of the stability (e.g. dispersion stability of the abrasive) and ease of filtration of the polishing composition, etc., usually, the concentrate has an NV of suitably 40% by mass or lower, preferably 30% by mass or lower, or yet more preferably 20% by mass or lower, for instance, 15% by mass or lower. From the standpoint of the convenience and cost reduction for production, distribution, storage and so on, the NV of the concentrate is suitably 0.5% by mass or higher, preferably 1% by mass or higher, or more preferably 3% by mass or higher, for instance, 5% by mass or higher.

The water-soluble polymer content in the concentrate can be, for instance, 3% by mass or lower. From the standpoint of the ease of filtration and washability of the polishing composition, etc., usually, the water-soluble polymer content is preferably 1% by mass or lower, or more preferably 0.5% by mass or lower. From the standpoint of the convenience and cost reduction for production, distribution, storage and so on, the water-soluble polymer content is usually suitably $1 \times 10^{-3}$% by mass or higher, preferably $5 \times 10^{-3}$% by mass or higher, or more preferably $1 \times 10^{-2}$% by mass or higher.

When the polishing composition disclosed herein comprises an abrasive, the abrasive content in the concentrate can be, for instance, 50% by mass or lower. From the standpoint of the stability (e.g. dispersion stability of the abrasive) and ease of filtration of the polishing composition, etc., usually, the abrasive content is preferably 45% by mass or lower, or more preferably 40% by mass or lower. In a preferable embodiment, the abrasive content can be 30% by mass or lower, or even 20% by mass or lower (e.g. 15% by mass or lower). From the standpoint of the convenience and cost reduction for production, distribution, storage and so on, the abrasive content can be, for instance, 0.5% by mass or higher, preferably 1% by mass or higher, or more preferably 3% by mass or higher (e.g. 5% by mass or higher).

The polishing composition disclosed herein may be of a one-part type or a multiple-part type such as the two-part type. For example, it may be formulated such that agent A (e.g. a basic abrasive dispersion described later) that comprises some of the components of the polishing composition and agent B (e.g. an aqueous polymer solution described later) that comprises the rest of the components are mixed and the mixture is used for polishing of a polishing object.

<1-11. Preparation of Polishing Composition>

The method for producing the polishing composition disclosed herein is not particularly limited. For instance, the respective components of the polishing composition can be mixed, using a commonly known mixing device such as a propeller stirrer, ultrasonic disperser, homo mixer, etc. The way of mixing these components is not particularly limited. For instance, all the components can be mixed at once or in a suitably selected order.

Although not particularly limited, with respect to a polishing composition comprising a water-soluble polymer, an abrasive and a basic compound, from the standpoint of consistently (reproducibly) producing polishing compositions having less aggregates, can be preferably used, for instance, a production method comprising obtaining a dispersion comprising an abrasive (e.g. silica grains), a basic compound and water (or a "basic abrasive dispersion" hereinafter) and mixing the basic abrasive dispersion and a water-soluble polymer.

In such a basic abrasive dispersion where the abrasive and basic compound are co-present, the abrasive exhibits greater electrostatic repulsion due to the basic compound and thus shows higher dispersion stability than a basic compound-free abrasive dispersion (typically almost neutral). Accordingly, local aggregation of the abrasive is less likely to occur as compared with an embodiment where the basic compound is added after addition of the water-soluble polymer to a neutral abrasive dispersion and an embodiment where the neutral abrasive dispersion, water-soluble polymer and basic compound are mixed all at once. This is preferable from the standpoint of increasing the ease of filtration of the polishing composition or reducing defects in the polished surface, etc.

The water-soluble polymer is preferably pre-dissolved in water and mixed in the form of an aqueous solution (or "aqueous polymer solution" hereinafter) with the basic abrasive dispersion. This can better inhibit local aggregation of the abrasive.

When mixing the basic abrasive dispersion and aqueous polymer solution, it is preferable to add the aqueous polymer solution to the basic abrasive dispersion. According to such a mixing method, local aggregation of the abrasive can be better prevented, for instance, as compared with a mixing method where the basic abrasive dispersion is added to the aqueous polymer solution. When the abrasive is silica grains (e.g. colloidal silica grains), it is particularly meaningful to use the mixing method by which an aqueous polymer solution is added to a basic abrasive dispersion as described above.

Among the abrasive, the water-soluble polymer, the basic compound and water forming the polishing composition to be produced, the basic abrasive dispersion comprises at least some of the abrasive, at least some of the basic compound and at least some of the water. For instance, in a preferable embodiment, the abrasive dispersion comprises all the abrasive forming the polishing composition, at least some of the basic compound and at least some of the water.

The basic compound content in the basic abrasive dispersion is preferably 0.01% by mass or greater, more preferably 0.05% by mass or greater, or yet more preferably 0.1% by mass or greater. With increasing basic compound content, there is a tendency for greater inhibition of the occurrence of local aggregation during preparation of the polishing composition. The basic compound content in the basic abrasive dispersion is preferably 10% by mass or less, more preferably 5% by mass or less, or yet more preferably 3% by mass or less. A lower basic compound content facilitates adjustment of the basic compound content in the polishing composition.

The basic abrasive dispersion has a pH of preferably 8 or higher, or more preferably 9 or higher. With increasing pH, there is a tendency for greater inhibition of the occurrence of local aggregation when the water-soluble polymer or an aqueous solution thereof is added to the basic abrasive dispersion. The pH of the basic abrasive dispersion is preferably 12 or lower, more preferably 11.5 or lower, or yet more preferably 10.5 or lower. With the pH of the basic abrasive dispersion being lower in a pH range of 7 or higher, the amount of the basic compound required for preparing the dispersion is reduced, making it easier to adjust the basic compound content in the polishing composition. For instance, when the abrasive is silica grains, it is also advantageous that the pH is not excessively high, from the standpoint of reducing dissolution of the silica. The mixture's pH can be adjusted by modifying the amount of the basic compound added, etc.

Such a basic abrasive dispersion can be prepared by mixing an abrasive, a basic compound and water. They can be mixed with a commonly known mixing device such as a propeller stirrer, ultrasonic disperser, homo mixer, etc. The mode of mixing the respective components of the basic abrasive dispersion is not particularly limited. For instance, the components can be mixed all at once or in a suitably selected order. An example of preferable embodiments is an embodiment where an approximately neutral dispersion comprising the abrasive and water is mixed with the basic compound or an aqueous solution thereof.

When mixing the water-soluble polymer in a form of an aqueous solution (aqueous polymer solution) into a basic abrasive dispersion, the water-soluble polymer content in the aqueous polymer solution is preferably 0.02% by mass or greater, more preferably 0.05% by mass or greater, or yet more preferably 0.1% by mass or greater. With increasing water-soluble polymer content, it becomes easier to adjust the water-soluble polymer content in the polishing composition. The water-soluble polymer content in the aqueous polymer solution is preferably 10% by mass or less, more preferably 5% by mass or less, or yet more preferably 3% by mass or less. With decreasing water-soluble polymer content, local aggregation of the abrasive tends to be more likely reduced when mixing the aqueous polymer solution with the basic abrasive dispersion.

The pH of the aqueous polymer solution is not particularly limited and can be adjusted, for instance, to pH 2 to 11. The pH of the aqueous polymer solution is adjusted preferably to around neutral to basic, or more preferably to basic. More specifically, the pH of the aqueous polymer solution is preferably 8 or higher, or more preferably 9 or higher. The pH can be adjusted by using some of the basic compound forming the polishing composition. The increased pH of the aqueous polymer solution can more greatly reduce local aggregation of the abrasive when the aqueous polymer solution is added to the basic abrasive dispersion. The pH of the aqueous polymer solution is preferably 12 or lower, or more preferably 10.5 or lower. With decreasing pH of the aqueous polymer solution, the amount of the basic compound required for preparing the aqueous polymer solution is reduced, making it easier to adjust the basic compound content in the polishing composition. For instance, when the abrasive is silica grains, it is advantageous that the pH is not excessively high also from the standpoint of reducing dissolution of the silica.

The rate (supply rate) of adding the aqueous polymer solution to the basic abrasive dispersion is preferably, with respect to 1 L of the dispersion, at or below 500 mL of aqueous polymer solution per minute, more preferably at or below 100 mL/min, or yet more preferably at or below 50 mL/min. With decreasing supply rate, local aggregation of the abrasive can be more greatly reduced.

In a preferable embodiment, the aqueous polymer solution can be filtered before added to the basic abrasive dispersion. By filtering the aqueous polymer solution, the amounts of contaminants and aggregates in the aqueous polymer solution can be further reduced.

The filtration method is not particularly limited. Known filtration methods can be suitably employed such as natural filtration performed at normal pressure as well as suction filtration, pressure filtration, centrifugal filtration, etc. The filter used for filtration is preferably selected based on mesh size. From the standpoint of the productivity of polishing compositions, the filter's mesh size is preferably 0.05 µm or larger, more preferably 0.1 µm or larger, or yet more preferably 0.2 µm or larger. From the standpoint of increasing the effect of eliminating contaminants and aggregates, the filter's mesh size is preferably 100 µm or smaller, more preferably 70 µm or smaller, or yet more preferably 50 µm or smaller. The filter's material or construction is not particularly limited. Examples of the filter's material include cellulose, nylon, polysulfone, polyether sulfone, polypropylene, polytetrafluoroethylene (PTFE), polycarbonate, glass, etc. Examples of the filter's construction include depth, pleated, membrane, etc.

The polishing composition production method described above can be preferably applied when the polishing composition obtainable by mixing the basic abrasive dispersion and the water-soluble polymer or an aqueous solution thereof is a polishing liquid (working slurry) or has approximately the same NV as this as well as when it is a concentrate described later.

When the water-soluble polymer is a water-soluble polymer having an alkaline-hydrolytic functional group (or a "water-soluble polymer H" hereinafter), from the standpoint of obtaining greater effect of the use of the water-soluble polymer, it is preferable, but not limited to, mix a basic abrasive dispersion and an aqueous solution of the water-soluble polymer H to form a polishing liquid or a polishing composition having approximately the same NV as the polishing liquid (typically the abrasive content is less than 3% by mass, more preferably less than 1% by mass). Alternatively, it is preferable to mix a basic abrasive dispersion with an aqueous solution of the water-soluble polymer H and then dilute the mixture in relatively short time from the mixing (e.g. within 24 hours after the mixing) to approximately the same NV as the polishing liquid (typically to an abrasive content of less than 3% by mass, more preferably less than 1% by mass). A specific example of the water-soluble polymer H is a water-soluble polymer comprising 5% by mole or more of vinyl acetate units as a repeat unit (e.g. a water-soluble polymer comprising a vinyl acetate unit and a vinyl alcohol unit as repeat units.)

<1-12. Polishing>

The polishing composition disclosed herein can be used for polishing a polishing object, for instance, in an embodiment comprising the following operations. Described below is a preferable embodiment of the method for polishing a polishing object using the polishing composition disclosed herein.

In particular, a polishing liquid (which is typically a shiny polishing liquid and sometimes called a polishing slurry) is obtained, comprising a polishing composition disclosed herein. The obtaining the polishing liquid may include, as described earlier, preparing the polishing liquid by subjecting the polishing composition to operations such as concentration adjustment (e.g. dilution), pH adjustment, etc. Alternatively, the polishing composition can be used straight as the polishing liquid. As for a multiple-part type polishing composition, the obtaining the polishing liquid may include obtaining the parts (agents) constituting the multiple-part type polishing composition, diluting a certain part or multiple parts prior to the mixing, diluting the mixture after the mixing, and so on.

Subsequently, the polishing slurry is supplied to a polishing object and polishing is carried out by a conventional method. For instance, when carrying out final polishing of a silicon wafer, the silicon wafer after a lapping step and first polishing step is set in a general polishing machine and via a polishing pad in the polishing machine, the polishing slurry is supplied to the surface (surface to be polished) of the silicon wafer. Typically, while the polishing slurry is continuously supplied, the polishing pad is pushed against the surface of the silicon wafer, and the two are moved (e.g. moved in circular motion) in coordination. Via such a polishing step, polishing of the polishing object is completed.

The polishing pad(s) used in the polishing step are not particularly limited. For instance, any of the non-woven fabric type, suede type, abrasive-bearing type, abrasive-free type, etc., can be used.

A polishing step such as the above may be part of production processes of polished articles (e.g. substrates such as silicon wafers, etc.). Accordingly, this specification provides a method for producing a polished article (preferably, a method for producing a silicon wafer), with the method comprising the polishing step.

In a polishing step as described above, the polishing liquid supplied to the polishing object preferably comprises the water-soluble polymer disclosed herein (i.e. a water-soluble polymer that comprises a repeat unit A having an SP value of 14.5 or higher and a repeat unit B having an SP value of lower than 14.5, and has an average SP value of 17.5 or lower). This can more suitably bring about the effect of the use of the water-soluble polymer (reduction of the haze and the number of LPD, etc.).

<1-13. Cleaning>

The polishing object polished with the polishing composition disclosed herein is typically cleaned after polished. The cleaning can be carried out, using a suitable cleaning solution. The cleaning solution used is not particularly limited. Usable examples include SC-1 cleaning solution (a mixture of ammonium hydroxide ($NH_4OH$), hydrogen peroxide ($H_2O_2$) and water ($H_2O$); cleaning with SC-1 cleaning solution is referred to as "SC-1 cleaning" hereinafter), SC-2 cleaning solution (a mixture of HCl, $H_2O_2$ and $H_2O$) and the like generally used in the field of semiconductors. The temperature of the cleaning solution can be, for instance, room temperature to about 90° C. From the standpoint of increasing the cleaning efficiency, a cleaning solution at about 50° C. to 85° C. can be preferably used.

<<2. Polishing Composition According to Second Aspect>>

The polishing composition according to the second aspect disclosed herein comprises an abrasive, a water-soluble polymer and water. The polishing composition exhibits an etching rate of 2.0 nm/min or lower based on the following etching rate measurement:

(1A) an etching rate measuring reagent LE is obtained, comprising 0.18% by mass of the water-soluble polymer and 1.3% by mass of ammonia with the rest being water;

(2A) a silicon substrate (in a 6 cm long by 3 cm wide by 775 µm thick rectangle) is obtained, from which surface natural oxide film is removed, and its mass W0 is measured;

(3A) the silicon substrate is immersed in the reagent LE at room temperature for 12 hours;

(4A) the silicon substrate is removed from the reagent LE and cleaned at room temperature for 10 seconds with a cleaning solution formed of $NH_3$ (29%)/$H_2O_2$ (31%)/ultra-pure water=1/1/8 (volume ratio);

(5A) the cleaned silicon substrate is measured for its mass W1; and (6A) from the difference between the W0 and W1 as well as the specific gravity of the silicon substrate, the etching rate (nm/min) is determined;

and also has an abrasive adsorption of 20% or lower based on the following abrasive adsorption measurement:

(1B) the polishing composition is centrifuged to precipitate the abrasive and the supernatant is subjected to measurement of total organic carbon to determine the total amount of organic carbon, C1, in the supernatant;

(2B) a test solution L0 is obtained having the same composition as that of the polishing composition but without the abrasive, and the test solution L0 is subjected to measurement of total organic carbon to determine the total amount of organic carbon, C0, in the test solution L0; and (3B) from the C0 and C1, the abrasive adsorption is determined by the following equation:

Abrasive adsorption (%)=[(C0−C1)/C0]×100

The polishing composition according to the second aspect is described in detail below.

<2-1. Water-Soluble Polymer>

The type of water-soluble polymer in the polishing composition according to the second aspect disclosed herein is not particularly limited. Among water-soluble polymers known in the field of polishing compositions, a suitable species can be selected so as to yield the prescribed etching rate and abrasive adsorption in the polishing composition.

The water-soluble polymer may have, in its molecule, at least one species of functional group selected among cationic groups, anionic groups and nonionic groups. The water-soluble polymer may have, in its molecule, a hydroxyl group, carboxyl group, acyloxy group, sulfo group, amide structure, quaternary nitrogen structure, heterocyclic structure, vinyl structure, polyoxyalkylene structure, etc.

A preferable example of a water-soluble polymer having an acyloxy group in the molecule comprises at least a vinyl monocarboxylate unit. Specific examples of the vinyl monocarboxylate unit include vinyl acetate unit, vinyl hexanoate unit, and the like.

A preferable example of the vinyl monocarboxylate unit-containing polymer is a polymer comprising vinyl acetate units. In such a water-soluble polymer, the number of moles of vinyl acetate units in the total number of moles of all the repeat units is typically 5% or greater, more preferably 10% or greater, yet more preferably 15% or greater, or particularly preferably 20% or greater. The number of moles of vinyl acetate units in the total number of moles of all the repeat units is not particularly limited. From the standpoint of the water solubility, etc., it is usually suitably 80% or less, preferably 60% or less, more preferably 50% or less, or yet more preferably 40% or less.

Another preferable example of the vinyl monocarboxylate unit-containing water-soluble polymer comprises vinyl hexanoate units. The number of moles of vinyl hexanoate units in the total number of moles of all the repeat units is typically, but not particularly limited to, 5% or greater, more preferably 10% or greater, or yet more preferably 15% or greater. From the standpoint of the water solubility, etc., the number of moles of vinyl hexanoate units in the total number of moles of all the repeat units is usually, but not particularly limited to, 80% or less, preferably 60% or less, more preferably 50% or less, or yet more preferably 40% or less (e.g. 30% or less).

A preferable example of the water-soluble polymer having hydroxyl groups in the molecule comprises at least vinyl alcohol units. The art disclosed herein can be preferably implemented in an embodiment using a water-soluble polymer that comprises vinyl alcohol units and vinyl acetate units. An example of such a water-soluble polymer has a structure resulting from partial saponification of vinyl acetate homopolymer or copolymer. For instance, a partially-saponified polyvinyl alcohol having a structure resulting from partial saponification of vinyl acetate homopolymer can be preferably used. The partially-saponified polyvinyl alcohol is a water-soluble polymer formed of vinyl alcohol units and vinyl acetate units.

The art disclosed herein can be preferably implemented in an embodiment using a water-soluble polymer that comprises vinyl alcohol units and vinyl hexanoate units. An example of such a water-soluble polymer has a structure resulting from partial saponification of vinyl hexanoate homopolymer or copolymer. For instance, a partially-saponified polyvinyl alcohol resulting from partial saponification of a copolymer of vinyl acetate and vinyl hexanoate can be preferably used. Examples of the partially-saponified polyvinyl alcohol include a water-soluble polymer formed of vinyl alcohol units and vinyl hexanoate units as well as a water-soluble polymer formed of vinyl alcohol units, vinyl hexanoate units and vinyl acetate units.

From the standpoint of the water solubility, etc., as the partially-saponified polyvinyl alcohol, a species that can be preferably used has a degree of saponification of 50% by mole or higher (more preferably 60% by mole or higher) while satisfying the prescribed etching rate and abrasive adsorption. From the standpoint of the etching rate and abrasive adsorption, the partially-saponified polyvinyl alcohol has a degree of saponification of preferably 90% by mole or lower, or more preferably 85% by mole or lower. In a preferable embodiment, a partially-saponified polyvinyl alcohol having a degree of saponification of 80% by mole or lower can be used. The degree of saponification of a polyvinyl alcohol is theoretically 100% by mole or lower.

From the standpoint of reducing aggregates and increasing the washability, etc., as the water-soluble polymer, a nonionic water-soluble polymer can be preferably used. In other words, a preferable water-soluble polymer is essentially free of anionic and cationic repeat units. Herein, being essentially free of anionic and cationic repeat units means that the molar ratio of these repeat units is lower than 0.02% (e.g. lower than 0.001%). Examples of the nonionic water-soluble polymer include a partially-saponified polyvinyl alcohol, an oxyalkylene unit-containing polymer, a nitrogen atom-containing polymer, etc.

The oxyalkylene unit-containing polymer may comprise one, two or more species of oxyalkylene unit with 2 to 6 carbon atoms (typically, a structural unit represented by —$C_nH_{2n}O$— wherein n is an integer between 2 and 6). The number of carbon atoms in the oxyalkylene unit is preferably 2 to 3. Examples of such a polymer include a polyethylene oxide (PEO), a block copolymer of ethylene oxide (EO) and propylene oxide (PO), a random copolymer of EO and PO, and the like.

The block copolymer of EO and PO can be a diblock copolymer, triblock copolymer or the like comprising a polyethylene oxide (PEO) block and a polypropylene oxide (PPO) block. Examples of the triblock copolymer include a PEO-PPO-PEO triblock copolymer and PPO-PEO-PPO triblock copolymer. Usually, a PEO-PPO-PEO triblock copolymer is more preferable.

As the PEO-PPO-PEO triblock copolymer, a polymer represented by the following formula (1) can be preferably used:

$$HO\text{-}(EO)_a\text{-}(PO)_b\text{-}(EO)_c\text{-}H \quad (1)$$

In the general formula (1), EO represents an oxyethylene group ($-CH_2CH_2O-$), PO represents an oxypropylene group ($-CH_2CH(CH_3)O-$), and each of a, b and c is an integer of 1 or higher (typically 2 or higher).

In the general formula (1), the total of a and c is preferably in a range of 2 to 1000, more preferably in a range of 5 to 500, or yet more preferably in a range of 10 to 200. In the general formula (1), b is preferably in a range of 2 to 200, more preferably in a range of 5 to 100, or yet more preferably in a range of 10 to 50.

In the block or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer containing nitrogen atoms in the main chain or a polymer having a nitrogen atom in the side chain functional group (pendant group) can be used.

Examples of the polymer having a nitrogen atom in the main chain include a homopolymer and a copolymer of an N-acylalkyleneimine-based monomer. Specific examples of the N-acylalkyleneimine-based monomer include N-acetylethyleneimine, N-propionylethyleneimine, N-caproylethyleneimine, N-benzoylethyleneimine, N-acetylpropyleneimine, N-butyrylethyleneimine, etc. The homopolymer of N-acylalkyleneimine-based monomer include poly(N-acetylethyleneimine), poly(N-propionylethyleneimine), poly(N-caproylethyleneimine), poly(N-benzoylethyleneimine), poly(N-acetylpropyleneimine), poly(N-butyrylethyleneimine), etc. Examples of the copolymer of the N-acylalkyleneimine-based monomer include a copolymer of two or more species of N-acylalkyleneimine-based monomer and a copolymer of one, two or more species of N-acylalkyleneimine-based monomer and another monomer.

Unless otherwise indicated, the copolymer in this specification comprehensively means various copolymers such as random copolymer, alternating copolymer, block copolymer, graft copolymer, etc.

Examples of a polymer having a nitrogen atom in a pendant group include a polymer comprising an N-(meth)acryloyl monomeric unit, a polymer comprising an N-vinyl monomeric unit, etc. The term "(meth)acryloyl" herein comprehensively refers to acryloyl and methacryloyl.

Examples of the N-(meth)acryloyl monomeric unit-containing polymer include a homopolymer of an N-(meth)acryloyl-based monomer and a copolymer thereof (typically a copolymer in which the copolymerization ratio of N-(meth)acryloyl-based monomer exceeds 50% by mass). Examples of the N-(meth)acryloyl-based monomer include an open-chain amide having an N-(meth)acryloyl group and a cyclic amide having an N-(meth)acryloyl group.

Examples of an open-chain amide having an N-(meth)acryloyl group include: (meth)acrylamide; N-alkyl(meth)acrylamides such as N-methyl(meth)acrylamide, N-ethyl(meth)acrylamide, N-propyl(meth)acrylamide, N-isopropyl(meth)acrylamide, N-n-butyl(meth)acrylamide, etc.; N,N-dialkyl(meth)acrylamides such as N,N-dimethyl(meth)acrylamide, N,N-diethyl(meth)acrylamide, N,N-dipropyl(meth)acrylamide, N,N-diisopropyl(meth)acrylamide, N,N-di(n-butyl)(meth)acrylamide, etc.; and the like. Examples of a polymer comprising a N-(meth)acryloyl group-containing open-chain amide as a monomeric unit include a homopolymer of isopropylacrylamide and a copolymer of N-isopropylacrylamide (e.g. a copolymer in which the copolymerization ratio of N-isopropylacrylamide exceeds 50% by mass).

Examples of the N-(meth)acryloyl group-containing cyclic amide include N-(meth)acryloylmorpholine, N-(meth)acryloylpyrrolidine, etc. Examples of a polymer comprising an N-(meth)acryloyl group-containing cyclic amide as a monomeric unit include a homopolymer of N-acryloylmorpholine and a copolymer of N-acryloylmorpholine (e.g. a copolymer in which the copolymerization ratio of N-acryloylmorpholine exceeds 50% by mass).

Examples of the N-vinyl monomeric unit-containing polymer include a homopolymer of an N-vinyllactam-based monomer and a copolymer thereof (e.g. a copolymer in which the copolymerization ratio of the N-vinyllactam-based monomer exceeds 50% by weight), a homopolymer of an open-chain N-vinylamide and a copolymer thereof (e.g. a copolymer in which the copolymerization ratio of the open-chain N-vinylamide exceeds 50% by weight) and the like.

Specific examples of the N-vinyllactam-based monomer include N-vinylpyrrolidone (VP), N-vinylpiperidone, N-vinylmorpholinone, N-vinylcaprolactam (VC), N-vinyl-1,3-oxazine-2-one, N-vinyl-3,5-morpholinedione, etc. Specific examples of the N-vinyllactam monomeric unit-containing polymer include a polyvinylpyrrolidone (PVP), polyvinylcaprolactam, random copolymer of VP and VC, random copolymer of one or each of VP and VC with another vinyl monomer (e.g. acrylic monomer, vinyl ester-based monomer, etc.), block copolymer and graft copolymer comprising a polymer segment with one or each of VP and VC (e.g. a graft copolymer obtained by grafting polyvinyl alcohol with polyvinylpyrrolidone), and the like.

Specific examples of the open-chain N-vinylamide include N-vinylacetamide, N-vinylpropionic acid amide, N-vinyllactic acid amide, etc.

Other examples of a polymer having a nitrogen atom in a pendant group include a homopolymer and a copolymer of an amino group-containing vinyl monomer (e.g. a monomer having a (meth)acryloyl group) such as aminoethyl (meth)acrylate, N,N-dimethylaminoethyl (meth)acrylate, N,N-dimethylaminopropyl (meth)acrylate, etc.

Other examples of the water-soluble polymer that can be contained in the polishing composition disclosed herein include cellulose derivatives such as hydroxyethyl cellulose, hydroxyethylmethyl cellulose, hydroxypropylmethyl cellulose, methyl cellulose, ethyl cellulose, ethylhydroxyethyl cellulose, carboxymethyl cellulose, etc.; and pullulan.

The molecular weight of the water-soluble polymer is not particularly limited. For instance, a water-soluble polymer having a weight average molecular weight (Mw) of $200 \times 10^4$ or smaller (typically $1 \times 10^4$ to $200 \times 10^4$, e.g. $1 \times 10^4$ to $150 \times 10^4$) can be used. From the standpoint of better preventing formation of aggregates, the use of a water-soluble polymer having a Mw of smaller than $100 \times 10^4$ (more preferably $80 \times 10^4$ or smaller, yet more preferably $50 \times 10^4$ or smaller, typically $40 \times 10^4$ or smaller, e.g. $30 \times 10^4$ or smaller) is preferable. From the standpoint of the ease of filtering and washing the polishing composition, etc., a water-soluble polymer having a Mw of $25 \times 10^4$ or smaller (typically $20 \times 10^4$ or smaller, more preferably $15 \times 10^4$ or smaller, typically $10\times10^4$ or smaller, e.g. $5\times10^4$ or smaller) can be preferably used. On the other hand, in general, with increasing Mw of water-soluble polymer, the haze reduction effect tends to increase. From such a standpoint, it is usually preferable to use a water-soluble polymer having a Mw of $0.1\times10^4$ or larger (typically $0.2\times10^4$ or larger, e.g. $1\times10^4$ or larger).

In the art disclosed herein, the relationship between the weight average molecular weight (Mw) and number average molecular weight (Mn) of the water-soluble polymer is not particularly limited. From the standpoint of preventing aggregate formation, etc., for instance, a water-soluble polymer having a molecular weight distribution (Mw/Mn) of 5.0 or lower can be preferably used. From the standpoint of the consistency of performance of the polishing composition, etc., the Mw/Mn of the water-soluble polymer is preferably 4.0 or lower, more preferably 3.5 or lower, or yet more preferably 3.0 or lower (e.g. 2.5 or lower).

Theoretically, the Mw/Mn is 1.0 or greater. From the standpoint of the availability of starting materials and ease of synthesis, usually, a water-soluble polymer having an Mw/Mn of 1.05 or higher can be preferably used.

As the Mw and Mn of a water-soluble polymer, the values based on aqueous gel permeation chromatography (GPC) (aqueous, based on standard polyethylene oxide) can be used.

<2-2. Water>

As the water contained in the polishing composition according to the second aspect, the same kinds as the water described regarding the polishing composition according to the first aspect can be used.

The polishing composition disclosed herein may further comprise, as necessary, a water-miscible organic solvent (lower alcohol, lower ketone, etc.). In usual, of the solvent in the polishing composition, preferably 90% by volume or more is water, or more preferably 95% by volume or more (typically 99 to 100% by volume) is water.

The polishing composition disclosed herein (typically a slurry composition) can be preferably made, for instance, in an embodiment in which the non-volatile content (NV) is 0.01% by mass to 50% by mass and the rest is an aqueous solvent (water or a mixture of water and the organic solvent) or in an embodiment where the rest is an aqueous solvent and a volatile compound (e.g. ammonia). An embodiment wherein the NV is 0.05% by mass to 40% by mass is more preferable. The non-volatile content (NV) refers to the mass proportion of residue remaining in the polishing composition after drying the polishing composition at 105° C. for 24 hours.

<2-3. Abrasive>

The abrasive contained in the polishing composition according to the second aspect disclosed herein is the same as the abrasive contained in the polishing composition according to the first aspect. Thus, detailed descriptions are omitted.

<2-4. Basic Compound>

The basic compound that can be contained in the polishing composition according to the second aspect disclosed herein is the same as the basic compound that can be contained in the polishing composition according to the first aspect. Thus, detailed descriptions are omitted.

<2-5. Surfactant>

The polishing composition according to the second aspect disclosed herein can comprise a surfactant as necessary. Usable surfactants are the same as in the polishing composition according to the first aspect. Thus, detailed descriptions are omitted.

<2-7. Other Components>

As far as the effects by the present invention are not significantly hindered, the polishing composition according to the second aspect disclosed herein may further comprise as necessary known additives, such as chelating agents, organic acids, organic acid salts, inorganic acids, inorganic acid salts, preservatives, antifungal agents, and so on, usable in polishing compositions (typically, polishing compositions used for final polishing of silicon wafers). Additives that can be included in the polishing composition according to the second aspect are the same as in the polishing composition according to the first aspect. Thus, detailed descriptions are omitted.

<2-8. Etching Rate and Abrasive Adsorption>

The polishing composition according to the second aspect disclosed herein comprises an abrasive, a water-soluble polymer and water and is characterized by having an etching rate of 2.0 nm/min according to the etching rate measurement described earlier and an abrasive adsorption of 20% or lower based on the abrasive adsorption measurement described earlier.

The etching rate can be measured as described below. In particular, for instance, it can be measured in the same manner as the etching rate measurement described later in the working examples.

[Etching Rate Measurement]

(1A) An etching rate measuring reagent LE is prepared, comprising 0.18% by mass of the water-soluble polymer in the polishing composition and 1.3% by mass of ammonia with the rest being water.

(2A) A silicon substrate (in a 6 cm long by 3 cm wide by 775 μm thick rectangle) is obtained, from which surface natural oxide film is removed, and its mass W0 is measured.

(3A) The silicon substrate is immersed in the reagent LE at room temperature for 12 hours.

(4A) The silicon substrate is removed from the reagent LE and cleaned at room temperature for 10 seconds with a cleaning solution formed of $NH_3$ (29%)/$H_2O_2$ (31%)/ultrapure water=1/1/8 (volume ratio).

(5A) The cleaned silicon substrate is measured for its mass W1.

(6A) From the difference between the W0 and W1 as well as the specific gravity of the silicon substrate, the etching rate (nm/min) is determined.

The etching rate of a polishing composition comprising two or more species of water-soluble polymer can be determined by carrying out the etching rate measurement, using the two or more species of water-soluble polymer at the same ratio as in the polishing composition.

The abrasive adsorption can be measured as described below. In particular, for instance, it can be measured in the same manner as the abrasive adsorption measurement as described later in the working examples.

[Measurement of Abrasive Adsorption]

The abrasive adsorption is determined as follows:

(1B) The polishing composition is centrifuged to precipitate the abrasive and the resulting supernatant is subjected to measurement of total organic carbon to determine the total amount of organic carbon, C1, in the supernatant.

(2B) A test solution L0 is obtained having the same composition as that of the polishing composition but without the abrasive and the test solution L0 is subjected to measurement of total organic carbon to determine the total amount of organic carbon, C0, in the test solution L0.

(3B) From the C0 and C1, the abrasive adsorption is determined by the following equation:

$$\text{Abrasive adsorption (\%)} = [(C0-C1)/C0] \times 100$$

The abrasive adsorption being 20% or lower means that most (typically more than 80% by mass) of the water-soluble polymer in the polishing composition is not adsorbed on the abrasive. The water-soluble polymer not adsorbed on the abrasive (or free polymer hereinafter) can adhere quickly to the polishing object surface and thus may be highly protective to the surface in comparison with the polymer adsorbed on the abrasive. Accordingly, in polishing with a polishing composition having a higher free polymer content (a low abrasive adsorption), the water-soluble polymer in the polishing composition can serve more effectively to protect the surface of the polishing object.

On the other hand, the ability of the water-soluble polymer to protect the polishing object surface may vary also in accordance with the characteristics of the water-soluble polymer. The etching rate can serve as an index to evaluate the ability of the water-soluble polymer to protect the polishing object surface from alkaline corrosion under conditions not influenced by the mechanical force of the abrasive. A lower etching rate tends to indicate a greater ability to inhibit adsorption of the water-soluble polymer to the polishing object surface to causes the basic compound, etc., to chemically etch the surface, that is, a greater ability to protect the polishing object surface. The polishing composition disclosed herein comprises a surface-protective water-soluble polymer yielding an etching rate of a prescribed value or lower. In other words, most of the water-soluble polymer is present as free polymer in the liquid phase and some is adsorbed to the abrasive to suitably exhibit the effect to reduce the haze in the polishing object surface. Because of the low abrasive adsorption, aggregates of the abrasive and water-soluble polymer are unlikely to be formed. This is thought to advantageously contribute to reduce the number of LPD and increase the ease of filtration of the polishing compound.

From the standpoint of the ability to protect the surface (and further of the haze reduction effect), the etching rate is preferably lower than 2.0 nm/min, more preferably 1.8 nm/min or lower, or yet more preferably 1.5 nm/min or lower. From the standpoint of obtaining greater haze reduction effect, the polishing composition disclosed herein can also be preferably made in an embodiment wherein the etching rate is 1.2 nm/min or lower (or even lower than 1.0 nm/min). The lower limit of etching rate is not particularly limited. From the standpoint of the polishing efficiency, it is usually preferably 0.3 nm/min or higher, or more preferably 0.5 nm/min or higher.

From the standpoint of combining the haze reduction effect and LPD count reduction effect at a high level, the abrasive adsorption is preferably 20% or lower (typically lower than 20%), more preferably 15% or lower, or even more preferably 10% or lower. From the standpoint of obtaining a surface of higher quality, the polishing composition disclosed herein can also be preferably made in an embodiment wherein the abrasive adsorption is 5% or lower (more preferably 3% or lower, or even essentially 0%).

The type and amount (concentration) of water-soluble polymer in the polishing composition according to the second aspect disclosed herein can be selected so as to satisfy the aforementioned etching rate and abrasive adsorption in accordance with the type (material, size, shape) and concentration of the abrasive being used, pH of the polishing composition and so on.

For the water-soluble polymer, among known water-soluble polymers (e.g. the water-soluble polymers exemplified earlier), solely one species or a combination of two or more species can be used. When two or more species of water-soluble polymer are used in combination, they can be used at a ratio that satisfies the etching rate and abrasive adsorption.

The polishing composition according to the second aspect disclosed herein can be preferably made in, but not particularly limited to, an embodiment comprising solely one species of water-soluble polymer (typically an embodiment wherein solely one species of water-soluble polymer having a Mw larger than $1 \times 10^4$ is present among other components in the polishing composition). Because of its simple composition, such a polishing composition can be advantageous in terms of reducing raw material costs, minimizing the manufacturing facility, increasing the consistency of quality, facilitating the quality control, and so on. A preferable example of water-soluble polymers that can be used in the polishing composition in such an embodiment is a polyvinyl alcohol having a degree of saponification of lower than 95% by mole (more preferably 90% by mole or lower, even more preferably 85% by mole or lower, typically 80% by mole or lower). Such a polyvinyl alcohol used as the water-soluble polymer in the polishing composition has a degree of saponification of preferably 60% by mole or higher, or more preferably 65% by mole or higher (e.g. 70% by mole or higher).

In such an embodiment comprising solely one species of water-soluble polymer, from the standpoint of the ease of filtration, washability, etc., the water-soluble polymer (e.g. a polyvinyl alcohol having a degree of saponification of lower than 95% by mole) has a Mw of preferably $25 \times 10^4$ or smaller (more preferably $20 \times 10^4$ or smaller, yet more preferably $15 \times 10^4$ or smaller, typically $10 \times 10^4$ or smaller, e.g. $5 \times 10^4$ or smaller). From the standpoint of haze reduction, the water-soluble polymer preferably has a Mw of $1 \times 10^4$ or larger.

In the polishing composition according to the second aspect disclosed herein, a water-soluble polymer having a Mw of $3 \times 10^4$ or smaller can be preferably used. The Mw of the water-soluble polymer can be $2 \times 10^4$ or smaller, $1 \times 10^4$ or smaller, or even $0.5 \times 10^4$ or smaller (e.g. $0.4 \times 10^4$ or smaller). The Mw of the water-soluble polymer is typically $1 \times 10^3$ or larger or usually preferably $0.2 \times 10^4$ or larger. For instance, this Mw ranges can be preferably applied to a water-soluble polymer comprising at least a vinyl alcohol unit.

From the standpoint of preventing formation of aggregates, etc., the water-soluble polymer's Mw/Mn is suitably, but not particularly limited to, 5.0 or less (typically 1.05 or greater, but 5.0 or less), preferably 4.0 or less, more preferably 3.5 or less, or even more preferably 3.0 or less (e.g. 2.5 or less).

For selecting a water-soluble polymer for use as a component in the polishing composition according to the second aspect disclosed herein, for instance, the average SP value of the water-soluble polymer can be taken into account. This allows for efficient selection of a water-soluble polymer that satisfies desirable etching rate and abrasive adsorption. More specifically, as the water-soluble polymer in the polishing composition according to the second aspect disclosed herein, a water-soluble polymer having an average SP value of 17.5 or lower can be preferably used. A polishing composition comprising such a water-soluble polymer has suitably-balanced water solubility, adsorption to the abrasive (typically a silica abrasive) and to a polishing object to be polished (e.g. a silicon substrate), and is likely to satisfy preferable etching rate and abrasive adsorption. A particularly preferable water-soluble polymer comprises a repeat unit A having an SP value of 14.5 or higher and a repeat unit B having an SP value of lower than 14.5 while having an average SP value of 17.5 or lower.

The lower limit of average SP value of the water-soluble polymer is not particularly limited. From the standpoint of the water solubility, etc., the average SP value of the water-soluble polymer is preferably 10.0 or greater, more preferably 11.0 or greater, or yet more preferably 12.0 or greater (e.g. 12.5 or greater). In a preferable embodiment, the average SP value of the water-soluble polymer can be 13.5 or greater, or 14.0 or greater. From the standpoint of obtaining suitable adsorption to the polishing object (e.g. a silicon wafer) and bringing about haze reduction and LPD count reduction in a well-balanced manner, the average SP value of the water-soluble polymer is preferably 17.4 or less, more preferably 17.2 or less, or yet more preferably 17.0 or less.

The water-soluble polymer may comprise solely one species of repeat unit A having an SP value of 14.5 or higher, or two or more such species in combination. Specific examples of the repeat unit A include those listed in Table 1 above.

From the standpoint of the easy adjustment of the water-soluble polymer's average SP value, the SP value of the repeat unit A (when two or more species of repeat unit A are contained, their average SP value; the same applies hereinafter) is preferably 15 or higher, more preferably 16 or higher, or yet more preferably 17 or higher (e.g. 18 or higher).

The water-soluble polymer may comprise solely one species of repeat unit B having an SP value of lower than 14.5 or a combination of two or more such species. Specific examples of the repeat unit B include those listed in Table 2 above.

From the standpoint of the easy adjustment of the water-soluble polymer's average SP value, the SP value of the repeat unit B (when two or more species of repeat unit B are contained, their average SP value; the same applies hereinafter) is preferably 13.5 or lower, more preferably 13.0 or lower, or yet more preferably 12.5 or lower (e.g. 12.0 or lower). In a preferable embodiment, the SP value of the repeat unit B can be 11.0 or lower, or even 10.0 or lower.

From the standpoint of the ease of adjustment of the water-soluble polymer's average SP value, the difference in the SP value between the repeat unit A and repeat unit B is preferably, but not particularly limited to, 1 or greater, more preferably 3 or greater, or yet more preferably 5 or greater (e.g. 7 or greater). From the standpoint of the copolymerization reactivity, etc., the difference in the SP value between the repeat unit A and repeat unit B is preferably 15 or less, or more preferably 13 or less (e.g. 12 or less).

When the polishing composition disclosed herein comprises a cellulose derivative, its amount used is preferably at most 40% by mass of the total water-soluble polymer in the polishing composition, more preferably 25% by mass or less, or yet more preferably 10% by mass or less (typically 5% by mass or less). This can bring about greater inhibition of contamination and aggregation caused by the use of a naturally-derived cellulose derivative. The polishing composition disclosed herein can be preferably made, for instance, in an embodiment essentially free of a cellulose derivative as the water-soluble polymer.

Although not particularly limited, the water-soluble polymer content can be, for instance, 0.01 part by mass or higher to 100 parts by mass of the abrasive. From the standpoint of increasing the polished surface smoothness (e.g. reduction of haze and defects), the water-soluble polymer content relative to 100 parts by mass of the abrasive is suitably 0.05 part by mass or higher, preferably 0.1 part by mass or higher, or more preferably 0.5 part by mass or higher (e.g. 1 part by mass or higher). From the standpoint of the polishing rate and washability, etc., the water-soluble polymer content relative to 100 parts by mass of the abrasive can be, for instance, 40 parts by mass or less, usually suitably 20 parts by mass or less, preferably 15 parts by mass or less, or more preferably 10 parts by mass or less.

The art disclosed herein can be implemented in an embodiment of the polishing composition that comprises a water-soluble polymer Q and satisfies the following conditions: having a Mw of $1 \times 10^4$ or larger, comprising a hydroxyl group-containing repeat unit h; and having a hydroxyl group content in a range from 4 mmol/g up to 21 mmol/g. The water-soluble polymer Q can be any water-soluble polymer described earlier. A polishing composition comprising such a water-soluble polymer Q is preferably supplied to a polishing object with the hydroxyl group content of the water-soluble polymer being maintained in a range from 4 mmol/g up to 21 mmol/g when used for polishing the polishing object. The repeat unit h can be, for instance, a vinyl alcohol unit.

<2-9. Applications>

Applications of the polishing composition according to the second aspect disclosed herein are the same as the polishing composition according to the first aspect. Thus, detailed descriptions are omitted.

<2-10. Polishing Liquid and Concentrate>

The polishing liquid and concentrate of the polishing composition according to the second aspect disclosed herein are the same as the polishing composition according to the first aspect. Thus, detailed descriptions are omitted.

<2-11. Preparation of Polishing Composition>

Preparation of the polishing composition according to the second aspect disclosed herein is the same as the polishing composition according to the first aspect. Thus, detailed descriptions are omitted.

<2-12. Polishing>

The polishing composition according to the second aspect disclosed herein can be used for polishing in the same manner as the polishing composition according to the first aspect. Thus, detailed descriptions are omitted.

<2-13. Cleaning>

A polishing object polished with the polishing composition according to the second aspect disclosed herein can be cleaned in the same manner as with the polishing composition according to the first aspect. Thus, detailed descriptions are omitted.

<<3. Polishing Composition Production Method According to First Aspect>>

The polishing composition production method according to the first aspect disclosed herein is a method for producing a polishing composition, using an abrasive, a basic compound, a water-soluble polymer H having an alkaline-hydrolytic functional group, and water, with the method comprising:

a step of obtaining an agent A comprising at least the basic compound;

a step of obtaining an agent B comprising at least the water-soluble polymer H; and a step of mixing a first composition comprising at least the agent A and a second composition comprising at least the agent B to prepare a mixture that comprises the abrasive, the basic compound, the water-soluble polymer H and water at a concentration of the basic compound of 0.1 mol/L or lower.

Described in detail below is the polishing composition production method according to the first aspect.

<3-1. Water-Soluble Polymer H>

The polishing composition production method according to the first aspect disclosed herein is preferably applied to production of a polishing composition comprising a water-soluble polymer (water-soluble polymer H) having an alkaline-hydrolytic functional group (or a "hydrolytic group" hereinafter). The water-soluble polymer H typically has a ratio of the number of moles (molar ratio) of hydrolytic group-containing repeat units to the number of moles of all repeat units in the molecular structure exceeds 2%. In producing such a polishing composition, a great effect can be obtained by the use of the method disclosed herein. An object (product) to which the method disclosed herein is preferably applied is a polishing composition that comprises a water-soluble polymer H having a molar ratio of a hydrolytic group of 5% or higher.

The polishing composition production method disclosed herein can be preferably implemented in an embodiment using a water-soluble polymer H having an ester group as the alkaline-hydrolytic functional group. Examples of the ester group-containing water-soluble polymer H include homopolymers and copolymers of a vinyl carboxylate and a (meth)acrylic acid ester as well as modification products (e.g. saponification products) of these, and the like. Specific examples of the vinyl carboxylate include vinyl acetate, vinyl propionate, vinyl lactate, etc. Specific examples of the (meth)acrylic acid ester include methyl acrylate, 2-hydroxyethyl acrylate, methyl methacrylate, etc. Upon hydrolysis of such ester group-containing water-soluble polymers H, for example, polyvinyl carboxylate is converted to a polymer having a polyol main chain while poly(meth)acrylic acid ester is converted to a poly(meth)acrylic acid.

Other examples of the water-soluble polymer H include a poly(meth)acrylamide having an amide group as the alkaline-hydrolytic functional group, an alkoxysilyl group-containing polyalkoxysilane derivative, a polyacetal, etc. Upon hydrolysis, these are converted to polycarboxylic acid, polysilanol, polyaldehyde, etc., respectively.

The copolymer in this specification comprehensively refers to various types of copolymer such as random copolymer, alternating copolymer, block copolymer, graft copolymer, etc. The term "(meth)acrylic acid" comprehensively refers to acrylic acid and methacrylic acid while the term "(meth)acryloyl" comprehensively refers to acryl and methacryl.

In the art disclosed herein, a preferable example of the water-soluble polymer H comprises a vinyl carboxylate unit in its molecular structure. For instance, a preferable water-soluble polymer H includes a structural moiety equivalent to a structure resulting limn polymerization of the vinyl group in the vinyl carboxylate represented by the formula $RCOOCH=CH_2$. Herein, R is a primary organic group and preferably a hydrocarbon group having 1 to 6 carbon atoms. In particular, such a structural moiety is represented by the formula $-CH_2-CH(OCOR)-$. Typical examples of the vinyl carboxylate unit include vinyl acetate unit (structural moiety represented by the formula $-CH_2-CH(OCOCH_3)-$) resulting from polymerization of the vinyl group in vinyl acetate ($CH_3COOCH=CH_2$).

The water-soluble polymer H comprises a total of more than 2% by mole of one, two or more species of repeat unit (e.g. vinyl carboxylate unit) having a hydrolytic group, more preferably 5% by mole or greater (at a molar ratio of 5% or higher), or yet more preferably 10% by mole or greater. From the standpoint of obtaining greater application effect of the production method disclosed herein, a water-soluble polymer having a molar ratio of hydrolytic group-containing repeat unit of 15% or higher (or even 20% or higher) can be preferably used.

The upper limit of molar ratio of the hydrolytic group-containing repeat unit in the water-soluble polymer H is not particularly limited. From the standpoint of the water solubility of the water-soluble polymer H, it is typically 80% or lower, usually preferably 60% or lower, more preferably 50% or lower, or yet more preferably 40% or lower (e.g. 30% or lower).

A preferable example of the water-soluble polymer H is a saponification product of a vinyl acetate homopolymer or copolymer. A particularly preferable water-soluble polymer H is the saponification product of a vinyl acetate homopolymer. Such a water-soluble polymer H can be thought as a partially-saponified polyvinyl alcohol comprising vinyl acetate units ($-CH_2-CH(OCOCH_3)-$) and vinyl alcohol units ($-CH_2-CH(OH)-$) formed by saponification of the vinyl acetate units at a ratio (molar ratio) corresponding to the degree of saponification. Such a partially-saponified polyvinyl alcohol may have a degree of saponification of typically higher than 2% by mole, usually 5% by mole or higher, preferably 10% by mole or higher, or more preferably 15% by mole or higher (e.g. 20% by mole or higher). The degree of saponification of the partially-saponified polyvinyl alcohol is typically 80% by mole or lower, usually 60% by mole or lower, preferably 50% by mole or lower, or more preferably 40% by mole or lower (e.g. 30% by mole or lower).

The molecular weight of the water-soluble polymer is not particularly limited. For instance, a water-soluble polymer having a weight average molecular weight (Mw) of $200 \times 10^4$ or smaller (typically $1 \times 10^4$ to $200 \times 10^4$, e.g. $1 \times 10^4$ to $150 \times 10^4$) can be used. From the standpoint of better preventing formation of aggregates, the use of a water-soluble polymer having a Mw of smaller than $100 \times 10^4$ (more preferably $80 \times 10^4$ or smaller, yet more preferably $50 \times 10^4$ or smaller, typically $40 \times 10^4$ or smaller, e.g. $30 \times 10^4$ or smaller) is preferable. From the standpoint of the ease of filtering and washing the resulting polishing composition, etc., a water-soluble polymer having a Mw of $25 \times 10^4$ or smaller (typically $20 \times 10^4$ or smaller, more preferably $15 \times 10^4$ or smaller, typically $10 \times 10^4$ or smaller, e.g. $5 \times 10^4$ or smaller) can be preferably used. On the other hand, in general, with increasing Mw of water-soluble polymer, the haze reduction effect tends to increase. From such a standpoint, it is usually preferable to use a water-soluble polymer having a Mw of $1 \times 10^4$ or larger.

In the art disclosed herein, the relationship between the weight average molecular weight (Mw) and number average molecular weight (Mn) of the water-soluble polymer is not particularly limited. From the standpoint of preventing formation of aggregates, etc., for instance, a species having a molecular weight distribution (Mw/Mn) of 5.0 or less can be preferably used. From the standpoint of the performance stability of the polishing composition, the water-soluble polymer's Mw/Mn is preferably 4.0 or less, more preferably 3.5 or less, or yet more preferably 3.0 or less (e.g. 2.5 or less).

Theoretically, the Mw/Mn is 1.0 or greater. From the standpoint of the availability of starting materials and the ease of synthesis, in usual, a water-soluble polymer having an Mw/Mn of 1.05 or greater can be preferably used.

As the Mw and Mn of a water-soluble polymer, the values (aqueous, based on standard polyethylene oxide) based on aqueous gel permeation chromatography (GPC) can be used.

The water-soluble polymer is preferably nonionic. In other words, a water-soluble polymer H essentially free of anionic and cationic repeat units is preferable. Herein, being essentially free of anionic and cationic repeat units means that the molar ratio of these repeat units is lower than 0.02% (e.g. lower than 0.001%). According to the polishing composition that comprises a nonionic water-soluble polymer H that has repeat units A and B satisfying the aforementioned SP values while satisfying the average SP value, it is possible to obtain greater effect to reduce the haze value and the number of LPD in the polished surface. The water-soluble polymer H being nonionic is preferable also from the standpoint of reducing aggregates and increasing the washability, etc.

<3-2. Abrasive, Basic Compound, Water>

The abrasive, the basic compound and water usable in the polishing composition production method according to the first aspect disclosed herein are the same as in the polishing composition according to the first aspect disclosed herein. Thus, detailed descriptions are omitted.

<3-3. Production of Polishing Composition>

The polishing composition production method according to the first aspect disclosed herein is implemented, using an abrasive, a basic compound, a water-soluble polymer H and water as described earlier. The production method is characterized by comprising a step of obtaining an agent A comprising at least the basic compound, a step of obtaining an agent B comprising at least the water-soluble polymer H, and further comprising a step of mixing a first composition comprising at least the agent A and a second composition comprising at least the agent B to prepare a mixture that satisfies one or each of the following (A) and (B):

(A) comprising the abrasive, the basic compound, the water-soluble polymer and water; and having a concentration of the basic compound of 0.1 mol/L or lower.

(B) comprising the abrasive, the basic compound, the water-soluble polymer H and water; and having a concentration of the abrasive of lower than 3% by mass.

By applying the production method featuring the characteristics described above, a polishing composition produced by the art disclosed herein has excellent temporal stability of polishing performance despite of being a basic polishing composition. Accordingly, there are no particular limitations imposed on the time (storage time) from the preparation of the mixture that satisfies one or each of the (A) and (B) above to the actual use of a polishing composition comprising the mixture. This is preferable from the standpoint of the high flexibility of the polishing composition's storage process and use process (e.g. a process of polishing a polishing object with the polishing composition and a production process of a polished article involving the polishing). The time from the preparation of the mixture satisfying one or each of the (A) and (B) to the actual use of a polishing composition comprising the mixture can be, for instance, more than 12 hours, more than 24 hours, or even more than 48 hours (e.g. more than 48 hours up to three months). Needless to say, this does not hinder the use of the polishing composition in shorter time than the above. For instance, the time from production of the polishing composition to the actual use can be three hours or less, one hour or less, or even 30 minutes or less.

Typical embodiments of the polishing composition production method according to the first aspect disclosed herein is described with respect to an example of producing a polishing composition, using silica grains as the abrasive, ammonia as the basic compound and a partially-saponified polyvinyl alcohol (degree of saponification 73% by mole) as the water-soluble polymer H, but the embodiments and products of the present invention are not limited by these.

First Embodiment

In this embodiment, a polishing composition is produced, using a polishing composition preparation kit in which the following agents A and B are separately stored:

Agent A: an abrasive dispersion comprising an abrasive, a basic compound and water (a basic abrasive dispersion with 5 to 25% by mass abrasive content at a basic compound concentration of 0.0001 mol/L to 1 mol/L)

Agent B: an aqueous solution of a water-soluble polymer H (an aqueous polymer solution with 0.02 to 50% by mass polymer content at about pH 6)

Specifically, for instance, water is added to the agent A (abrasive dispersion C) to prepare a first composition that satisfies at least either the abrasive content being less than 3% by mass or the basic compound concentration being 0.1 mol/L or lower. Subsequently, the agent B is added to the first composition (dilute agent A in this embodiment) and mixed to obtain a polishing composition.

In this embodiment, after the agent B is added to the first composition and mixed, water may be further added as necessary to adjust the abrasive concentration of the polishing composition. Alternatively, after the agent B is added to the first composition and mixed, a basic compound may be further added as necessary to adjust the pH of the polishing composition.

According to this embodiment, while using a water-soluble polymer H, a basic polishing composition can be produced with excellent stability of polishing performance, by means of adding an aqueous water-soluble polymer H solution (agent B) to the first composition that satisfies at least either the abrasive content being less than 3% by mass or the basic compound concentration being 0.1 mol/L or lower.

One reason for acquisition of such an effect may have to do with the co-presence of the abrasive and the water-soluble polymer H in the abrasive dispersion having an abrasive concentration of lower than 3% by mass achieved simultaneously with or before (in this embodiment, simultaneously with) achieving the co-presence of the basic compound and the water-soluble polymer H. Another reason for acquisition of the effect may have to do with the co-presence of the basic compound and the water-soluble polymer H achieved simultaneously with or before (in this embodiment, simultaneously with) obtaining a basic compound concentration of 0.1 mol/L or lower.

Because the agent A (abrasive dispersion C) used in this embodiment is in a state where the abrasive and the basic compound are co-present, the abrasive has increased electrostatic repulsion due to the basic compound and thereby exhibits high dispersion stability. Thus, when mixed with the water-soluble polymer, local aggregation of the abrasive can be highly prevented.

The agent B used in this embodiment is prepared as an aqueous solution in which the water-soluble polymer H has been dissolved in water in advance. Accordingly, when mixed with the first composition, local aggregation of the abrasive can be highly prevented. This is preferable from the standpoint of increasing the ease of filtration of a polishing composition produced according to the present embodiment or reducing defects in the polished surface.

The agent A (abrasive dispersion C) in this embodiment is advantageous from the standpoint of the convenience and reduction of costs of production, distribution, storage, etc., because it is in a concentrated form (a form at a high abrasive concentration) when compared with a polishing composition to be produced. The abrasive content in the agent A in such a concentrated form can be, for instance, 50% by mass or less. From the standpoint of the stability (e.g. the abrasive's dispersion stability) and ease of filtration of a polishing composition produced with the agent A, in usual, the abrasive content is preferably 45% by mass or less, or more preferably 40% by mass or less. In a preferable embodiment, the abrasive content can be 30% by mass or less, or even 20% by mass or less (e.g. 15% by mass or less). From the standpoint of the convenience and reduction of costs of production, distribution, storage, etc., the abrasive content can be, for instance, 0.5% by mass or greater, preferably 1% by mass or greater, or more preferably 3% by mass or greater.

The basic compound content in the agent A is preferably 0.001% by mass or greater, more preferably 0.005% by mass or greater, or yet more preferably 0.01% by mass or greater. With increasing basic compound content, local aggregation tends to be inhibited to a greater extent when the agent A is diluted or mixed with the agent B. The basic compound content in the agent A is preferably 10% by mass or less, more preferably 5% by mass or less, or yet more preferably 3% by mass or less. With decreasing basic compound content, it becomes easier to adjust the basic compound content in the polishing composition.

The agent A has a pH of preferably 9 or higher, or more preferably 9.5 or higher. With increasing pH, local aggregation tends to be inhibited to a greater extent when the agent A is diluted or mixed with the agent B. In general, at a higher pH, the rate of hydrolysis of the water-soluble polymer H increases. Thus, it may be more meaningful to apply the production method disclosed herein. The agent A has a pH of preferably 12 or lower, more preferably 11.5 or lower, or yet more preferably 10.5 or lower. When the agent pH is set low, a smaller amount of the basic compound is required to prepare the agent A, whereby it becomes easier to adjust the basic compound content in the polishing composition. For instance, when the abrasive is silicon particles, the pH being not exceedingly high is advantageous also from the standpoint of inhibiting dissolution of the silica. The agent A's pH can be adjusted by the amount (concentration) of the basic compound added and so on.

The water-soluble polymer H content (concentration) in the agent B is preferably 0.02% by mass or greater, more preferably 0.05% by mass or greater, or yet more preferably 0.1% by mass or greater. With increasing water-soluble polymer H content, it becomes easier to adjust the water-soluble polymer H content in the polishing composition. The water-soluble polymer H content in the agent B is preferably 50% by mass or less, and can be, for instance, 20% by mass or less. With decreasing water-soluble polymer H content, local aggregation of the abrasive tends to be inhibited to a greater extent when the agent B is added to the first composition (in this embodiment, the diluted agent A).

From the standpoint of inhibiting hydrolysis of the water-soluble polymer H, the agent B is preferably formulated to a near-neutral pH in general. The agent B's pH is usually preferably 4 or higher, but lower than 9, or more preferably 5.5 to 7.5. The art disclosed herein can be implemented, for instance, in an embodiment wherein the agent B's pH is around 6 (e.g. 6±0.3). In a preferable embodiment, the agent B can be prepared in a composition essentially free of a basic compound (e.g. a composition consisting of a water-soluble polymer H and water).

In this embodiment, the agent A comprising the abrasive and basic compound is diluted to prepare the first composition and the agent B is then added to the first composition. The agent A can be diluted by a factor that yields at least either an abrasive concentration of lower than 3% by mass or a basic compound concentration of 0.1 mol/L or lower in the first composition. The dilution factor can be, for instance, about 2 to 200 by volume, or is usually suitably about 5 to 100. The dilution factor according to a preferable embodiment is 10 to 80. For instance, it is preferably diluted by a factor of 15 to 40.

Preferable abrasive concentrations in the first composition (diluted agent A) may also vary in accordance with the abrasive concentration of the polishing composition to be produced. In usual, the abrasive concentration is preferably 2% by mass or lower, or more preferably 1% by mass or lower (e.g. 0.7% by mass or lower). In a preferable embodiment, the abrasive concentration of the first composition can be about equal to or slightly higher than the abrasive concentration of the polishing composition to be produced. For instance, the concentration can be higher by 1 to 10% by mass than the abrasive concentration of the polishing composition being produced.

Preferable basic compound concentrations of the first composition (diluted agent A) may also vary depending on the basic compound concentration of the polishing composition being produced. Usually, it is preferably 0.1 mol/L or lower, more preferably 0.05 mol/L or lower, or yet more preferably 0.02 mol/L or lower. In a preferable embodiment, the basic compound concentration of the first composition can be about equal to or slightly higher than the basic compound concentration of the polishing composition being produced. For example, the concentration (mol/L) can be higher by about 1 to 10% than the basic compound concentration (mol/L) of the polishing composition being produced.

The agents A and B are preferably mixed in an embodiment where the agent B is added to the first composition (diluted agent A) as described earlier. According to such a mixing method, local aggregation of the abrasive can be prevented to a greater extent as compared with, for instance, a mixing method where the first composition is added to the agent B. When the abrasive is silica grains (e.g. colloidal silica grains), as described above, it is particularly meaningful to employ the mixing method where the agent B is added to the first composition.

The agent B is added to the first composition at a rate (supply rate) of preferably, to a liter (1 L) of the first composition, 500 mL of agent B per minute or lower, more preferably 100 mL/min or lower, or yet more preferably 50 mL/min or lower. By decreasing the supply rate, local aggregation of the abrasive can be inhibited to a greater extent.

For preparing the agents A and B, diluting the agent A to prepare the first composition, or adding the agent B to the first composition and mixing, etc., the apparatus used is not particularly limited. For instance, a known mixer can be used, such as a propeller mixer, ultrasonic disperser, homomixer and the like.

In a preferable embodiment, the agent B can be filtered before mixed with the first composition. The filtration method is not particularly limited. For instance, can be suitably employed natural filtration carried out at normal pressure or a known filtration method such as suction filtration, pressure filtration, centrifugal filtration, etc.

In this embodiment, until the agent B is added to the first composition (diluted agent A), the basic compound in the agent A and the water-soluble polymer H in the agent B are not allowed to be co-present. Thus, the time from the dilution of the agent A (i.e. from the preparation of the first composition) up to the addition of the agent B is not particularly limited. This is preferable from the standpoint of the high flexibility of the production process of the polishing composition. The time from the preparation of the first composition to the addition of the agent B can be, for instance, more than 12 hours, more than 24 hours, or even more than 48 hours (e.g. more than 48 hours up to three months). Needless to say, the agent B may be added to the first composition within a time period shorter than these. For instance, the time from the preparation of the first composition through the addition of the agent B can be three hours or less, one hour or less, or even 30 minutes or less.

In a modified example of the first embodiment, for instance, water is added to the agent B to prepare a second composition (diluted agent B), and the second composition is added to the agent A and mixed to prepare a mixture that satisfies one or each of the abrasive content being less than 3% by mass and the basic compound concentration being 0.1 mol/L or lower. Alternatively, the agents A and B are mixed with water for dilution at the same time to prepare a mixture that satisfies one or each of the abrasive content being less than 3% by mass and the basic compound concentration being 0.1 mol/L or lower. The kit according to the first embodiment may be formulated to comprise, as the agent A, an abrasive dispersion in a pre-diluted form (i.e. in a form that satisfies one or each of the abrasive content being less than 3% by mass and the basic compound concentration being 0.1 mol/L or lower) so that the agent B can be added to the agent A to prepare a polishing composition. A polishing composition with excellent performance stability can be produced according to these modification examples as well.

Second Embodiment

In this embodiment, a polishing composition is produced, using a polishing composition preparation kit in which the following agents A, B and C are stored separately:

Agent A: an aqueous solution of a basic composition (an aqueous solution at a basic composition concentration of 0.0001 mol/L to 1 mol/L)

Agent B: an aqueous solution of a water-soluble polymer H (an aqueous polymer solution at a polymer concentration of 0.02 to 50% by mass at about pH 6)

Agent C: a dispersion comprising an abrasive and water (an abrasive dispersion with 5 to 25% by mass abrasive content)

In particular, for instance, water is added to the agent C at a dilution to yield an abrasive content of less than 3% by mass. The agent B is added to the diluted agent C and mixed. Subsequently, the agent A is further added and mixed to obtain a polishing composition.

In this embodiment, first, to the abrasive dispersion (diluted agent C) with an abrasive content of less than 3% by mass but free of a basic compound, the aqueous water-soluble polymer H solution (agent B) is added. This brings about a state in which the abrasive and the water-soluble polymer H are co-present in the abrasive dispersion with less than 3% by mass abrasive content. Subsequently, by adding and mixing the agent A, while using the water-soluble polymer H, a basic polishing composition can be produced with excellent stability of polishing performance.

In this embodiment, until the agent A is added to the mixture of the diluted agent C and agent B, the basic compound in the agent A and the water-soluble polymer H in the agent H are not allowed to be co-present. Thus, the time from the preparation of the mixture of the diluted agent C and agent B up to the addition of the agent A is not particularly limited. This is preferable from the standpoint of the high flexibility of the production process of the polishing composition. The time from the preparation of the mixture of the diluted agent C and agent B to the addition of the agent A can be, for instance, more than 12 hours, more than 24 hours, or even more than 48 hours (e.g. more than 48 hours up to three months). Needless to say, the agent A may be added to the mixture within a time period shorter than these. For instance, the time from the preparation of the mixture of the diluted agent C and agent B to the addition of the agent A can be three hours or less, one hour or less, or even 30 minutes or less.

In a modified example of the second embodiment, for instance, some diluted agent B is added and mixed into the agent C to prepare a mixture where the abrasive and water-soluble polymer H are co-present at an abrasive concentration of lower than 3% by mass, and then the agent A is added to the mixture. According to the modified example, adding the diluted agent B to the agent C and mixing them bring about a state in which the abrasive and the water-soluble polymer H are co-present in the abrasive dispersion at an abrasive concentration of lower than 3% by mass. By adding the agent A to the mixture, while using the water-soluble polymer H, a basic polishing composition can be produced with excellent stability of polishing performance. Alternatively, after the agents B and C are mixed with water for dilution to prepare a mixture comprising the abrasive and water-soluble polymer H together at an abrasive concentration of lower than 3% by mass, the agent A may be added to the mixture.

In yet another modification example of the present embodiment, after the agents A and C are mixed with water for dilution to prepare a first composition having less than 3% by mass abrasive content, the agent B is added to the first composition and mixed to obtain a polishing composition. According to this modification example, the co-presence of the abrasive and the water-soluble polymer H in the abrasive dispersion below 3% by mass abrasive content is achieved simultaneously as the co-presence of the basic compound and the water-soluble polymer H. By this means, while using the water-soluble polymer H, a basic polishing composition can be produced with excellent stability of polishing performance.

In yet another modified example of the present embodiment, after the agents A and C are mixed with water for dilution to prepare a first composition at a basic compound concentration of 0.1 mol/L or lower, and the agent B is added to the first composition and mixed to obtain a polishing composition. According to this modification example, the co-presence of the basic compound and the water-soluble polymer H is achieved simultaneously as the state at a basic compound concentration of 0.1 mol/L or lower. By this means, while using the water-soluble polymer H, a basic polishing composition can be produced with excellent stability of polishing performance.

Third Embodiment

In this embodiment, a polishing composition is produced, using a polishing composition preparation kit in which the following agents A and B are stored separately:

Agent A: an aqueous solution of a basic composition (an aqueous solution at a basic composition concentration of 0.0001 mol/L to 1 mol/L)

Agent B: an aqueous dispersion comprising an abrasive and a water-soluble polymer H (polymer content 0.02 to 50% by mass, abrasive content 5 to 25% by mass at about pH 7).

In particular, for instance, water is added to the agent B at a dilution to yield an abrasive content of less than 3% by mass. The agent A is added to the diluted agent B and mixed.

In this embodiment, first, the aqueous dispersion (agent B) comprising the abrasive and water-soluble polymer H is diluted to an abrasive content of less than 3% by mass. This brings about a state in which the abrasive and the water-soluble polymer H are co-present in the abrasive dispersion with less than 3% by mass abrasive content. Subsequently, the aqueous basic compound solution (agent A) is added. Accordingly, the co-presence of the abrasive and the water-soluble polymer H in the abrasive dispersion below 3% by mass abrasive content can be achieved before achieving the co-presence of the basic compound and the water-soluble polymer H. By this means, while using the water-soluble polymer H, a basic polishing composition can be produced with excellent stability of polishing performance.

<3-4. Polishing Composition>

In typical, the polishing composition production method according to the first aspect disclosed herein can be preferably applied to production of a polishing composition (typically a slurry composition) having a non-volatile content (NV) of 5% by mass or less. More preferably, it is applied to production of a polishing composition having an NV of 0.05% by mass to 3% by mass (e.g. 0.05 to 2% by mass). The non-volatile content (NV) refers to the proportion of the mass of residue remaining after a polishing composition is allowed to dry at 105° C. for 24 hours in the polishing composition.

In typical, the method disclosed herein can be preferably applied to production of a polishing composition having an abrasive content of less than 3% by mass. A preferable target product is a polishing composition having an abrasive content of 0.05 to 2% by mass (more preferably 0.05 to 1% by mass).

The water-soluble polymer H content in the polishing composition produced by the method disclosed herein is not particularly limited. For instance, it can be $1\times10^{-4}$% by mass or greater. From the standpoint of haze reduction, etc., the polymer H content is preferably $5\times10^{-4}$% by mass or greater, or more preferably $1\times10^{-3}$% by mass or greater, for example, $2\times10^{-3}$% by mass or greater. From the standpoint of the polishing rate, etc., the polymer H content is preferably 0.5% by mass or less, or more preferably 0.2% by mass or less (e.g. 0.1% by mass or less).

The water-soluble polymer H content can be, but not particularly limited to, for instance, 0.01 part by mass or greater relative to 100 parts by mass of the abrasive. From the standpoint of increasing the smoothness of the polished surface (e.g. reducing the haze and defects), the water-soluble polymer H content to 100 parts by mass of the abrasive is suitably 0.05 part by mass or greater, preferably 0.1 part by mass or greater, or more preferably 0.5 part by mass or greater (e.g. 1 part by mass or greater). From the standpoint of the polishing rate, washability, etc., the water-soluble polymer H content to 100 parts by mass of the abrasive can be 40 parts by mass or less, or it is usually suitably 20 parts by mass or less, preferably 15 parts by mass or less, or more preferably 10 parts by mass or less.

The pH of the produced polishing composition is not particularly limited. From the standpoint of the great significance of application of the art disclosed herein, the pH is suitably 7.5 or higher, preferably 8.0 or higher, or more preferably 9.0 or higher (e.g. 9.5 or higher). From the standpoint of easy adjustment of the pH of a polishing liquid comprising the polishing composition, the polishing composition's pH is preferably 12.0 or lower, or more preferably 11.0 or lower. It is preferable to add the basic compound to yield such a pH of the polishing composition.

<3-5. Optional Components>

(Optional Polymers)

The polishing composition production method according to the first aspect disclosed herein can be also preferably applied to production of a polishing composition comprising, in addition to a water-soluble polymer H, another water-soluble polymer (i.e. a water-soluble polymer free of an alkaline-hydrolytic functional group, or an "optional polymer" hereinafter) as necessary. The type of optional polymer is not particularly limited. A suitable species can be selected among water-soluble polymers that are known in the field of polishing compositions, but do not belong to the water-soluble polymer H.

The optional polymer may have, in its molecule, at least one species of functional group selected among cationic groups, anionic groups and nonionic groups. The optional polymer may have, in its molecule, a hydroxyl group, carboxyl group, acyloxy group, sulfo group, amide structure, quaternary nitrogen structure, heterocyclic structure, vinyl structure, polyoxyalkylene structure, etc. From the standpoint of reducing aggregates or increasing the washability, etc., a nonionic polymer can be preferably used as the optional polymer.

Preferable examples of the optional polymer include an oxyalkylene unit-containing polymer, nitrogen atom-containing polymer, fully-saponified polyvinyl alcohol (typically a polyvinyl alcohol having a degree of saponification above 98% by mole), and the like.

As the oxyalkylene unit-containing polymer, can be used the same kinds as the oxyalkylene unit-containing polymer described as an example of the water-soluble polymer in the polishing composition according to the second aspect described above. Examples of the oxyalkylene unit-containing polymer include a polyethylene oxide (PEO), a block copolymer of ethylene oxide (EO) and propylene oxide (PO), a random copolymer of EO and PO, and the like. The block copolymer of EO and PO can be a diblock copolymer, triblock copolymer or the like comprising a polyethylene oxide (PEO) block and a polypropylene oxide (PPO) block Examples of the triblock copolymer include a PEO-PPO-PEO triblock copolymer and PPO-PEO-PPO triblock copolymer. Usually, a PEO-PPO-PEO triblock copolymer is more preferable.

In the block or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, can be used the same kinds as the nitrogen atom-containing polymer described as an example of the water-soluble polymer in the polishing composition according to the second aspect described above. As the nitrogen atom-containing polymer, it is possible to use either a polymer containing nitrogen atoms in its main chain or a polymer having a nitrogen atom in a side-chain functional group (pendant group). Examples of the polymer containing nitrogen atoms in its main chain include a homopolymer and copolymer of an N-acylalkyleneimine-based monomer. Specific examples of the N-acyl-alkyleneimine-based monomer include N-acetylethyleneimine, N-propionylethyleneimine, etc. Examples of the polymer having a nitrogen atom in a pendant group include a polymer comprising an N-(meth)acryloyl monomeric unit, a polymer comprising an N-vinyl monomeric unit, etc. The term "(meth)acryloyl" herein comprehensively refers to acryloyl and metharcyloyl. For example, a homopolymer and copolymer of N-(meth)acryloylmorpholine, homopolymer and copolymer of N-vinylpyrrolidone, and the like can be used.

Other examples of the optional polymer include cellulose derivatives such as hydroxyethyl cellulose, hydroxypropyl cellulose, hydroxyethyl methylcellulose, hydroxypropyl methylcellulose, methyl cellulose, ethyl cellulose, ethylhydroxyethyl cellulose, carboxymethyl cellulose, etc.; and pullulan.

The molecular weight and molecular weight distribution (Mw/Mn) of the optional polymer are not particularly limited. For instance, the preferable Mw and molecular weight distribution in the water-soluble polymer H described above can also be applied to preferable Mw and molecular weight distribution in the optional polymer.

The optional polymer is used in an amount of suitably 30% by mass or less, preferably 15% by mass or less, or more preferably 10% by mass or less (e.g. 5% by mass or less), of the total amount of water-soluble components (including the aforementioned water-soluble polymer H and optional polymers used as necessary) with Mw of $1\times10^4$ or larger. The method disclosed herein can be preferably applied to production of a polishing composition essentially fire of an optional polymer (e.g. a polishing composition wherein the optional polymer content in the total amount of the water-soluble components is less than 1% by mass or non-detectable).

When a cellulose derivative is used as an optional polymer, it is used in an amount preferably as low as or lower than 10% by mass of the total amount of water-soluble components with Mw of $1\times10^4$ or larger in the polishing composition, or more preferably 5% by mass or lower (typically 1% by mass or lower). This can bring about greater inhibition of contamination and aggregation due to the use of a naturally-derived cellulose derivative. The method disclosed herein can be preferably applied to production of, for instance, a polishing composition essentially free of a cellulose derivative (e.g. with less than 1% by mass or non-detectable cellulose derivative content in the total amount of the water-soluble components).

(Surfactant)

The polishing composition produced by the method disclosed herein can comprise a surfactant (typically a water-soluble organic compound with a molecular weight below $1\times10^4$) as necessary. As the surfactant, the same kinds as the surfactant in the polishing composition according to the first aspect described above can be used in a similar manner. For instance, as the surfactant, an anionic or nonionic species can be preferably used. From the standpoint of the low foaming characteristics and the ease of pH adjustment, a nonionic surfactant is more preferable. The molecular weight of the surfactant is typically smaller than $1\times10^4$. From the standpoint of the ease of filtration of the polishing composition and the washability of the polished article, etc., it is preferably 9500 or smaller. The surfactant's molecular weight is typically 200 or larger. From the standpoint of the haze reduction effect, etc., it is preferably 250 or larger, or more preferably 300 or larger (e.g. 500 or larger). As the surfactant's molecular weight, can be used the weight average molecular weight (Mw) (aqueous, based on standard polyethylene glycol) determined by GPC or the molecular weight determined from its chemical formula.

When a surfactant is used, its amount used is not particularly limited. In usual, from the standpoint of the washability, etc., the surfactant is used in an amount of suitably 20 parts by mass or less, preferably 15 parts by mass or less, or more preferably 10 parts by mass or less (e.g. 6 parts by mass or less) relative to 100 parts by mass of the abrasive in the polishing composition. From the standpoint of obtaining greater use effect of the surfactant, the amount of surfactant used to 100 parts by mass of the abrasive is suitably 0.001 part by mass or greater, preferably 0.005 part by mass or greater, or more preferably 0.01 part by mass or greater (e.g. 0.1 part by mass or greater). Alternatively, from the standpoint of simplifying the composition, essentially no surfactant may be used.

(Additives)

As far as the effects of the present invention are not significantly hindered, the polishing composition produced by the method disclosed herein may further comprise as necessary known additives, such as chelating agents, organic acids, organic acid salts, inorganic acids, inorganic acid salts, preservatives, antifungal agents, and so on, usable in polishing compositions (typically in polishing compositions used for final polishing of silicon wafers). These additives are as described for the polishing composition according to the first aspect above. Thus, detailed descriptions are omitted.

In the polishing composition production method according to the first aspect disclosed herein, the timing of adding these optional components is not particularly limited. For example, in the embodiments described above, they can be included in any of the agents A, B and C. Alternatively, an optional component may be further added (i.e., added afterwards) to the polishing composition produced by the method disclosed herein.

<3-6. Polishing Liquid>

The polishing composition produced by the method disclosed herein is supplied to a polishing object, typically in a polishing liquid form comprising the polishing composition, and used for polishing the polishing object. As the polishing liquid, the polishing composition can be used straight. Alternatively, the polishing composition may be further diluted to prepare a polishing liquid. In other words, the concept of polishing composition in the art disclosed herein encompasses both a polishing liquid (working slimy) supplied to a polishing object and used for polishing the polishing object and a concentrate (stock solution of polishing liquid) which is diluted for use as a polishing liquid. The degree of concentration of the concentrate relative to the polishing liquid is not particularly limited. For instance, it can be about 1.2-fold to 200-fold by volume, and is usually suitably about 1.5-fold to 100-fold (typically 1.5-fold to 50-fold, e.g. 2-fold to 40-fold). Other examples of the polishing liquid comprising the polishing composition produced by the method disclosed herein include a polishing liquid obtained by adjusting the pH of the polishing composition.

The abrasive content in the polishing liquid is not particularly limited. It is typically 0.01% by mass or greater, preferably 0.05% by mass or greater, or more preferably 0.1% by mass or greater. With increasing abrasive content, a higher polishing rate can be achieved. From the standpoint of easy application of the production method disclosed herein, the abrasive content in the polishing liquid is usually suitably less than 3% by mass, preferably 2% by mass or less, or more preferably 1% by mass or less.

The pH of the polishing liquid is not particularly limited. From the standpoint of the great significance of application of the art disclosed herein, the pH is suitably 7.5 or higher, preferably 8.0 or higher, or more preferably 9.0 or higher (e.g. 9.5 or higher). From the standpoint of the smoothness of the polished surface, the polishing liquid's pH is preferably 12.0 or lower, or more preferably 11.0 or lower. The basic compound is preferably included so as to yield such a pH of the polishing liquid. The pH can be preferably applied, for instance, to a polishing liquid used for polishing silicon wafers (e.g. polishing liquid for final polishing).

<3-7. Applications>

Applications of the polishing composition produced by the method disclosed herein are the same as the polishing composition according to the first aspect. Thus, detailed descriptions are omitted.

<3-8. Polishing>

Polishing of a polishing object can be carried out, for instance, as described below.

In particular, a polishing liquid (typically a slurry polishing liquid which may be called polishing slurry) is obtained, comprising a polishing composition produced by a method disclosed herein. The obtaining the polishing liquid may comprise subjecting the polishing composition to concentration adjustment (e.g. dilution), pH adjustment, etc., to prepare the polishing liquid. Alternatively, the polishing composition may be used straight as the polishing liquid.

Subsequently, the polishing liquid is supplied to a polishing object and polishing can be performed by a typical method. For instance, for final polishing of a silicon wafer, after a lapping step and a first polishing step, the silicon wafer is set in a general polishing machine, the polishing liquid is supplied via a polishing pad in the polishing machine to the surface (surface to be polished) of the silicon wafer. Typically, while the polishing liquid is continuously supplied, the polishing pad is pushed against the surface of the silicon wafer, and the two are moved (e.g. moved in circular motion) in coordination. Via such a polishing step, polishing of the polishing object is completed.

The polishing pad(s) used in the polishing step are not particularly limited. For instance, any of the non-woven fabric type, suede type, abrasive-bearing type, abrasive-free type, etc., can be used.

A polishing step as described above may be part of the production process of a polished article (e.g. a substrate such as a silicon wafer). Accordingly, this specification provides a method for producing a polished article (preferably a method for producing a silicon wafer) comprising the polishing step.

The polished article after the polishing step is typically cleaned. The cleaning can be carried out, using a suitable cleaning solution. The cleaning solution used is not particularly limited. Usable examples include SC-1 cleaning solution (a mixture of ammonium hydroxide ($NH_4OH$), hydrogen peroxide ($H_2O_2$) and water ($H_2O$); cleaning with SC-1 cleaning solution is referred to as "SC-1 cleaning" hereinafter), SC-2 cleaning solution (a mixture of HCl, $H_2O_2$ and $H_2O$) and the like generally used in the field of semiconductors. The temperature of the cleaning solution can be, for instance, room temperature to about 90° C. From the standpoint of increasing the cleaning efficiency, a cleaning solution at about 50° C. to 85° C. can be preferably used.

<<4. Polishing Composition Production Method According to Second Aspect>>

The polishing composition production method according to the second aspect disclosed herein is a method for producing a polishing composition, using an abrasive, a basic compound, a water-soluble polymer H having an alkaline-hydrolytic functional group, and water, with the method comprising a step of obtaining an agent A comprising at least the basic compound;

a step of obtaining an agent B comprising at least the water-soluble polymer H;

a step of mixing at least the agent A and the agent B to prepare a polishing composition stock solution having a concentration of the basic compound of higher than 0.02 mol/L; and a step of diluting the polishing composition stock solution to a concentration of the basic composition of 0.02 mol/L or lower within 24 hours after the agent A and the agent B are mixed.

Described in detail below is the polishing composition production method according to the second aspect.

<4-1. Water-Soluble Polymer H>

The polishing composition production method according to the second aspect disclosed herein is preferably applied to production of a polishing composition comprising a water-soluble polymer (water-soluble polymer H) having an alkaline-hydrolytic functional group (or a "hydrolytic group" hereinafter). The water-soluble polymer H in the polishing composition production method according to the second aspect is the same as the water-soluble polymer H in the polishing composition production method according to the first aspect described earlier. Thus, redundant descriptions are omitted.

<4-2. Abrasive, Basic Compound, Water>

The abrasive, the basic compound and water that can be used in the polishing composition production method according to the second aspect disclosed herein are the same as the abrasive, the basic compound and water that can be used in the polishing composition production method according to the first aspect described earlier. Thus, redundant descriptions are omitted.

<4-3. Production of Polishing Composition>

The polishing composition production method according to the second aspect disclosed herein can be implemented, using an abrasive, a basic compound, a water-soluble polymer H and water as described earlier. In the production method, an agent A comprising at least the basic compound and an agent B comprising the water-soluble polymer H are obtained; and at least the agent A and the agent B are mixed to prepare a polishing composition stock solution that satisfies one or each of the following conditions (A) and (B):

(A) having a concentration of the basic compound above 0.02 mol/L.

(B) having a concentration of the abrasive of 1% by mass or higher.

The polishing composition stock solution is diluted within 24 hours from its preparation. With respect to a polishing composition stock solution that satisfies the condition (A), the dilution is preferably carried out so as to yield a concentration of the basic compound of 0.02 mol/L or lower. With respect to a polishing composition stock solution that satisfies the condition (B), the dilution is preferably carried out so as to yield a concentration of the abrasive of lower than 1% by mass.

The polishing composition produced by the method disclosed herein shows excellent temporal stability of polishing performance despite of being basic. In the method, the time from the preparation of the polishing composition stock solution to the dilution of the stock solution is subject to certain limitations. On the other hand, no particular limitations are imposed on the time from obtaining the agents A and B to mixing them or the time (storage time) from the preparation of the polishing composition by diluting the polishing composition stock solution up to the use of the polishing composition. In other words, by restricting the time from the preparation of the polishing composition stock solution to the dilution of the stock solution to a basic compound concentration of 0.02 mol/L or lower or to an abrasive concentration of lower than 1% by mass, the flexibility of other processes related to the polishing composition production can be increased. In addition, since the polishing composition is prepared by first preparing the polishing composition stock solution having a basic compound concentration above 0.02 mol/L or an abrasive concentration of 1% by mass or higher followed by diluting the stock solution, it is highly convenient in the production, distribution, storage, etc., of the materials used for preparation of the stock solution, making it preferable also from the standpoint of reducing the production costs.

In the art disclosed herein, specifically, the time from the preparation of the polishing composition stock solution to the dilution of the stock solution is suitably 24 hours or less, preferably 20 hours or less, or more preferably 16 hours or less. With the time being 12 hours or less (e.g. 8 hours or less), greater effect can be obtained by applying the production method disclosed herein. The lower limit of the time is not particularly limited. For instance, the time from the preparation of the stock solution to the dilution can be 30 seconds or less. Although not particularly limited to, in a preferable embodiment, from the standpoint of taking advantage of the convenience of preparing the polishing composition stock solution first and then diluting the stock solution to prepare a polishing composition, the time from the preparation of the stock solution to the dilution can be set to about 1 hour to 10 hours (e.g. 2 hours to 8 hours).

In an embodiment of the preparation of the polishing composition satisfying the condition (A), the basic compound concentration of the stock solution is not particularly limited as long as it is higher than 0.02 mol/L. From the standpoint of the convenience and reduction of costs of production, distribution, storage, etc., of the polishing composition stock solution or materials used in its preparation, etc., the basic compound concentration in the stock solution is preferably 0.03 mol/L or higher, or more preferably 0.05 mol/L or higher. The upper limit of basic compound concentration in the stock solution is not particularly limited. For instance, it can be 0.4 mol/L or lower. To lower the rate of hydrolysis of the water-soluble polymer H, in usual, the basic compound concentration is suitably 0.3 mol/L or lower, or preferably 0.15 mol/L or lower.

The polishing composition stock solution satisfying the condition (A) is preferably diluted so that the resulting dilution has a basic compound concentration of 0.02 mol/L or lower. Preferable basic compound concentrations in the dilution may vary also in accordance with the basic compound concentration of the polishing composition to be produced. In usual, it is preferably 0.015 mol/L or lower, or more preferably 0.01 mol/L or lower. In a preferable embodiment, the basic compound concentration of the dilution can be about the same as the basic compound concentration of the polishing composition to be produced. Alternatively, for instance, the dilution may be prepared to have a slightly higher basic compound concentration (e.g. by about 1 to 10% by mass) than the polishing composition to be produced and after the stock solution is diluted within the prescribed time period to a basic compound concentration of 0.02 mol/L or lower, water may be further added at a certain timing to adjust the basic compound concentration.

In an embodiment of the preparation of the polishing composition stock solution satisfying the condition (B), the abrasive concentration in the stock solution is not particularly limited as long as it is 1% by mass or higher. From the standpoint of the convenience and reduction of costs of production, distribution, storage, etc., of the polishing composition stock solution or materials used in its preparation, etc., the abrasive concentration in the stock solution is preferably 2% by mass or higher, or more preferably 3% by mass or higher. The upper limit of abrasive concentration in the stock solution is not particularly limited. For instance, it can be 50% by mass or lower. From the standpoint of better preventing local aggregation of the abrasive, etc., in usual, the abrasive concentration is suitably 40% by mass or lower, preferably 30% by mass or lower, or more preferably 25% by mass or lower (e.g. 20% by mass or lower).

The polishing composition satisfying the condition (B) is preferably diluted so that the resulting dilution has an abrasive concentration of lower than 1% by mass. Preferable abrasive concentrations in the dilution may vary also in accordance with the abrasive concentration of the polishing composition to be produced. In usual, it is preferably 0.9% by mass or lower, or more preferably 0.8% by mass or lower (e.g. 0.7% by mass or lower). In a preferable embodiment, the abrasive concentration of the dilution can be about the same as the abrasive concentration of the polishing composition to be produced. Alternatively, for instance, the dilution may be prepared to have a slightly higher abrasive concentration (e.g. by about 1 to 10% by mass) than the polishing composition to be produced; and after the stock solution is diluted within the prescribed time period to an abrasive concentration of lower than 1% by mass, water may be further added at a certain timing to adjust the abrasive concentration.

The polishing composition stock solution can be diluted by a dilution factor of, for instance, suitably greater than 3 up to about 200, usually preferably about 5 to 100, or more preferably about 10 to 70 (e.g. about 15 to 50).

The basic compound content in the polishing composition stock solution is preferably 0.01% by mass or greater, or more preferably 0.03% by mass or greater. With increasing basic compound content, the dispersion stability of the abrasive tends to increase. The basic compound content in the stock solution is preferably 10% by mass or less, more preferably 5% by mass or less, or yet more preferably 3% by mass or less. With decreasing basic compound content, it becomes easier to adjust the basic compound content in the polishing composition.

The pH of the polishing composition stock solution is preferably 9 or higher, or more preferably 9.5 or higher. With increasing pH, the dispersion stability of the abrasive tends to increase. In general, at a higher pH, the rate of hydrolysis of the water-soluble polymer H increases. Thus, it may be more meaningful to apply the production method disclosed herein. The stock solution's pH is preferably 12 or lower, more preferably 11.5 or lower, or yet more preferably 10.5 or lower. When the stock solution's pH is set lower, it becomes easier to adjust the basic compound content in the polishing composition. For instance, when the abrasive is silica grains, it is also advantageous that the pH is not excessively high, from the standpoint of reducing dissolution of the silica.

The water-soluble polymer H content (concentration) in the polishing composition stock solution is preferably 0.02% by mass or greater, more preferably 0.05% by mass or greater, or yet more preferably 0.1% by mass or greater. With increasing water-soluble polymer H content, it becomes easier to adjust the water-soluble polymer H content in the polishing composition. The water-soluble polymer H content in the stock solution is preferably 20% by mass or less. For example, it can be 15% by mass or less. With decreasing water-soluble polymer H content, local aggregation of the abrasive tends to be inhibited to a greater extent.

Typical embodiments of the polishing composition production method according to the second aspect disclosed herein is described with respect to an example of producing a polishing composition, using silica grains as the abrasive, ammonia as the basic compound and a partially-saponified polyvinyl alcohol (degree of saponification 73% by mole) as the water-soluble polymer H, but the embodiments and products of the present invention are not limited by these.

First Embodiment

In this embodiment, a polishing composition is produced, using a polishing composition preparation kit in which the following agents A and B are separately stored:

Agent A: an abrasive dispersion comprising an abrasive, a basic compound and water (a basic abrasive dispersion with 3 to 25% by mass abrasive content at a basic compound concentration of 0.02 mol/L to 1 mol/L)

Agent B: an aqueous solution of a water-soluble polymer H (an aqueous polymer solution with 0.02 to 50% by mass polymer content at about pH 6)

Specifically, for instance, the agent B is added to the agent A and mixed to prepare a polishing composition stock solution that satisfies at least either the basic compound concentration being higher than 0.02 mol/L or the abrasive concentration being 1% by mass or higher. Within an aforementioned preferable time period from the preparation of the stock solution, by adding ultrapure water to the stock solution to a concentration that satisfies at least either the basic compound concentration being 0.02 mol/L or lower or the abrasive concentration being lower than 1% by mass, a polishing composition can be produced with excellent storage stability.

Because the agent A used in this embodiment is in a state where the abrasive and the basic compound are co-present, the abrasive has increased electrostatic repulsion due to the basic compound and thereby exhibits high dispersion stability. Thus, when mixed with the agent B, local aggregation of the abrasive can be highly prevented.

The agent B used in this embodiment is prepared as an aqueous solution in which the water-soluble polymer H has been dissolved in water in advance. Accordingly, when mixed with the agent A, local aggregation of the abrasive can be highly prevented. This is preferable from the standpoint of increasing the ease of filtration of a polishing composition produced according to the present embodiment or reducing defects in the polished surface.

The agents A and B used in this embodiment are in concentrated forms (wherein at least either the abrasive concentration or the basic compound concentration is higher) when compared with the polishing composition to be produced. Thus, it is advantageous from the standpoint of the convenience and reduction of costs of production, distribution, storage, etc.

The abrasive content in the agent A can be, for instance, 50% by mass or less. From the standpoint of preventing local aggregation of the abrasive to a greater extent, in usual, the abrasive concentration is suitably 40% by mass or lower, preferably 30% by mass or lower, or yet more preferably 25% by mass or lower (e.g. 20% by mass or lower). From the standpoint of the convenience and reduction of costs of production, distribution, storage, etc., the abrasive content in the agent A is, for instance, suitably greater than 2% by mass, or preferably greater than 3% by mass.

The basic compound content in the agent A is preferably 0.01% by mass or greater, more preferably 0.05% by mass or greater, or yet more preferably 0.1% by mass or greater. With increasing basic compound content, local aggregation tends to be inhibited to a greater extent when mixed with the agent B. The basic compound content in the agent A is preferably 10% by mass or less, more preferably 5% by mass or less, or yet more preferably 3% by mass or less. With decreasing basic compound content, it becomes easier to adjust the basic compound content in the polishing composition.

The agent A has a pH of preferably 9 or higher, or more preferably 9.5 or higher. With increasing pH, local aggregation tends to be inhibited to a greater extent when mixed with the agent B. In general, at a higher pH, the rate of hydrolysis of the water-soluble polymer H increases. Thus, it may be more meaningful to apply the production method disclosed herein. The agent A has a pH of preferably 12 or lower, more preferably 11.5 or lower, or yet more preferably 10.5 or lower. When the agent A's pH is set low, it becomes easier to adjust the basic compound content in the polishing composition. For instance, when the abrasive is silicon particles, the pH being not exceedingly high is advantageous also from the standpoint of inhibiting dissolution of the silica. The agent A's pH can be adjusted by the amount (concentration) of the basic compound added and so on.

The water-soluble polymer H content (concentration) in the agent B is preferably 0.02% by mass or greater, more preferably 0.05% by mass or greater, or yet more preferably 0.1% by mass or greater. With increasing water-soluble polymer H content, it becomes easier to adjust the water-soluble polymer H content in the polishing composition. The water-soluble polymer H content in the agent B is preferably 50% by mass or less, and can be, for instance, 20% by mass or less. With decreasing water-soluble polymer H content, local aggregation of the abrasive tends to be inhibited to a greater extent when the agent B is added to the diluted agent A.

From the standpoint of inhibiting hydrolysis of the water-soluble polymer H, the agent B is preferably formulated to a near-neutral pH in general. The agent B's pH is usually preferably 4 or higher, but lower than 9, or more preferably 5.5 to 7.5. The art disclosed herein can be implemented, for instance, in an embodiment wherein the agent B's pH is around 6 (e.g. 6±0.3). In a preferable embodiment, the agent B can be prepared in a composition essentially free of a basic compound (e.g. a composition consisting of a water-soluble polymer H and water).

The agents A and B are preferably mixed in an embodiment where the agent B is added to the agent A as described earlier. According to such a mixing method, local aggregation of the abrasive can be prevented to a greater extent as compared with, for instance, a mixing method where the agent A is added to the agent B. When the abrasive is silica grains (e.g. colloidal silica grains), as described above, it is particularly meaningful to employ the mixing method where the agent B is added to the agent A.

The agent B is added to the agent A at a rate (supply rate) of preferably, to a liter (1 L) of agent A, 500 mL of agent B per minute or lower, more preferably 100 mL/min or lower, or yet more preferably 50 mL/min or lower. By decreasing the supply rate, local aggregation of the abrasive can be inhibited to a greater extent.

For preparing the agents A and B, adding the agent A to the agent B and mixing, or diluting the polishing composition stock solution, etc., the apparatus used is not particularly limited. For instance, a known mixer can be used, such as a propeller mixer, ultrasonic disperser, homomixer and the like.

In a preferable embodiment, the agent B can be filtered before mixed with the agent A. The filtration method is not particularly limited. For instance, can be suitably employed natural filtration carried out at normal pressure or a known filtration method such as suction filtration, pressure filtration, centrifugal filtration, etc.

Second Embodiment

In this embodiment, a polishing composition is produced, using a polishing composition preparation kit in which the following agents A, B and C are stored separately:

Agent A: an aqueous solution of a basic composition (an aqueous solution at a basic composition concentration of 0.02 mol/L or higher)

Agent B: an aqueous solution of a water-soluble polymer H (an aqueous polymer solution at a polymer concentration of 0.02 to 50% by mass at about pH 6)

Agent C: a dispersion comprising an abrasive and water (an abrasive dispersion with 3 to 25% by mass abrasive content)

Specifically, for instance, the agents A and C are mixed to prepare a basic abrasive dispersion comprising the abrasive and basic compound. The agent B is added to the dispersion and mixed to prepare a polishing composition stock solution that satisfies at least either the basic compound concentration being higher than 0.02 mol/L or the abrasive concentration being 1% by mass or higher. A polishing composition with excellent storage stability can be produced by adding ultrapure water to the stock solution within an aforementioned preferable time period after the preparation of the stock solution to dilute it to a concentration that satisfies at least either the basic compound concentration being 0.02 mol/L or lower or the abrasive concentration being lower than 1% by mass.

<4-4. Polishing Composition>

In typical, the polishing composition production method disclosed herein can be preferably applied to production of a polishing composition (typically a slurry composition) having a non-volatile content (NV) of 2% by mass or less. More preferably, it is applied to production of a polishing composition having an NV of 0.05% by mass to 1% by mass (e.g. 0.05 to 0.8% by mass). The non-volatile content (NV) refers to the proportion of the mass of residue remaining after a polishing composition is allowed to dry at 105° C. for 24 hours in the polishing composition.

In typical, the method disclosed herein can be preferably applied to production of a polishing composition having an abrasive content of less than 1% by mass. A preferable target product is a polishing composition having an abrasive content of 0.05 to 0.9% by mass (more preferably 0.05 to 0.8% by mass).

The water-soluble polymer H content in the polishing composition produced by the method disclosed herein is not particularly limited. For instance, it can be $1 \times 10^{-4}$% by mass or greater. From the standpoint of haze reduction, etc., the polymer H content is preferably $5 \times 10^{-4}$% by mass or greater, or more preferably $1 \times 10^{-3}$% by mass or greater, for example, $2 \times 10^{-3}$% by mass or greater. From the standpoint of the polishing rate, etc., the polymer H content is preferably 0.5% by mass or less, or more preferably 0.2% by mass or less (e.g. 0.1% by mass or less).

The water-soluble polymer H content can be, but not particularly limited to, for instance, 0.01 part by mass or greater relative to 100 parts by mass of the abrasive. From the standpoint of increasing the smoothness of the polished surface (e.g. reducing the haze and defects), the water-soluble polymer H content to 100 parts by mass of the abrasive is suitably 0.05 part by mass or greater, preferably 0.1 part by mass or greater, or more preferably 0.5 part by mass or greater (e.g. 1 part by mass or greater). From the standpoint of the polishing rate, washability, etc., the water-soluble polymer H content to 100 parts by mass of the abrasive can be 40 parts by mass or less, or it is usually suitably 20 parts by mass or less, preferably 15 parts by mass or less, or more preferably 10 parts by mass or less.

The pH of the produced polishing composition is not particularly limited. From the standpoint of the great significance of application of the art disclosed herein, the pH is suitably 7.5 or higher, preferably 8.0 or higher, or more preferably 9.0 or higher (e.g. 9.5 or higher). From the standpoint of easy adjustment of the pH of a polishing liquid comprising the polishing composition, the polishing composition's pH is preferably 12.0 or lower, or more preferably 11.0 or lower. It is preferable to add the basic compound to yield such a pH of the polishing composition.

<4-5. Optional Components>
(Optional Polymers)

The art disclosed herein can be also preferably applied to production of a polishing composition comprising, in addition to a water-soluble polymer H, another water-soluble polymer having a Mw of $1 \times 10^4$ or larger (i.e. a water-soluble polymer free of an alkaline-hydrolytic functional group, or an "optional polymer" hereinafter) as necessary. The type of optional polymer is not particularly limited. A suitable species can be selected among water-soluble polymers that are known in the field of polishing compositions, but do not belong to the water-soluble polymer H.

The type, molecular weight and molecular weight distribution (Mw/Mn), usage, etc., of such an optional polymer are the same as in the polishing composition production method according to the first aspect described earlier. Thus, detailed descriptions are omitted.

(Surfactant)

The polishing composition produced by the method disclosed herein can comprise a surfactant (typically a water-soluble organic compound with a molecular weight below $1 \times 10^4$) as necessary. The type, specific examples, molecular weight, usage, etc., of surfactant are the same as the surfactant in the polishing composition according to the first aspect described above. Thus, detailed descriptions are omitted.

(Additives)

As far as the effects of the present invention are not significantly hindered, the polishing composition produced by the method disclosed herein may further comprise as necessary known additives, such as chelating agents, organic acids, organic acid salts, inorganic acids, inorganic acid salts, preservatives, antifungal agents, and so on, usable in polishing compositions (typically in polishing compositions used for final polishing of silicon wafers). These additives are as described for the polishing composition according to the first aspect above. Thus, detailed descriptions are omitted.

In the polishing composition production method disclosed herein, the timing of adding these optional components is not particularly limited. For example, in the embodiments described above, they can be included in any of the agents A, B and C. Alternatively, an optional component may be further added (i.e., added afterwards) to the polishing composition produced by the method disclosed herein.

<4-6. Polishing Liquid>

The polishing composition produced by the method disclosed herein is supplied to a polishing object, typically in a polishing liquid form comprising the polishing composition, and used for polishing the polishing object. As the polishing liquid, the polishing composition can be used straight. Alternatively, the polishing composition may be further diluted to prepare a polishing liquid. In other words, the concept of polishing composition in the art disclosed herein encompasses both a polishing liquid (working slurry) supplied to a polishing object and used for polishing the polishing object and a concentrate which is diluted for use as a polishing liquid. The degree of concentration of the concentrate relative to the polishing liquid is not particularly limited. For instance, it can be about 1.05-fold to 200-fold by volume, and is usually preferably about 1.2-fold to 100-fold, or more preferably about 1.5-fold to 70-fold. Other examples of the polishing liquid comprising the polishing composition produced by the method disclosed herein include a polishing liquid obtained by adjusting the pH of the polishing composition.

The abrasive content in the polishing liquid is not particularly limited. It is typically 0.01% by mass or greater, preferably 0.05% by mass or greater, or more preferably 0.1% by mass or greater. With increasing abrasive content, a higher polishing rate can be achieved. From the standpoint of easy application of the production method disclosed herein, the abrasive content in the polishing liquid is usually suitably less than 1% by mass, preferably 0.8% by mass or less, or more preferably 0.6% by mass or less.

The pH of the polishing liquid is not particularly limited. From the standpoint of the great significance of application of the art disclosed herein, the pH is suitably 7.5 or higher, preferably 8.0 or higher, or more preferably 9.0 or higher (e.g. 9.5 or higher). From the standpoint of the smoothness of the polished surface, the polishing liquid's pH is preferably 12.0 or lower, or more preferably 11.0 or lower. The basic compound is preferably included so as to yield such a pH of the polishing liquid. The pH can be preferably applied, for instance, to a polishing liquid used for polishing silicon wafers (e.g. polishing liquid for final polishing).

<4-7. Applications, Polishing and Cleaning>

Applications of the polishing composition produced by the polishing composition production method according to the second aspect disclosed herein, polishing with the polishing composition and cleaning the polished article in the polishing step are the same as the polishing composition produced by the polishing composition production method according to the first aspect described above. Thus, detailed descriptions are omitted.

As understood from the descriptions provided above and the working examples below, matters disclosed by this specification include the following:

(1) A method for producing a polishing composition, using water and a water-soluble polymer P that comprises, in its molecular structure, a repeat unit f having a hydrolytic functional group; the method characterized in that in the polishing composition produced, the ratio $m_f/m_T$ (herein, $m_f$ represents the number of moles of the repeat unit f, and $m_T$ represents the number of moles of all repeat units combined in the water-soluble polymer P) is maintained at or above 5%.

(2) A method for producing a polished article, with the method comprising a step of supplying the polishing composition produced by the method (1) above and polishing the polishing object, with the method characterized in that the water-soluble polymer P in the polishing composition supplied to the polishing object maintains the ratio $m_f/m_T$ of 5% or greater.

The repeat unit f may be a functional group that is hydrolytic under acidic or basic conditions. A typical example of such a functional group is ester group. Typical examples of the ester group-containing repeat unit f include homopolymers and copolymers of vinyl carboxylates and (meth)acrylic acid esters as well as modification products (e.g. saponification products) of these, and the like. The polishing composition may comprise, besides the water-soluble polymer P and water, any one, two or more among abrasives, basic compounds and acidic compounds as optional component(s).

The production method (1) can be implemented, for instance, by applying a production method disclosed herein (e.g. the first to third embodiments of the production method according to the first aspect, the first and second embodiments of the production method according to the second aspect, and production methods according to modification examples of these) although not limited to these.

As understood from the descriptions provided above and the working examples below, matters disclosed by this specification further include the following:

(3) A method for producing a polishing composition, using water and a water-soluble polymer Q that comprises a repeat unit h having a hydroxyl group, the method characterized in that in the polishing composition produced, the water-soluble polymer Q has a hydroxyl group content of 4 mmol/g or greater, but 21 mmol/g or less.

(4) A method for producing a polished article, the method comprising a step of supplying the polishing composition produced by the method (3) above and polishing the polishing object and the method characterized in that in the water-soluble polymer Q in the polishing composition supplied to the polishing object, the water-soluble polymer Q has a hydroxyl group content in a range of 4 mmol/g or greater, but 21 mmol/g or less.

Herein, the hydroxyl group content refers to the number of moles of hydroxyl groups contained in one gram of the polymer. The hydroxyl group content can be generally obtained by subjecting a sample solution comprising the polymer of interest to neutralization titration as specified in JIS K0070 to determine the hydroxyl value (mgKOH/g) and dividing the hydroxyl value by 56.1.

When the polymer of interest is, for instance, a polymer formed of vinyl carboxylate units and vinyl alcohol units such as a partially-saponified polyvinyl alcohol, the hydroxyl group content can also be determined as follows. Namely, potassium hydroxide (KOH) is added to the sample solution containing the polymer of interest and the resulting solution is heated to allow complete saponification; the amount of KOH consumed during this is determined by titration; from the results, the number of moles of vinyl carboxylate units and the number of moles of vinyl alcohol units are determined; and from their numbers of moles, the hydroxyl group content can be determined.

In measuring the hydroxyl group content, when a polymer contained in a polishing composition is measured, the polishing composition can be used as the sample solution. When the polishing composition comprises an abrasive, the abrasive is precipitated by centrifugation and the resulting supernatant can be used as the sample solution.

Several working examples relating to the present invention are described below although the present invention is not to be limited to such working examples. In the description below, "parts" and "%" are based on mass unless otherwise specified.

Experiment 1

Preparation of Polishing Compositions

Example A1

An abrasive, a water-soluble polymer HA and aqueous ammonia (29% concentration) and ultrapure water were mixed to prepare a polishing composition concentrate. Within one hour from the mixing, the concentrate was diluted by a factor of 20 (by volume) with ultrapure water to prepare a polishing composition containing 0.5% abrasive, 0.010% ammonia ($NH_3$) and 0.018% water-soluble polymer HA with the rest being water. The polishing composition had a pH of 10.2.

As the abrasive, was used a colloidal silica of 35 nm average primary particle diameter and 66 nm average secondary particle diameter. The average primary particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd. (the same applies to the examples below).

As the water-soluble polymer HA, was used a polyvinyl alcohol having a degree of saponification of 73% by mole and a weight average molecular weight (Mw) of $2.8 \times 10^4$. The molar ratio of vinyl alcohol units (SP value 18.5) in the water-soluble polymer HA, namely the ratio of number of moles of vinyl alcohol units to number of moles of all repeat units, is 73%. The molar ratio of vinyl acetate units (SP value 11.1) in the water-soluble polymer HA is 27%. The water-soluble polymer HA's average SP value is 15.1, determined from the SP values and volume fractions of the respective repeat units.

Example A2

In this example, as the abrasive, was used a colloidal silica of 25 nm average primary particle diameter and 46 nm average secondary particle diameter. With ultrapure water, were mixed the abrasive and ammonia water (29% concentration) to prepare a polishing composition concentrate. Within one hour after the mixing, the concentrate was diluted by a factor of 20 (by volume) with ultrapure water to prepare a polishing composition having 0.2% abrasive, 0.005% ammonia and 0.010% water-soluble polymer HA with the rest being water. The polishing liquid had a pH of 10.1.

The concentrations of water-soluble polymer HA and ammonia in the polishing composition of this example were adjusted so that the water-soluble polymer and ammonia contents relative to the surface area of the abrasive in the unit volume of the polishing liquid were approximately equal to those in the polishing liquid of Example A1.

Example A3

In this example, in place of water-soluble polymer HA in Example A1, was used a polyvinyl alcohol (water-soluble polymer HB) with a degree of saponification of 78% by mole and a Mw of $2.7 \times 10^4$. Otherwise, in the same manner as Example A1, a polishing composition according to this example was prepared.

The molar ratio of vinyl alcohol units (SP value 18.5) in the water-soluble polymer HB is 78%. The molar ratio of vinyl acetate units (SP value 11.1) in the water-soluble polymer HB is 22%. The water-soluble polymer HB's average SP value is 15.6, determined from the SP values and volume fractions of the respective repeat units.

Example A4

In this example, in place of water-soluble polymer HA in Example A1, was used a polyvinyl alcohol with a Mw of $2.8 \times 10^4$ (containing 80% by mole vinyl alcohol units and 20% by mole vinyl hexanoate units; "water-soluble polymer HT" hereinafter). Otherwise, in the same manner as Example A1, a polishing composition according to this example was prepared.

Example A5

In this example, in place of water-soluble polymer HA in Example A1, was used a polyvinyl alcohol with a Mw of $0.3 \times 10^4$ (containing 80% by mole vinyl alcohol units and 20% by mole vinyl hexanoate units; "water-soluble polymer HK" hereinafter). The water-soluble polymer HK concentration of the polishing composition was 0.003%. Otherwise, in the same manner as Example A1, a polishing composition according to this example was prepared.

Comparative Example A1

In this example, in place of water-soluble polymer HA in Example A1, was used a fully-saponified polyvinyl alcohol (polyvinyl alcohol with a degree of saponification of 98% by mole and a Mw of $2.2 \times 10^4$; water-soluble polymer HC, hereinafter). Otherwise, in the same manner as Example A1, a polishing composition according to this example was prepared.

The molar ratio of vinyl alcohol units (SP value 18.5) in the water-soluble polymer HC is 98%. The molar ratio of vinyl acetate units (SP value 11.1) in the water-soluble polymer HC is 2%. The water-soluble polymer HC's average SP value is 18.2, determined from the SP values and volume fractions of the respective repeat units.

Comparative Example A2

In this example, in place of water-soluble polymer HA in Example A1, was used an acrylamide/acrylic acid random copolymer (water-soluble polymer HD). Otherwise, in the same manner as Example A1, a polishing composition according to this example was prepared.

The water-soluble polymer HD is a copolymer with a Mw of $20 \times 10^4$, comprising an acrylic acid-derived repeat unit (SP value 20.2) and an acrylamide-derived repeat unit (SP value 14.5) at a molar ratio of 40:60. The water-soluble polymer HD's average SP value is 16.5, determined from the SP values and volume fractions of the respective repeat units.

Comparative Example A3

In this example, in place of water-soluble polymer HA in Example A1, was used an ethylene oxide/propylene oxide random copolymer (water-soluble polymer HE). Otherwise, in the same manner as Example A1, a polishing composition according to this example was prepared.

The water-soluble polymer HE is a copolymer with a Mw of $10\times10^4$, comprising an ethylene oxide-derived repeat unit (SP value 9.4) and a propylene oxide-derived repeat unit (SP value 9.0) at a molar ratio of 92:8. The water-soluble polymer HE's average SP value is 9.4, determined from the SP values and volume fractions of the respective repeat units.

Comparative Example A4

In this example, in place of water-soluble polymer HA in Example A1, was used a poly(N-vinylpyrrolidone) with a Mw of $6\times10^4$ (water-soluble polymer HF). Otherwise, in the same manner as Example A1, a polishing composition according to this example was prepared.

The water-soluble polymer HF is a homopolymer of N-vinylpyrrolidone (SP value 11.0). The water-soluble polymer HF's average SP value is thus 11.0.

Comparative Example A5

In this example, in place of water-soluble polymer HA in Example A1, was used a hydroxyethyl cellulose with a Mw of $25\times10^4$ (water-soluble polymer HG, SP value 18.3). Otherwise, in the same manner as Example A1, a polishing composition according to this example was prepared.

<Silicon Wafer Polishing>

Using the polishing compositions according to the respective examples as they were as polishing liquids, silicon wafer surfaces were polished under the conditions shown below. The silicon wafers used had 300 mm diameter, p-type conductivity, crystal orientation of <100> and a resistivity of 0.1 Ω·cm or greater, but less than 100 Ω·cm, and were preliminarily polished with a polishing slurry (trade name "GLANZOX 2100" available from Fujimi, Inc.) to a surface roughness of 0.1 nm to 10 nm for the use. The time from the preparation of the polishing composition to the start of polishing was about one hour.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out.

(The Conditions Below were Common Between the Two Tables)
Polishing pressure: 15 kPa
Plate rotational speed: 30 rpm
Head rotational speed: 30 rpm
Polishing time: 2 min
Temperature of polishing liquid: 20° C.
Flow rate of polishing liquid: 2.0 L/min (drain)

<Cleaning>

Polished silicon wafers were cleaned (SC-1 cleaned) with a cleaning solution at $NH_4OH$ (29%)/$H_2O_2$ (31%)/deionized water (DIW)=1/3/30 (volume ratio). More specifically, two cleaning baths each equipped with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Assessment of the Number of Micro Particles (LPD)>

Using a wafer inspection system under trade name "SURFSCAN SP2" available from KLA-Tencor Corporation, the number of 37 nm or larger particles (number of LPD) present on each cleaned silicon wafer of 300 mm diameter was counted.

<Haze Measurement>

The surface of each cleaned silicon wafer was measured for haze (ppm) in DWO mode, using a wafer inspection system under trade name "SURFSCAN SP2" available from KLA-Tencor Corporation.

The results of the LPD count and haze measurement are converted to relative values and shown in Table 3, with 100% being the number of LPD and haze value of Comparative Example A5 using solely the hydroxyethyl cellulose (HEC) as the water-soluble polymer. Table 3 also shows the compositions of the water-soluble polymers used in the respective examples. With respect to Examples A1 to A5 and Comparative Examples A1 to A3, between the two repeat unit species in each water-soluble polymer used, the species having a larger SP value is shown as the first repeat unit and the other species with a smaller SP value is shown as the second repeat unit. In the column for the LPD count, "n/m" (not measured) indicates that the defect analysis with the wafer inspection system resulted in data overload, that is, the number of LPD exceeded the upper measurement limit

TABLE 3

| | Water-soluble polymer | | | | | | | | |
|---|---|---|---|---|---|---|---|---|---|
| | First repeat unit | | | Second repeat unit | | | Average | | Properties |
| | Species | SP value | Molar ratio (%) | Species | SP value | Molar ratio (%) | SP value | Mw (×10⁴) | Haze (%) / LPD (%) |
| Ex. A1 | Vinyl alcohol unit | 18.5 | 73 | Vinyl acetate unit | 11.1 | 27 | 15.1 | 2.8 | 80 / 80 |
| Ex. A2 | Vinyl alcohol unit | 18.5 | 73 | Vinyl acetate unit | 11.1 | 27 | 15.1 | 2.8 | 70 / 80 |
| Ex. A3 | Vinyl alcohol unit | 18.5 | 78 | Vinyl acetate unit | 11.1 | 22 | 15.6 | 2.7 | 85 / 85 |
| Ex. A4 | Vinyl alcohol unit | 18.5 | 80 | Vinyl hexanoate unit | 9.0 | 20 | 13.0 | 2.8 | 90 / 80 |
| Ex. A5 | Vinyl alcohol unit | 18.5 | 80 | Vinyl hexanoate unit | 9.0 | 20 | 13.0 | 0.3 | 80 / 80 |
| Comp. Ex. A1 | Vinyl alcohol unit | 18.5 | 98 | Vinyl acetate unit | 11.1 | 2 | 18.2 | 2.2 | 225 / 200 |
| Comp. Ex. A2 | Acrylic acid unit | 20.2 | 40 | Acrylamide unit | 14.5 | 60 | 16.5 | 20 | 500 / n/m |
| Comp. Ex. A3 | Ethylene oxide unit | 9.4 | 92 | Propylene oxide unit | 9.0 | 8 | 9.4 | 10 | 150 / 300 |

TABLE 3-continued

| | Water-soluble polymer | | | | | | | Properties | |
|---|---|---|---|---|---|---|---|---|---|
| | First repeat unit | | | Second repeat unit | | | | | |
| | Species | SP value | Molar ratio (%) | Species | SP value | Molar ratio (%) | Average SP value | Average Mw (×10$^4$) | Haze (%) | LPD (%) |
| Comp. Ex. A4 | Poly(N-vinylpyrrolidone) | | | | | | 11.0 | 6 | 400 | n/m |
| Comp. Ex. A5 | Hydroxyethyl cellulose | | | | | | 18.3 | 25 | 100 | 100 |

As shown in Table 3, the polishing liquids of Examples A1 to A5—each using a water-soluble polymer that comprised a repeat unit A having an SP value of 14.5 or higher and a repeat unit B having an SP value of lower than 14.5 with an average SP value of 17.5 or lower—showed marked improvement in both the haze value and the LPD count as compared with Comparative Example A5 using HEC as the water-soluble polymer On the contrary, Comparative Example A1—using a water-soluble polymer that was formed of the same repeat unit species as in Examples A1 to A5, but had too high an average SP value—fell short of Examples A1 to A5 in terms of both the haze value and the LPD count. Comparative Examples A2, A3 and A4—the first using a water-soluble polymer that had an average SP value of 17.5 or lower, but comprised no repeat unit B with an SP value below 14.5 and the latter two using a water-soluble polymer that had an average SP value of 17.5 or lower, but comprised no repeat unit A with an SP value at or above 14.5—also fell short of Examples A1 to A5 in terms of both the haze value and the LPD count.

Experiment 2

Preparation of Polishing Compositions

Example B1

To a basic abrasive dispersion with approximately 0.46% NV formed of an abrasive, ammonia and ultrapure water, was added and mixed an aqueous polymer solution containing 1.5% by mass of water-soluble polymer P1 to prepare a polishing composition having 0.46% abrasive, 0.010% ammonia (NH$_3$) and 0.018% water-soluble polymer HA with the rest being water. The polishing composition had a pH of 10.2.

As the abrasive, was used a colloidal silica of 35 nm average primary particle diameter and 66 nm average secondary particle diameter. The average primary particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd. (the same applies to the examples below).

As the water-soluble polymer P1, was used a polyvinyl alcohol having a degree of saponification of 73% and a weight average molecular weight (Mw) of 2.8×10$^4$. The water-soluble polymer P1 is a copolymer comprising 73% by mole of polyvinyl alcohol units and 27% of vinyl acetate units.

Example B2

In this example, as the abrasive, was used a colloidal silica of 25 nm average primary particle diameter and 46 nm average secondary particle diameter. To a basic abrasive dispersion with approximately 0.18% NV formed of the abrasive, ammonia and ultrapure water, was added and mixed an aqueous polymer solution containing 1.5% by mass of water-soluble polymer P1 to prepare a polishing composition having 0.18% abrasive, 0.005% ammonia and 0.010% water-soluble polymer HA with the reset being water. The polishing liquid had a pH of 10.1.

The concentrations of water-soluble polymer P1 and ammonia in the polishing composition of this example were adjusted so that the water-soluble polymer and ammonia contents relative to the surface area of the abrasive in the unit volume of the polishing liquid were approximately equal to those in the polishing liquid of Example B1.

Example B3

In this example, in place of water-soluble polymer P1 in Example B1, was used a polyvinyl alcohol (water-soluble polymer P2) having a degree of saponification of 79% by mole and a Mw of 2.7×10$^4$. Otherwise, in the same manner as Example B1, a polishing composition according to this example was prepared.

Example B4

In this example, in place of water-soluble polymer P1 in Example B1, was used a polyvinyl alcohol (water-soluble polymer P3) comprising 80% by mole of polyvinyl alcohol units and 20% by mole of vinyl hexanoate units and having a Mw of 2.8×10$^4$. Otherwise, in the same manner as Example B1, a polishing composition according to this example was prepared.

Example B5

In this example, in place of water-soluble polymer P1 in Example B1, was used a polyvinyl alcohol (water-soluble polymer P4) comprising 80% by mole of polyvinyl alcohol units and 20% by mole of vinyl hexanoate units and having a Mw of 0.3×10$^4$. The water-soluble polymer P4 concentration in the polishing composition was 0.003%. Otherwise, in the same manner as Example B1, a polishing composition according to this example was prepared.

Comparative Example B1

In this example, in place of water-soluble polymer P1 in Example B1, was used a fully-saponified polyvinyl alcohol (polyvinyl alcohol having a degree of saponification 98% by mole and a Mw of $2.2 \times 10^4$, water-soluble polymer P5, hereinafter). Otherwise, in the same manner as Example B1, a polishing composition according to this example was prepared.

Comparative Example B2

In this example, in place of water-soluble polymer P1 in Example B1, was used a poly(N-vinylpyrrolidone) (water-soluble polymer P6) having a Mw of $6.0 \times 10^4$. Otherwise, in the same manner as Example B1, a polishing composition according to this example was prepared.

Comparative Example B3

In this example, in place of water-soluble polymer P1 in Example B1, was used a hydroxyethyl cellulose (water-soluble polymer P7) having a Mw of $25 \times 10^4$. Otherwise, in the same manner as Example B1, a polishing composition according to this example was prepared.

Comparative Example B4

In this example, in place of water-soluble polymer P1 in Example B1, was used a graft copolymer (water-soluble polymer P8) obtained by grafting polyvinyl alcohol with poly(N-vinylpyrrolidone). The graft copolymer has an overall Mw of $17.5 \times 10^4$. The polyvinyl alcohol chain in a single molecule of the graft copolymer has a Mw of $7.5 \times 10^4$. The poly(N-pyrrolidone) chains has a combined Mw of $10 \times 10^4$. The polyvinyl alcohol chain had a degree of saponification of 98% by mole or greater. Otherwise, in the same manner as Example B1, a polishing composition according to this example was prepared.

<Etching Rate Measurement>

With ultrapure water, were mixed an aqueous polymer solution comprising 1.5% by mass of water-soluble polymer P1 used in Examples B1 and B2 and ammonia water (29%) to prepare an etching rate measuring reagent LE containing 0.18% water-soluble polymer P1 and 13% ammonia with the rest being water.

A 6 cm long by 3 cm wide by 775 μm thick rectangular silicon substrate (conductivity: p-type, crystal orientation: <100>) was obtained and immersed in an aqueous hydrogen fluoride (3%) solution for one minute to remove the natural oxide film from the surface. Subsequently, the silicon substrate was measured for its mass W0.

The silicon substrate was immersed in the reagent LE at room temperature (25° C.) for 12 hours, then removed from the reagent LE, and immersed in a cleaning solution containing $NH_3(29\%)/H_2O_2(31\%)$/ultrapure water at 1/1/8 (volume ratio) at room temperature (25° C.) for 10 seconds. The silicon substrate removed from the cleaning solution was washed with water and measured for its mass W1. From the difference between W0 and W1, the specific gravity (233 g/cm$^3$) and surface area (18 cm$^2$) of the silicon substrate, the etching rate was found to be 0.8 nm/min.

With respect to the water-soluble polymers P2 to P8 used in the other Examples and Comparative Examples, the etching rates were measured in the same manner. The obtained results are shown in Table 4, corresponding to the Examples and Comparative Examples using the respective water-soluble polymers.

<Abrasive Adsorption Measurement>

The polishing composition according to Example B1 was centrifuged at a rotational speed of 20000 rpm for 30 minutes, using a centrifuge under model name "AVANTI HP-301" available from Beckman Coulter, Inc. The centrifuged supernatant was collected and subjected to measurement of total organic carbon (TOC), using a TOC analyzer (combustion catalytic oxidation method, model name "TOC-5000A") available from Shimadzu Corporation. The measurement result was converted based on the volume of the supernatant to the total amount of organic carbon C1 (the total amount of organic carbon of the water-soluble polymer contained as free polymer in the supernatant). The time from the preparation of the polishing composition to the start of centrifugation was approximately one hour.

A test solution L0 was prepared, having the same composition as that of the polishing composition but without the abrasive. In particular, the test solution L0 was prepared to have 0.010% ammonia ($NH_3$) and 0.018% water-soluble polymer P1 with the rest being water. The test solution L0 was measured for TOC with the TOC analyzer and converted to the volume-based value to determine the total amount of organic carbon C0 in the test solution L0.

From the C0 and C1, based on the following equation:

$$\text{Abrasive adsorption (\%)} = [(C0-C1)/C0] \times 100$$

the abrasive adsorption was found to be almost 0%.

The polishing compositions according to Examples B2 to B5 and Comparative Examples B1 to B4 were also measured for their abrasive adsorption in the same manner. The obtained results are shown in Table 4.

<Silicon Wafer Polishing>

Using the polishing compositions according to the respective examples as they were as polishing liquids, silicon wafer surfaces were polished under the conditions shown below. The silicon wafers used had 300 mm diameter, p-type conductivity, crystal orientation of <100> and a resistivity of 0.1 Ω·cm or greater, but less than 100 Ω·cm, and were preliminarily polished with a polishing slurry (trade name "GLANZOX 2100" available from Fujimi, Inc.) to a surface roughness of 0.1 nm to 10 nm for the use. The time from the preparation of the polishing composition to the start of polishing was about one hour.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The Conditions Below were Common Between the Two Tables)

Polishing pressure: 15 kPa
Plate rotational speed: 30 rpm
Head rotational speed: 30 rpm
Polishing time: 2 min
Temperature of polishing liquid: 20° C.
Flow rate of polishing liquid: 2.0 L/min (drain)

<Cleaning>

Polished silicon wafers were cleaned (SC-1 cleaned) with a cleaning solution at $NH_4OH$ (29%)/$H_2O_2$ (31%)/deionized water (DIW)=1/3/30 (volume ratio). More specifically, two cleaning baths each equipped with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Counting of the Number of Micro Particles (LPD)>

Using a wafer inspection system under trade name "SURFSCAN SP2" available from KLA-Tencor Corporation, the number of 37 nm or larger particles (number of LPD) present on each cleaned silicon wafer of 300 mm diameter was counted.

<Haze Measurement>

The surface of each cleaned silicon wafer was measured for haze (ppm) in DWO mode, using a wafer inspection system under trade name "SURFSCAN SP2" available from KLA-Tencor Corporation.

The results of the LPD count and haze measurement are converted to relative values and shown in Table 4, with 100% being the number of LPD and haze value of Comparative Example B1 using solely the fully-saponified polyvinyl alcohol (PVA) as the water-soluble polymer. In the column for the LPD count of Table 4, "n/m" (not measured) indicates that the defect analysis with the wafer inspection system resulted in data overload, that is, the number of LPD exceeded the upper measurement limit.

<Evaluation of Ease of Filtration>

The polishing liquid according to each example was filtered by suction at a temperature of 25° C. at a filter differential pressure of 50 kPa. As the filter, was used a disc filter under trade name "ULTIPOR® N66" (47 mm diameter, rated filter resolution of 0.2 µm). From the volume of the polishing composition that passed through the filter until the flow of the polishing composition passing through the filter stopped, the ease of filtration was evaluated in the two grades below. The obtained results are shown in the column headed "Ease of Filtration" in Table 4.

A: The volume of the polishing composition that passed through the filter was 25 mL or greater.

C: The volume of the polishing composition that passed through the filter was less than 25 mL.

On the contrary, according to the polishing liquids of Examples B1 to B5—satisfying both the abrasive adsorption being 20% or lower and the etching rate being 2.0 nm/min or lower, while the filtration was as easy as Comparative Example B1, the haze value and the LPD count were significantly lower in comparison to Comparative Example B1. According to the polishing compositions of Examples B1 to B5, the haze value and the LPD count were further reduced even in comparison to Comparative Example B3.

On the other hand, the polishing liquid of Comparative Example B2—which showed a low etching rate, but a high abrasive adsorption—was poorly effective in both haze reduction and LPD count reduction. An explanation to this could be that the excessively high abrasive adsorption brought about shortage of free polymer, resulting in insufficient surface protection effect. Comparative Example B3 and Comparative Example B4 having an abrasive adsorption similar to the first were both inferior to Examples B1 to B5 in both the haze value reduction effect and LPD count reduction effect Experiment 3

Preparation of Polishing Compositions

Example C1

Were obtained a basic abrasive dispersion (agent A) formed of 12% abrasive and 0.26% (0.16 mol/L) ammonia with the reset being water and an aqueous polymer solution (agent B) comprising 1.5% of a water-soluble polymer.

As the abrasive, was used a colloidal silica (abrasive GA) of 35 nm average primary particle diameter and 66 nm average secondary particle diameter. The average primary

TABLE 4

|  | Water-soluble polymer | Abrasive adsorption (%) | Etching rate (nm/min) | Average primary particle diameter (nm) | Haze (%) | LPD (%) | Ease of filtration |
|---|---|---|---|---|---|---|---|
| Ex. B1 | P1 | 0 | 0.8 | 35 | 36 | 40 | A |
| Ex. B2 | P1 | 0 | 0.8 | 25 | 31 | 40 | A |
| Ex. B3 | P2 | 0 | 0.9 | 35 | 38 | 43 | A |
| Ex. B4 | P3 | 0 | 0.8 | 35 | 40 | 40 | A |
| Ex. B5 | P4 | 0 | 0.8 | 35 | 36 | 40 | A |
| Comp. Ex. B1 | P5 | 0 | 2.8 | 35 | 100 | 100 | A |
| Comp. Ex. B2 | P6 | 90 | 1.0 | 35 | 178 | n/m | A |
| Comp. Ex. B3 | P7 | 51 | 3.4 | 35 | 44 | 50 | C |
| Comp. Ex. B4 | P8 | 51 | 2.0 | 35 | 67 | 65 | C |

P1: Vinyl alcohol(73 mol. %)-Vinyl acetate(27 mol. %) copolymer; Mw 2.8 × 10$^4$
P2: Vinyl alcohol(79 mol. %)-Vinyl acetate(21 mol. %)copolymer; Mw 2.7 × 10$^4$
P3: Vinyl alcohol(80 mol. %)-Vinyl hexanoate(20 mol. %)copolymer; Mw 2.8 × 10$^4$
P4: Vinyl alcohol(80 mol. %)-Vinyl hexanoate(20 mol. %) copolymer; Mw 0.3 × 10$^4$
P5: Vinyl alcohol(98 mol. %)-Vinyl acetate(2 mol. %) copolymer; Mw 2.2 × 10$^4$
P6: Polyvinylpyrrolidone; Mw 6.0 × 10$^4$
P7: Hydroxyethyl cellulose; Mw 25 × 10$^4$
P8: Polyvinyl alcohol(Mw 7.5 × 10$^4$)-Polyvinylpyrrolidone(Mw 10 × 10$^4$) graft copolymer As shown in Table 4, with respect to the polishing composition of Comparative Example B1 using the fully-saponified PVA as the water-soluble polymer, while the abrasive adsorption was at or below 20%, the etching rate was higher than 2.0 nm/min, showing its poor ability to protect surfaces. Thus, when compared with Comparative Example B3 using HEC, while it showed greater ease of filtration, its haze clearly increased.

particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd. (the same applies to the examples below).

As the water-soluble polymer P1, was used a polyvinyl alcohol (water-soluble polymer HA) having a degree of saponification of 73% by mole and a weight average molecular weight (Mw) of $2.8 \times 10^4$. The water-soluble polymer HA has a molecular structure comprising 27% by mole of vinyl acetate units as an acetoxy group-containing repeat unit.

808 g of the agent A was diluted with 19000 g of ultrapure water to prepare a first composition containing about 0.49% abrasive and 0.006 mol/L ammonia. To the first composition (diluted agent A), was added and mixed 246 g of the agent B to prepare a polishing composition (pH 10.2) containing 0.48% abrasive GA, 0.010% (0.006 mol/L) ammonia and 0.018% water-soluble polymer HA with the rest being water. The polishing composition was stirred at room temperature for about one hour and then used for polishing a silicon wafer described later.

Example C2

Were obtained a basic abrasive dispersion (agent A) containing 9.4% abrasive GA and 0.20% (0.12 mol/L) ammonia with the rest being water and an aqueous polymer solution (agent B) containing 15% of a water-soluble polymer.

As the water-soluble polymer, was used a polyvinyl alcohol (water-soluble polymer HB) having a degree of saponification of 79% by mole and a Mw of $2.7 \times 10^4$. The water-soluble polymer HB has a molecular structure comprising 21% by mole of vinyl acetate units.

1030 g of the agent A was diluted with 19000 g of ultrapure water to prepare a first composition containing about 0.48% abrasive and 0.006 mol/L ammonia. To the first composition (diluted agent A), was added and mixed 25 g of the agent B to prepare a polishing composition (pH 10.2) containing 0.48% abrasive GA, 0.010% (0.006 mol/L) ammonia and 0.019% water-soluble polymer HB with the rest being water. The polishing composition was stirred at room temperature for about one hour and then used for polishing a silicon wafer described later.

Example C3

Were obtained a basic abrasive dispersion (agent A) containing 19.2% abrasive GA and 0.41% (0.28 mol/L) ammonia with the rest being water and an aqueous polymer solution (agent B) containing 15% water-soluble polymer HB.

1005 g of the agent A was diluted with 39000 g of ultrapure water to prepare a first composition containing about 0.48% abrasive and 0.006 mol/L ammonia. To the first composition (diluted agent A), was added and mixed 49 g of the agent B to prepare a polishing composition (pH 10.2) containing 0.48% abrasive GA, 0.010% (0.006 mol/L) ammonia and 0.019% water-soluble polymer HB with the rest being water. The polishing composition was stirred at room temperature for about one hour and then used for polishing a silicon wafer described later.

Example C4

Were obtained a basic abrasive dispersion (agent A) containing 5.2% abrasive and 0.11% (0.067 mol/L) ammonia with the rest being water and an aqueous polymer solution (agent B) containing 1.5% water-soluble polymer HA.

As the abrasive, was used a colloidal silica (abrasive GB) of 25 nm average primary particle diameter and 46 nm average secondary particle diameter.

532 g of the agent A was diluted with 19000 g of ultrapure water to prepare a first composition containing about 0.18% abrasive and 0.002 mol/L ammonia. To the first composition (diluted agent A), was added and mixed 123 g of the agent B to prepare a polishing composition (pH 10.2) containing 0.18% abrasive GB, 0.003% (0.002 mol/L) ammonia and 0.009% water-soluble polymer HA with the rest being water. The polishing composition was stirred at room temperature for about one hour and then used for polishing a silicon wafer described later.

The concentrations of water-soluble polymer HA and ammonia in the polishing composition of this example were adjusted so that the water-soluble polymer HA and ammonia contents relative to the surface area of the abrasive in the unit volume of the polishing composition were approximately equal to those in the polishing composition of Example C1.

Comparative Example C1

A concentrate was prepared, containing 9.2% abrasive GA, 0.20% (0.12 mol/L) ammonia and 0.35% water-soluble polymer HA with the rest being water.

At 24 hours after the preparation of the concentrate, 1055 g of the concentrate was diluted with 19000 g of ultrapure water to prepare a polishing composition (pH 10.2) containing 0.48% abrasive GA, 0.010% (0.006 mol/L) ammonia and 0.018% water-soluble polymer HA with the rest being water. The polishing composition was stirred at room temperature for about one hour and then used for polishing a silicon wafer described later.

Comparative Example C2

In this example, in place of water-soluble polymer HA in Example C1, was used a fully-saponified polyvinyl alcohol (polyvinyl alcohol having a degree of saponification 98% by mole and a Mw $2.2 \times 10^4$, "PVA" hereinafter). Otherwise, in the same manner as Example C1, was prepared a polishing composition (pH 10.2) containing 0.48% abrasive GA, 0.010% (0.006 mol/L) ammonia and 0.018% PVA with the rest being water. The polishing composition was stirred at room temperature for about one hour and then used for polishing a silicon wafer described later.

Comparative Example C3

In this example, in place of water-soluble polymer HB in Example C2, was used a poly(N-vinylpyrrolidone) with a Mw of $6 \times 10^4$ (or "PVP" hereinafter). Otherwise, in the same manner as Example C2, was prepared a polishing composition (pH 10.2) containing 0.48% abrasive GA, 0.010% (0.006 mol/L) ammonia and 0.019% PVP with the rest being water. The polishing composition was stirred at room temperature for about one hour and then used for polishing a silicon wafer described later.

Comparative Example C4

A concentrate was prepared, containing 9.2% abrasive GA, 0.2% (0.12 mol/L) ammonia and 0.35% water-soluble polymer with the rest being water.

As the water-soluble polymer, was used a hydroxyethyl cellulose with a Mw of $25 \times 10^4$ (or "HEC" hereinafter).

At 24 hours after the preparation of the concentrate, 1055 g of the concentrate was diluted with 19000 g of ultrapure water to prepare a polishing composition (pH 10.2) containing 0.48% abrasive GA, 0.010% (0.006 mol/L) ammonia and 0.018% HEC with the rest being water. The polishing composition was stirred at room temperature for about one hour and then used for polishing a silicon wafer described later.

<Silicon Wafer Polishing>

Using the polishing compositions according to the respective examples as they were as polishing liquids, silicon wafer surfaces were polished under the conditions shown below. The silicon wafers used had 300 mm diameter, p-type conductivity, crystal orientation of <100> and a resistivity of 0.1 Ω·cm or greater, but less than 100 Ω·cm, and were preliminarily polished with a polishing slurry (trade name "GLANZOX 2100" available from Fujimi, Inc.) to a surface roughness of 0.1 nm to 10 nm for the use.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The Conditions Below were Common Between the Two Tables)

Polishing pressure: 15 kPa
Plate rotational speed: 30 rpm
Head rotational speed 30 rpm
Polishing time: 2 min
Temperature of polishing liquid: 20° C.
Flow rate of polishing liquid: 2.0 L/min (drain)

<Cleaning>

Polished silicon wafers were cleaned (SC-1 cleaned) with a cleaning solution at $NH_4OH$ (29%)/$H_2O_2$ (31%)/deionized water (DIW)=1/3/30 (volume ratio). More specifically, two cleaning baths each equipped with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Assessment of the Number of Micro Particles (LPD)>

Using a wafer inspection system under trade name "SURFSCAN SP2" available from KLA-Tencor Corporation, the number of 37 nm or larger particles (number of LPD) present on each cleaned silicon wafer of 300 mm diameter was counted.

<Haze Measurement>

The surface of each cleaned silicon wafer was measured for haze (ppm) in DWO mode, using a wafer inspection system under trade name "SURFSCAN SP2" available from KLA-Tencor Corporation.

The results of the LPD count and haze measurement are converted to relative values and shown in Table 5, with 100% being the number of LPD and haze value of Comparative Example C4 using solely the hydroxyethyl cellulose (HEC) as the water-soluble polymer. In the column for the number of LPD of Table 5, "n/m" (not measured) indicates that the defect analysis with the wafer inspection system resulted in data overload, that is, the number of LPD exceeded the upper measurement limit.

<Evaluation of Ease of Filtration>

The polishing liquid according to each example was filtered by suction at a temperature of 25° C. at a filter differential pressure of 50 kPa. As the filter, was used a disc filter under trade name "ULTIPOR® N66" (47 mm diameter, rated filter resolution of 0.2 μm). From the volume of the polishing composition that passed through the filter until the flow of the polishing composition passing through the filter stopped, the ease of filtration was evaluated in the two grades below. The obtained results are shown in the column headed "Ease of Filtration" in Table 5.

A: The volume of the polishing composition that passed through the filter was 25 mL or greater.

C: The volume of the polishing composition that passed through the filter was less than 25 mL.

TABLE 5

| | Abrasive | Water-soluble polymer (deg. of sap.) | Procedures of preparation | Haze (%) | LPD (%) | Ease of filtration |
|---|---|---|---|---|---|---|
| Ex. C1 | GA | HA (73 mol %) | I. Agent A (12 mass % abrasive, 0.16 mol/L $NH_3$) was diluted to 0.49 mass % abrasive, 0.006 mol/L $NH_3$ II. Agent B containing water-soluble polymer was added to the dilution to prepare a mixture of 0.48 mass % abrasive, 0.006 mol/L $NH_3$ | 80 | 60 | A |
| EX. C2 | GA | HB (79 mol %) | I. Agent A (9.4 mass % abrasive, 0.12 mol/L $NH_3$) was diluted to 0.48 mass % abrasive, 0.006 mol/L $NH_3$ II. Agent B containing water-soluble polymer was added to the dilution to prepare a mixture of 0.48 mass % abrasive, 0.006 mol/L $NH_3$ | 85 | 65 | A |
| Ex. C3 | GA | HB (79 mol %) | I. Agent A (19.2 mass % abrasive, 0.28 mol/L $NH_3$) was diluted to 0.48 mass % abrasive, 0.006 mol/L $NH_3$ II. Agent B containing water-soluble polymer was added to the dilution to prepare a mixture of 0.48 mass % abrasive, 0.006 mol/L $NH_3$ | 85 | 60 | A |
| Ex. C4 | GB | HA (73 mol %) | I. Agent A (5.2 mass % abrasive, 0.067 mol/L $NH_3$) was diluted to 0.18 mass % abrasive, 0.002 mol/L $NH_3$ II. Agent B containing water-soluble polymer was added to the dilution to prepare a mixture of 0.18 mass % abrasive, 0.002 mol/L $NH_3$ | 70 | 50 | A |
| Comp. Ex. C1 | GA | HA (73 mol %) | Concentrate containing water-soluble polymer (9.2 mass % abrasive, 0.12 mol/L $NH_3$) was diluted to a mixture of 0.48 mass % abrasive, 0.006 mol/L $NH_3$ | 210 | 200 | A |
| Comp. Ex. C2 | GA | PVA | I. Agent A (12 mass % abrasive, 0.16 mol/L $NH_3$) was diluted to 0.49 mass % abrasive, 0.006 mol/L $NH_3$ II. Agent B containing water-soluble polymer was added | 225 | 200 | A |

TABLE 5-continued

| | Abrasive | Water-soluble polymer (deg. of sap.) | Procedures of preparation | Haze (%) | LPD (%) | Ease of filtration |
|---|---|---|---|---|---|---|
| Comp. Ex. C3 | GA | PVP | to the dilution to prepare a mixture of 0.48 mass % abrasive, 0.006 mol/L $NH_3$<br>I. Agent A (9.4 mass % abrasive, 0.12 mol/L $NH_3$) was diluted to 0.48 mass % abrasive, 0.006 mol/L $NH_3$<br>II. Agent B containing water-soluble polymer was added to the dilution to prepare a mixture of 0.48 mass % abrasive, 0.006 mol/L $NH_3$ | 400 | n/m | A |
| Comp. Ex. C4 | GA | HEC | Concentrate containing water-soluble polymer (9.2 mass % abrasive, 0.12 mol/L $NH_3$) was diluted to prepare a mixture of 0.48 mass % abrasive, 0.006 mol/L $NH_3$ | 100 | 100 | C |

As shown in Table 5, the polishing composition of Example C1—produced by diluting the agent A containing the abrasive and basic compound to satisfy at least either the abrasive concentration being lower than 3% by mass or the ammonia concentration being 0.1 mol/L or lower, followed by adding the aqueous water-soluble polymer HA solution to the resulting dilution—was superior in terms of both the haze value and LPD count in comparison to the polishing composition of Comparative Example C1 produced by diluting the concentrate comprising the basic compound and water-soluble polymer HA together. The polishing composition of Example C1 was also more effective in reducing the haze value and LPD count when compared against Comparative Example C4 using a widely-used water-soluble polymer, HEC. In addition, it was clearly superior to Comparative Example C4 in terms of the ease of filtration as well. The polishing compositions of Examples C2 to C4 produced in the same manner as Example C1 were also highly effective in reducing the haze value and LPD count and easily filtered as well.

On the other hand, the polishing composition of Comparative Example C2—using PVA comprising vinyl alcohol units similarly to water-soluble polymers HA and HB, but being essentially free of vinyl acetate units—was produced in the same manner as Examples C1 to C4, but did not produce the effect to reduce the haze value and LPD count as Examples C1 to C4 did. The polishing composition of Comparative Example C3 produced with PVP (an ester bond-free water-soluble polymer) in the same manner as Examples C1 to C4 also fell short of Examples C1 to C4 in terms of the haze value and LPD count.

It is noted that in Examples C1 to C4, after the preparation, the polishing compositions were stored at room temperature for about one hour until used for polishing; however, even when the storage time was changed to 12 hours or 48 hours, in comparison to Comparative Examples C1 to C4, the effects were comparable to the results shown in Table 5.

Just before the respective polishing compositions of Examples C1 to C4 were put in use for polishing, the ratios of numbers of moles of vinyl acetate units to numbers of moles of all monomeric repeat units constituting the water-soluble polymers in the respective polishing compositions were determined and found to be 25% in Example C1, 19% in Example C2, 19% in Example C3 and 16% in Example C4. In other words, the polishing compositions according to Examples C1 to C4 were found to contain a water-soluble polymer (polyvinyl alcohol with a degree of saponification of 95% by mole or lower) with the molar ratio of vinyl acetate units being maintained at or above 5%.

The molar ratios were determined as follows: The abrasive in the polishing composition was precipitated by centrifugation; While a basic compound was added to the resulting supernatant as a sample solution and the resultant was heated to complete saponification, the amount of basic compound consumed was titrated; From the result, the number of moles of vinyl carboxylate units and the number of moles of vinyl alcohol units were determined.

Experiment 4

Preparation of Polishing Compositions

Example D1

As the agent A, was obtained a basic abrasive dispersion (agent A1) comprising 12% abrasive and 0.26% (0.16 mol/L) ammonia with the rest being water. As the abrasive, was used a colloidal silica (abrasive GA) of 35 nm average primary particle diameter and 66 nm average secondary particle diameter. The average primary particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd. (the same applies to the examples below).

As the agent B, was obtained an aqueous polymer solution (agent B1) containing 1.5% of a water-soluble polymer. As the water-soluble polymer, was used a polyvinyl alcohol (water-soluble polymer HA) having a degree of saponification of 73% and a weight average molecular weight (Mw) of $2.8 \times 10^4$. The water-soluble polymer HA has a molecular structure comprising 27% by mole of vinyl acetate units as an acetoxy group-containing repeat unit.

To 808 g of the agent A1, was added 246 g of the agent B1 to prepare a polishing composition stock solution containing 9.2% abrasive and 0.12 mol/L ammonia. At one minute after the preparation of the stock solution (i.e. at one minute after the agents A1 and B1 were mixed), ultrapure water was added to dilute the stock solution by a factor of 20 by volume to prepare a polishing composition (pH 10.2) containing 0.46% abrasive and 0.006 mol/L ammonia.

Example D2

As the agent A, was obtained a basic abrasive dispersion (agent A2) comprising 9.4% abrasive GA and 0.20% (0.12 mol/L) ammonia with the rest being water.

As the agent B, was obtained an aqueous polymer solution (agent B2) containing 15% of a water-soluble polymer. As the water-soluble polymer, was used a polyvinyl alcohol (water-soluble polymer HB) having a degree of saponification of 79% by mole and a Mw of $2.7 \times 10^4$. The water-soluble polymer FIB has a molecular structure comprising 21% by mole of vinyl acetate units.

To 1030 g of the agent A2, was added 25 g of the agent B2 to prepare a polishing composition stock solution containing 9.2% abrasive and 0.12 mol/L ammonia. At one hour after the preparation of the stock solution, ultrapure water was added to dilute the stock solution by a factor of 20 by volume to prepare a polishing composition (pH 10.2) containing 0.46% abrasive and 0.006 mol/L ammonia.

Example D3

In Example D1, the time from the preparation of the polishing composition to the dilution with ultrapure water was changed to 6 hours. Otherwise, in the same manner as Example D1, a polishing composition according to this example was prepared.

Example D4

As the agent A, was obtained a basic abrasive dispersion (agent A3) comprising 19.2% abrasive GA and 0.41% (0.28 mol/L) ammonia with the rest being water.

As the agent B, was obtained an aqueous polymer solution (agent B2) containing 15% of a water-soluble polymer. As the water-soluble polymer, was used a polyvinyl alcohol (water-soluble polymer HB) having a degree of saponification of 79% by mole and a Mw of $2.7 \times 10^4$. The water-soluble polymer HB has a molecular structure comprising 21% by mole of vinyl acetate units.

To 1005 g of the agent A3, was added 49 g of the agent B2 to prepare a polishing composition stock solution containing 18.3% abrasive and 0.24 mol/L ammonia. At 12 hours after the preparation of the stock solution, ultrapure water was added to dilute the stock solution by a factor of 40 by volume to prepare a polishing composition (pH 10.2) containing 0.46% abrasive and 0.006 mol/L ammonia.

Example D5

As the agent A, was obtained a basic abrasive dispersion (agent A4) comprising 4.4% abrasive and 0.11% (0.067 mol/L) ammonia with the rest being water. As the abrasive, was used a colloidal silica (abrasive GB) of 25 nm average primary particle diameter and 46 nm average secondary particle diameter.

As the agent B, was used an aqueous polymer solution (agent B1) containing 1.5% water-soluble polymer HA.

To 532 g of the agent A4, was added 123 g of the agent B1 to prepare a polishing composition stock solution containing 3.6% abrasive and 0.055 mol/L ammonia. At 20 hours after the preparation of the stock solution, ultrapure water was added to dilute the stock solution by a factor of 20 by volume to prepare a polishing composition (pH 10.2) containing 0.18% abrasive and 0.003 mol/L ammonia.

Comparative Example D1

In Example D1, the time from the preparation of the polishing composition to the dilution with ultrapure water was changed to 30 hours. Otherwise, in the same manner as Example D1, a polishing composition (0.46% abrasive, 0.006 mol/L ammonia) according to this example was prepared.

Comparative Example D2

In Example D2, the time from the preparation of the polishing composition to the dilution with ultrapure water was changed to 64 hours. Otherwise, in the same manner as Example D1, a polishing composition (0.46% abrasive, 0.006 mol/L ammonia) according to this example was prepared.

Comparative Example D3

In this example, as the agent B, was used an aqueous polymer solution (agent B3) containing 1.5% of a fully-saponified polyvinyl alcohol (polyvinyl alcohol having a degree of saponification of 98% by mole and a Mw of $2.2 \times 10^4$, "PVA" hereinafter).

To 808 g of the agent A1, was added 246 g of the agent B3 to prepare a polishing composition stock solution containing 9.2% abrasive and 0.12 mol/L ammonia. At one minute after the preparation of the stock solution, ultrapure water was aided to dilute the stock solution by a factor of 20 by volume to prepare a polishing composition (pH 10.2) containing 0.46% abrasive and 0.006 mol/L ammonia.

Comparative Example D4

In this example, as the agent B, was used an aqueous polymer solution (agent B4) containing 1.5% of a poly(N-vinylpyrrolidone with a Mw of $6 \times 10^4$ (or "PVP" hereinafter).

To 808 g of the agent A1, was added 246 g of the agent B4 to prepare a polishing composition stock solution containing 9.2% abrasive and 0.12 mol/L ammonia. At 6 hours after the preparation of the stock solution, ultrapure water was added to dilute the stock solution by a factor of 20 by volume to prepare a polishing composition (pH 10.2) containing 0.46% abrasive and 0.006 mol/L ammonia.

Comparative Example D5

In this example, as the agent B, was used an aqueous polymer solution (agent B5) containing 1.5% of a hydroxy-ethyl cellulose with a Mw of $25 \times 10^4$ (or "HEC" hereinafter).

To 808 g of the agent A1, was added 246 g of the agent B5 to prepare a polishing composition stock solution containing 9.2% abrasive and 0.12 mol/L ammonia. At 6 hours after the preparation of the stock solution, ultrapure water was added to dilute the stock solution by a factor of 20 by volume to prepare a polishing composition (pH 10.2) containing 0.46% abrasive and 0.006 mol/L ammonia.

<Silicon Wafer Polishing>

The polishing compositions thus prepared according to Examples D1 to D5 and Comparative Examples D1 to D5 were stored with stirring at room temperature for about one hour. Subsequently, using the polishing compositions according to the respective examples as they were as polishing liquids, silicon wafer surfaces were polished under the conditions shown below. The silicon wafers used had 300 mm diameter, p-type conductivity, crystal orientation of <100> and a resistivity of 0.1 Ω·cm or greater, but less than 100 Ω·cm, and were preliminarily polished with a polishing slurry (trade name "GLANZOX 2100" available from Fujimi, Inc.) to a surface roughness of 0.1 nm to 10 nm for the use.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The Conditions Below were Common Between the Two Tables)

Polishing pressure: 15 kPa
Plate rotational speed: 30 rpm
Head rotational speed: 30 rpm
Polishing time: 2 min
Temperature of polishing liquid: 20° C.
Flow rate of polishing liquid: 2.0 L/min (drain)

<Cleaning>

Polished silicon wafers were cleaned (SC-1 cleaned) with a cleaning solution at $NH_4OH$ (29%)/$H_2O_2$ (31%)/deionized water (DIW)=1/3/30 (volume ratio). More specifically, two cleaning baths each equipped with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Assessment of the Number of Micro Particles (LPD)>

Using a wafer inspection system under trade name "SURFSCAN SP2" available from KLA-Tencor Corporation, the number of 37 nm or larger particles (number of LPD) present on each cleaned silicon wafer of 300 mm diameter was counted.

<Haze Measurement>

The surface of each cleaned silicon wafer was measured for haze (ppm) in DWO mode, using a wafer inspection system under trade name "SURFSCAN SP2" available from KLA-Tencor Corporation.

The results of the LPD count and haze measurement are converted to relative values and shown in Table 6, with 100% being the number of LPD and haze value of Comparative Example D5 using solely the hydroxyethyl cellulose (HEC) as the water-soluble polymer. In the column for the number of LPD of Table 6, "n/m" (not measured) indicates that the defect analysis with the wafer inspection system resulted in data overload, that is, the number of LPD exceeded the upper measurement limit.

<Evaluation of Ease of Filtration>

The polishing liquid according to each example was filtered by suction at a temperature of 25° C. at a filter differential pressure of 50 kPa. As the filter, was used a disc filter under trade name "ULTIPOR® N66" (47 mm diameter, rated filter resolution of 0.2 μm). From the volume of the polishing composition that passed through the filter until the flow of the polishing composition passing through the filter stopped, the ease of filtration was evaluated in the two grades below. The obtained results are shown in the column headed "Ease of Filtration" in Table 6.

A: The volume of the polishing composition that passed through the filter was 25 mL or greater.

C: The volume of the polishing composition that passed through the filter was less than 25 mL.

TABLE 6

| | Agent A (Abrasive) | Agent B (Water-soluble polymer) | Time from preparation of stock solution to dilution | Abrasive content (wt %) | | Conc. of $NH_3$ (mol/L) | | Haze (%) | LPD (%) | Ease of filtration |
|---|---|---|---|---|---|---|---|---|---|---|
| | | | | Stock solution | Polishing composition | Stock solution | Polishing composition | | | |
| Ex. D1 | A1 (GA) | B1 (HA; deg. of sap. 73 mol %) | 1 min | 9.2 | 0.46 | 0.12 | 0.006 | 80 | 60 | A |
| Ex. D2 | A2 (GA) | B2 (HB; deg. of sap. 79 mol %) | 1 h | 9.2 | 0.46 | 0.12 | 0.006 | 85 | 65 | A |
| Ex. D3 | A1 (GA) | B1 (HA; deg. of sap. 73 mol %) | 6 h | 9.2 | 0.46 | 0.12 | 0.006 | 85 | 65 | A |
| Ex. D4 | A3 (GA) | B2 (HB; deg. of sap. 79 mol %) | 12 h | 18.3 | 0.46 | 0.24 | 0.006 | 90 | 70 | A |
| Ex. D5 | A4 (GB) | B1 (HA; deg. of sap. 73 mol %) | 20 h | 3.6 | 0.18 | 0.055 | 0.003 | 85 | 70 | A |
| Comp. Ex. D1 | A1 (GA) | B1 (HA; deg. of sap. 73 mol %) | 30 h | 9.2 | 0.46 | 0.12 | 0.006 | 210 | 200 | A |
| Comp. Ex. D2 | A2 (GA) | B2 (HB; deg. of sap. 79 mol %) | 64 h | 9.2 | 0.46 | 0.12 | 0.006 | 230 | 210 | A |
| Comp. Ex. D3 | A1 (GA) | B3 (PVA) | 1 min | 9.2 | 0.46 | 0.12 | 0.006 | 225 | 200 | A |
| Comp. Ex. D4 | A1 (GA) | B4 (PVP) | 6 h | 9.2 | 0.46 | 0.12 | 0.006 | 400 | n/m | A |
| Comp. Ex. D5 | A1 (GA) | B5 (HEC) | 6 h | 9.2 | 0.46 | 0.12 | 0.006 | 100 | 100 | C |

As shown in Table 6, among Examples D1 to D5 and Comparative Examples D1 to D2 each using a partially-saponified polyvinyl alcohol as the water-soluble polymer H, the polishing compositions of Examples D1 to D5—produced with the time spent being 24 hours or less from the preparation of the polishing composition stock solution to the dilution—were clearly superior in terms of both the haze value and LPD count in comparison to Comparative Examples D1 to D2 wherein the time was more than 24 hours. The polishing compositions of D1 to D5 showed greater effect to reduce the haze value and LPD count even when compared against Comparative Example D5 using HEC (a widely-used water-soluble polymer) and were also clearly superior to Comparative Example D5 in terms of the ease of filtration as well.

In addition, in comparison of Example D2 with Example D4, it can be seen that with the time from the stock solution preparation to the dilution being 10 hours or less, as compared with a case where the dilution is performed at 12 hours after the stock solution preparation, a polishing composition can be produced to provide higher performance in terms of the haze value and LPD count. Similar tendencies are apparent in the LPD counts of Example D3 and Example D5.

On the other hand, the polishing composition of Comparative Example D3—using the PVA that comprised vinyl alcohol units similarly to water-soluble polymers HA and HB, but was essentially free of vinyl acetate units—was produced with the time form the stock solution preparation to the dilution being one minute just like in Example D1, but did not produce the effect to reduce the haze value and LPD count as Example D1 did. The polishing composition of Comparative Example D4 produced with PVP (an ester bond-free water-soluble polymer) in the same manner as Examples D1 to D5 also fell short of Examples D1 to D5 in teens of the haze value and LPD count.

It is noted that in Examples D1 to D5, after the preparation, the polishing compositions were stored at room temperature for about one hour until used for polishing; however, even when the storage time was changed to 12 hours or 48 hours, in comparison to Comparative Examples D1 to D5, the effects were comparable to the results shown in Table 6.

Just before the respective polishing compositions of Examples D1 to D5 were put in use for polishing, the ratios of numbers of moles of vinyl acetate units to numbers of moles of all monomeric repeat units constituting the water-soluble polymers in the respective polishing compositions were determined and found to be 27% in Example D1, 18% in Example D2, 15% in Example D3, 10% in Example D4 and 8% in Example D5. In other words, the polishing compositions according to Examples D1 to D5 were found to contain a water-soluble polymer (polyvinyl alcohol with a degree of saponification of 95% by mole or lower) with the molar ratio of vinyl acetate units being maintained at or above 5%.

The molar ratios were determined as follows: The abrasive in the polishing composition was precipitated by centrifugation; While a basic compound was added to the resulting supernatant as a sample solution and the resultant was heated to complete saponification, the amount of basic compound consumed was titrated; From the result, the number of moles of vinyl carboxylate units and the number of moles of vinyl alcohol units were determined.

Although specific embodiments of the present invention have been described in detail above, these are merely for illustrations and do not limit the scope of claims. The art according to the claims includes various modifications and changes made to the specific embodiments illustrated above.

The invention claimed is:

1. A method for producing a polishing composition, using an abrasive, a basic compound and a water-soluble polymer H having a functional group that is hydrolytic under basic conditions, and water; the method comprising:
a step of obtaining an agent A that comprises at least the basic compound;
a step of obtaining an agent B that comprises at least the water-soluble polymer H; and
a step of mixing a first composition comprising at least the agent A and a second composition comprising at least the agent B to prepare a mixture that comprises the abrasive, the basic compound, the water-soluble polymer H and water at a concentration of the basic compound of 0.1 mol/L or lower;
wherein
the abrasive consists of silica grains,
the agent A has a pH of 9 or higher, and the content of the basic compound in the agent A is 0.001% by mass or greater,
the water-soluble polymer H has a molecular structure comprising both of a vinyl alcohol unit and a vinyl acetate unit as the repeat units, and
in the step of obtaining the agent B, the agent B is prepared to have a pH of 4 or higher and 7.5 or low to inhibit the hydrolysis of the water-soluble polymer H.

2. The method according to claim 1, wherein
the agent A is an abrasive dispersion C comprising the abrasive, the basic compound and water, and
the abrasive dispersion C is diluted to prepare the first composition; and then, the first composition is mixed with the second composition to prepare the mixture.

3. A polishing composition preparation kit used in the method according to claim 1, comprising the agent A and the agent B that are stored separately.

4. A method for producing a polishing composition, using an abrasive, a basic compound, a water-soluble polymer H having a functional group that is hydrolytic under basic conditions, and water; the method comprising
a step of obtaining an agent A comprising at least the basic compound;
a step of obtaining an agent B comprising at least the water-soluble polymer H; and
a step of mixing a first composition comprising at least the agent A and a second composition comprising at least the agent B to prepare a mixture that comprises the abrasive, the basic compound, the water-soluble polymer H and water at a concentration of the abrasive of lower than 3% by mass;
wherein
the abrasive consists of silica grains,
the agent A has a pH of 9 or higher, and the content of the basic compound in the agent A is 0.001% by mass or greater,
the water-soluble polymer H has a molecular structure comprising both of a vinyl alcohol unit and a vinyl acetate unit as the repeat units, and
in the step of obtaining the agent B, the agent B is prepared to have a pH of 4 or higher and 7.5 or lower to inhibit the hydrolysis of the water-soluble polymer H.

5. The method according to claim 4, wherein
the agent A is an abrasive dispersion C comprising the abrasive, the basic compound and water, and
the abrasive dispersion C is diluted to prepare the first composition; and then, the first composition is mixed with the second composition to prepare the mixture.

6. A polishing composition preparation kit used in the method according to claim 4, comprising the agent A and the agent B that are stored separately.

7. A method for producing a polishing composition, using an abrasive, a basic compound and a water-soluble polymer H having a functional group that is hydrolytic under basic conditions, and water; the method comprising:
a step of obtaining an agent A that comprises at least the basic compound;
a step of obtaining an agent B that comprises at least the water-soluble polymer H;
a step of mixing at least the agent A and the agent B to prepare a polishing composition stock solution having a concentration of the basic compound of higher than 0.02 mol/L; and a step of diluting the polishing composition stock solution to a concentration of the basic composition of 0.02 mol/L or lower within 24 hours after the agent A and the agent B are mixed;

wherein the abrasive consists of silica grains, the agent A has a pH of 9 or higher, and the content of the basic compound in the agent A is 0.001% by mass or greater, the water-soluble polymer H has a molecular structure comprising both of a vinyl alcohol unit and a vinyl acetate unit as the repeat units, and in the step of obtaining the agent B, the agent B is prepared to have a pH of 4 or higher and 7.5 or lower to inhibit the hydrolysis of the water-soluble polymer H.

8. The method according to claim 7, wherein the stock solution is diluted by a factor of 10 or greater by volume in the step of diluting the polishing composition stock solution.

9. A polishing composition preparation kit used in the method according to claim 7, comprising the agent A and the agent B that are stored separately.

10. A method for producing a polishing composition, using an abrasive, a basic compound, a water-soluble polymer H having a functional group that is hydrolytic under basic conditions, and water; the method comprising:

a step of obtaining an agent A that comprises at least the basic compound;

a step of obtaining an agent B that comprises at least the water-soluble polymer H;

a step of mixing at least the agent A and the agent B to prepare a polishing composition stock solution having an abrasive content of 1% by mass or greater; and a step of diluting the polishing composition stock solution to an abrasive content of less than 1% by mass within 24 hours after the agent A and the agent B are mixed;

wherein the abrasive consists of silica grains, the agent A has a pH of 9 or higher, and the content of the basic compound in the agent A is 0.001% by mass or greater, the water-soluble polymer H has a molecular structure comprising both of a vinyl alcohol unit and a vinyl acetate unit as the repeat units, and in the step of obtaining the agent B, the agent B is prepared to have a pH of 4 or higher and 7.5 or lower to inhibit the hydrolysis of the water-soluble polymer H.

11. The method according to claim 10, wherein the stock solution is diluted by a factor of 10 or greater by volume in the step of diluting the polishing composition stock solution.

12. A polishing composition preparation kit used in the method according to claim 10, comprising the agent A and the agent B that are stored separately.

\* \* \* \* \*